US012805397B2

(12) United States Patent
Do

(10) Patent No.: US 12,805,397 B2
(45) Date of Patent: Nov. 17, 2026

(54) TRANSPARENT ULTRATHIN-LED DISPLAY AND METHOD FOR MANUFACTURING THE SAME

(71) Applicant: Kookmin University Industry Academy Cooperation Foundation, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 371 days.

(21) Appl. No.: 18/398,720

(22) Filed: Dec. 28, 2023

(65) Prior Publication Data

US 2024/0222342 A1 Jul. 4, 2024

(30) Foreign Application Priority Data

Dec. 28, 2022 (KR) ........................ 10-2022-0187630

(51) Int. Cl.
*H10W 90/00* (2026.01)

(52) U.S. Cl.
CPC .................................... *H10W 90/00* (2026.01)

(58) Field of Classification Search
CPC ............. H10W 90/00; H10W 72/0198; H10H 20/833; H10H 29/142; H10H 20/857; H10H 20/032; H10H 20/8506; G09F 9/33; H10D 86/441
See application file for complete search history.

(56) References Cited

U.S. PATENT DOCUMENTS

| | | | | |
|---|---|---|---|---|
| 11,495,585 | B2 | 11/2022 | Sung et al. | |
| 12,564,005 | B2 * | 2/2026 | Do | H10P 72/74 |
| 2016/0211245 | A1 * | 7/2016 | Do | H10W 90/00 |
| 2020/0350477 | A1 | 11/2020 | Shim et al. | |
| 2021/0175217 | A1 | 6/2021 | Sung et al. | |
| 2021/0210666 | A1 | 7/2021 | Do et al. | |

(Continued)

FOREIGN PATENT DOCUMENTS

| | | |
|---|---|---|
| CN | 1291353 | 4/2001 |
| CN | 11433618 | 4/2022 |
| KR | 10-2007-0064767 | 11/2014 |

(Continued)

OTHER PUBLICATIONS

Bae, Sang Kyung, et al. "Transparent ultra-thin silver electrodes formed via a maskless evaporation process for applications in flexible organic light-emitting devices." Nano Energy, vol. 71, May 2020, p. 104649, https://doi.org/10.1016/j.nanoen.2020.104649. (Year: 2020).*

(Continued)

*Primary Examiner* — J. E. Schoenholtz
(74) *Attorney, Agent, or Firm* — NORTON ROSE FULBRIGHT US LLP

(57) ABSTRACT

The present invention relates to a transparent ultra-thin LED display. According to the present invention, it is advantageous to achieve a transparent ultra-thin LED display that has excellent transparency and excellent luminance characteristics, thereby minimizing the impact on contrast ratio and visibility depending on the illuminance of external light in the usage environment.

20 Claims, 17 Drawing Sheets

(56) References Cited

U.S. PATENT DOCUMENTS

| | | | | |
|---|---|---|---|---|
| 2022/0102604 | A1 | 3/2022 | Do et al. | |
| 2023/0113781 | A1* | 4/2023 | Lin | G02F 1/136286 257/659 |

FOREIGN PATENT DOCUMENTS

| | | |
|---|---|---|
| KR | 10-2021-0125220 | 10/2021 |
| KR | 10-2021-0132465 | 11/2021 |
| KR | 10-2021-0145497 | 12/2021 |

OTHER PUBLICATIONS

Hong, Wei-Zhe, et al. "Enhancement of optical transparency and electrical conductivity of copper-based transparent conductive films by silver doping." Surfaces and Interfaces, vol. 80, Jan. 2026, p. 108383, https://doi.org/10.1016/j.surfin.2025.108383. (Year: 2026).*

Ji, Chengang, et al. "Ultrathin-metal-film-based transparent electrodes with relative transmittance surpassing 100%." Nature Communications, vol. 11, No. 1, Jul. 6, 2020, https://doi.org/10.1038/s41467-020-17107-6. (Year: 2020).*

Zhang, Cheng, et al. "Thin-metal-film-based transparent conductors: Material preparation, optical design, and device applications." Advanced Optical Materials, vol. 9, No. 3, Nov. 30, 2020, https://doi.org/10.1002/adom.202001298. (Year: 2020).*

* cited by examiner

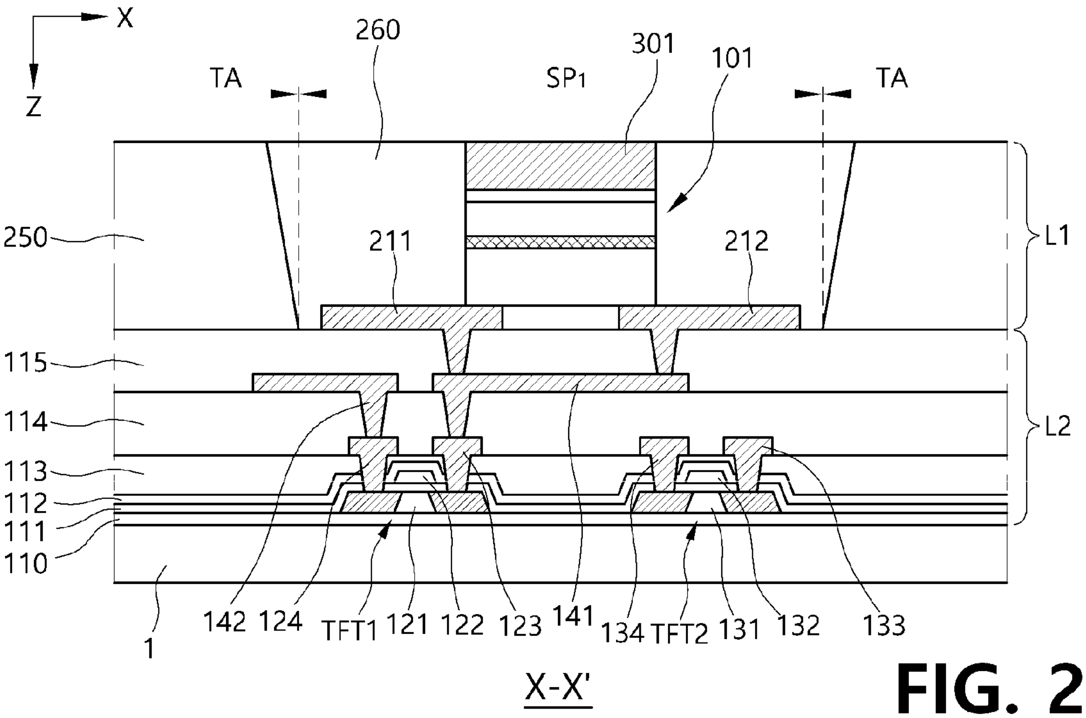
FIG. 2
FIG. 3
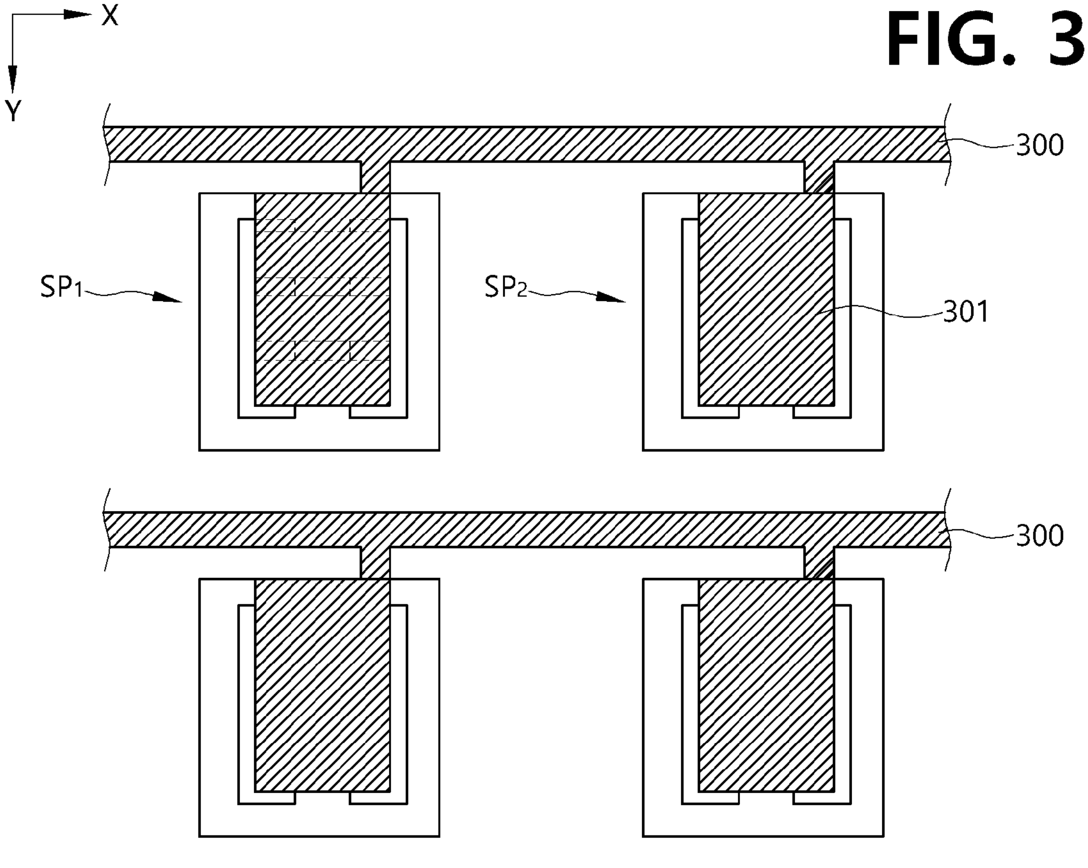

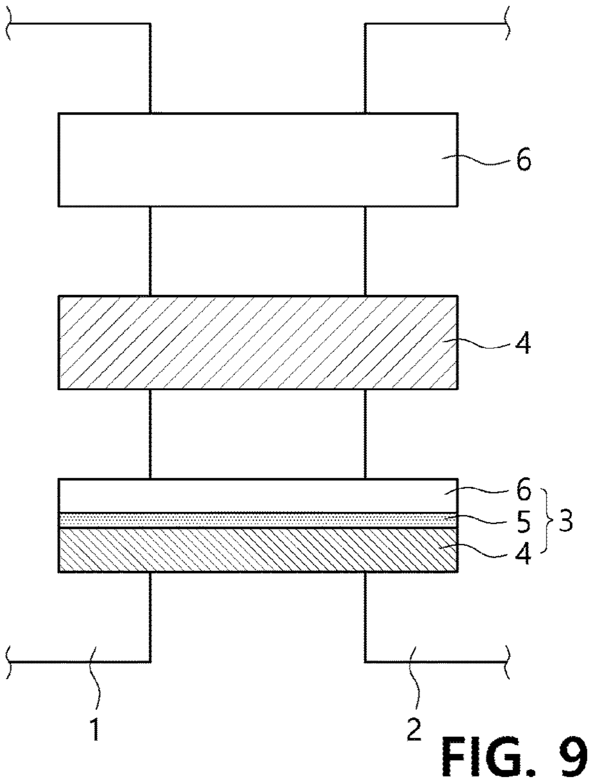
FIG. 9
FIG. 10
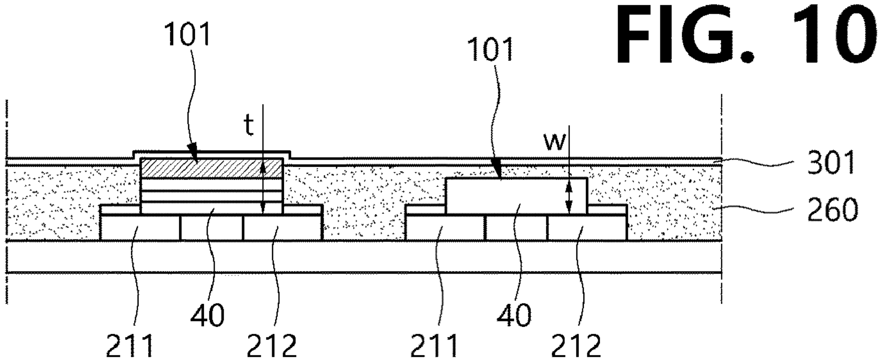
FIG. 11
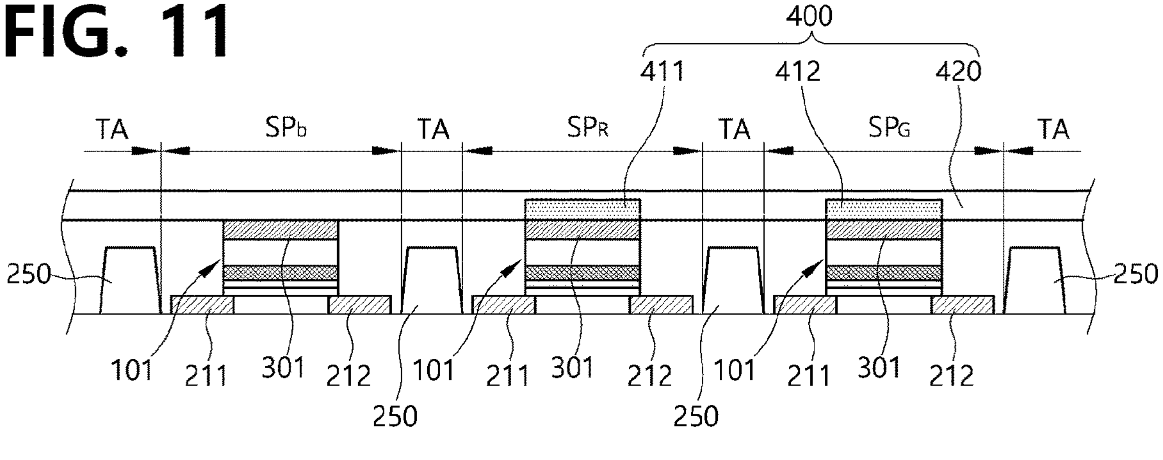

TRANSPARENT ULTRATHIN-LED DISPLAY AND METHOD FOR MANUFACTURING THE SAME

CROSS-REFERENCE TO RELATED APPLICATION

This application claims priority to and the benefit of Korean Patent Application No. 10-2022-0187630, filed on Dec. 28, 2022, the disclosure of which is incorporated herein by reference in its entirety.

BACKGROUND

1. Field of the Disclosure

The present invention relates to a transparent ultra-thin LED display and a method for manufacturing the same.

2. Description of Related Art

Micro-LED and nano-LED can achieve excellent color and high efficiency, and since they are eco-friendly materials, they are used as core materials for various light sources and displays. In line with this market situation, research has recently been conducted to develop a novel nanorod LED structure or a nanocable LED in which a shell is coated by using a new manufacturing process. Moreover, research is currently conducted on protective film materials to achieve the high efficiency and high stability of a protective film for covering the outer surface of the nanorod, as well as research and development on ligand materials that are advantageous for subsequent processes.

In line with research in this material field, display TVs utilizing red, green and blue micro-LEDs have recently been commercialized. Displays and various light sources utilizing micro-LEDs have the advantages of high performance characteristics, very long theoretical lifespan and high efficiency, but since micro LEDs must be placed individually on miniaturized electrodes in a limited area, considering the high unit cost, high process defect rate and low productivity of the electrode assembly which is implemented by placing micro-LEDs on the electrode by the pick-and-place technology, the situation is that due to limitations in process technology, it is difficult to manufacture various sizes, shapes and brightness of truly high-resolution commercial displays ranging from smartphones to TVs or light sources. Moreover, the situation is that it is more difficult to individually place nano-LEDs, which are smaller than micro-LEDs, on electrodes by the pick-and-place technology like micro-LEDs.

Meanwhile, the display field, which processes and displays large amounts of information, has developed rapidly in recent years, and transparent display devices that allow light to pass through from the front surface and the back surface to display images without interfering with the view are being developed. However, as a light-emitting element that is actively used as a transparent display device, OLED has a risk of burn-in, compared to LED devices that are implemented with conventional inorganic materials. In addition, OLED is known to have a high contrast ratio because it is excellent at implementing black color and can implement small dimming block sizes, but when it is utilized as a transparent display, light transparency must be maintained for pixels or subpixels other than the light-emitting area, and thus, due to the low brightness and light-emitting efficiency of OLED, there is a risk of low contrast ratio or reduced visibility when applying OLED to transparent displays. Furthermore, transparent displays implement the electrodes that are used to achieve a certain light transmittance with transparent electrodes, but as the area of the transparent electrode increases and the thickness becomes thinner, the resistance characteristics increase significantly, and as a result, there is a problem in that the light-emitting efficiency of OLED, which is electrically connected to transparent electrodes, is further reduced, thereby further increasing concerns about the deterioration of contrast ratio and visibility.

In order to solve these problems, research has recently been conducted on transparent displays using mini LED elements that are implemented by inorganic materials. However, mini LED elements can compensate for the shortcomings of OLED devices, such as low luminance characteristics, but due to the large size of 100 to 500 μm, the element itself can be recognized, and the transparency of the display is impaired due to reduced light transparency, and therefore, there is a problem in that it is difficult to implement a transparent display.

Therefore, there is an urgent need to develop a transparent display using LED that solves these problems.

SUMMARY OF THE INVENTION

The present invention has been devised to solve the above-described problems, and an object of the present invention is to provide a transparent ultra-thin LED display that can overcome the low durability and brightness of OLED while exhibiting excellent transparency to exhibit high brightness characteristics, thereby ensuring the contrast ratio and visibility that are problematic in transparent displays, and a method for manufacturing the same.

Meanwhile, it is noted that the present invention was invented with the support of the following national research and development projects.

[National Research and Development Project 1]

[Project Unique Number] 1711130702

[Project Number] 2021R1A2C2009521

[Name of Ministry] Ministry of Science and ICT

[Name of Project Management (Professional) Organization] National Research Foundation of Korea

[Research Task Name] Mid-career researcher support project

[Research Project Name] Development of Dot-LED material and display source/application technology

[Contribution Ratio] 1/2

[Name of Institution Performing Project] Kookmin University Industry-Academic Cooperation Foundation

[Research Period] Mar. 1, 2023 to Feb. 29, 2024

[National Research and Development Project 2]

[Project Unique Number] 1415174040

[Project Number] 20016290

[Name of Ministry] Ministry of Trade, Industry and Energy

[Name of Project Management (Professional) Organization] Korea Institute of Industrial Technology Evaluation and Planning

[Research Task Name] Electronic component industry technology development—ultra-large micro LED modular display

[Research Project Name] Development of sub-micron level blue light source technology for modular displays

[Contribution Ratio] 1/2

[Name of Institution Performing Project] Kookmin University Industry-Academic Cooperation Foundation

[Research Period] Jan. 1, 2023 to Dec. 31, 2023

In order to solve the above-described problems, the first embodiment of the present invention provides a transparent ultra-thin LED display, including a display area in which a plurality of subpixel areas and light transmission areas are arranged on the x-y plane based on mutually perpendicular x, y and z axes, and the light transmittance is 25% or more, wherein each of the plurality of subpixel areas is provided with an ultra-thin LED electrode assembly in which a plurality of ultra-thin LED elements emitting substantially the same light color are electrically connected between first and second electrodes that are spaced apart in the z-axis direction.

According to an exemplary embodiment of the present invention, the ultra-thin LED element may be an element whose area of a light-emitting surface, which is a plane perpendicular to a direction in which the layers forming the element are stacked, is 0.05 to 25 $\mu m^2$, and the light-emitting area ratio of the ultra-thin LED elements on the x-y plane in each subpixel area may be 50% or less.

In addition, the ultra-thin LED element may be an element in which a plurality of layers including a first conductive semiconductor layer, a photoactive layer and a second conductive semiconductor layer are stacked in the z-axis direction, and any one direction perpendicular to the z-axis becomes a long axis.

In addition, the ultra-thin LED element may be an element in which the layers forming the element are stacked in the z-axis direction, the thickness in the z-axis direction may be 0.1 to 3 μm, and the length of a long axis which is any one direction on the x-y plane may be 1 to 10 μm.

In addition, the display area may include in the z-axis direction a first substrate, a second layer area which is disposed on the first substrate and provided with a plurality of circuit elements, and a first layer area which is provided on the second layer area and includes a plurality of ultra-thin LED electrode assemblies and a partition wall that surrounds the exterior of each ultra-thin LED electrode assembly at a predetermined height, wherein the light transmittance of the first substrate, circuit elements and partition wall may be 60% or more.

In addition, the ultra-thin LED electrode assembly may include a plurality of first electrodes which are spaced apart from each other on the x-y plane; a plurality of ultra-thin LED elements in which a plurality of layers including a first conductive semiconductor layer, a photoactive layer and a second conductive semiconductor layer are stacked in the z-axis direction, and the long axis having a length that is longer than a thickness in the z-axis direction is arranged such that both ends of the elements in the long-axis direction formed on the x-y plane contact the upper surfaces of two adjacent first electrodes; and a second electrode which is disposed on the plurality of ultra-thin LED elements.

In addition, the transparent ultra-thin LED display may further include an alignment guide which is disposed on an upper surface of each of the plurality of first electrodes and extends along the longitudinal direction of the first electrode with a width that is narrower than that of each disposed first electrode, wherein among the disposed ultra-thin LED elements, the vertical mounting ratio, which is a ratio of the ultra-thin LED elements disposed such that the mounting angle between the long-axis direction of the ultra-thin LED element and the width direction of the first electrode satisfies 5° or less, may be 75% or more, more preferably, 82% or more, and even more preferably, 88% or more.

In addition, the ultra-thin LED element may have a first surface which faces the z-axis direction and is one surface of the lowest layer on the first conductive semiconductor layer side, and a second surface which is one surface of the uppermost layer on the second conductive semiconductor layer side, and wherein among all of the disposed ultra-thin LED elements, the selective mounting ratio, which is a ratio of ultra-thin LED elements mounted such that any one surface of the first surface or second surface is in contact with an upper surface of the first electrode, may satisfy 70% or more.

In addition, the first conductive semiconductor layer may be an n-type semiconductor, and the second conductive semiconductor layer may be a p-type semiconductor, and wherein among all of the disposed ultra-thin LED elements, the selective mounting ratio, which is a ratio of ultra-thin LED elements mounted such that the second surface is in contact with an upper surface of the first electrode, may satisfy 70% or more.

In addition, the ultra-thin LED element may have a width that is formed to be smaller than the thickness.

In addition, while the plurality of subpixel areas express 3 colors of blue, green and red, at least a portion of the plurality of subpixel areas may further include a color conversion layer which is patterned on an ultra-thin LED electrode assembly such that each subpixel area expresses any one color of the three colors.

In addition, each of the subpixel areas may have a light-emitting area ratio of 30% or more.

Additionally, in the transparent ultra-thin LED display, the light color may be blue, white or UV.

In addition, the second embodiment of the present invention provides a transparent ultra-thin LED display, including a display area in which a plurality of subpixel areas, which include all of blue, green and red with each area designated as any one light color thereof, and a light transmission areas are arranged on the x-y plane based on mutually perpendicular x, y and z axes, and the light transmittance is 25% or more, wherein each of the plurality of subpixel areas is provided with an ultra-thin LED electrode assembly in which a plurality of ultra-thin LED elements emitting a designated light color are electrically connected between first and second electrodes that are spaced apart in the z-axis direction.

According to an exemplary embodiment of the present invention, the ultra-thin LED element may be an element whose area of a light-emitting surface, which is a plane perpendicular to a direction in which the layers forming the element are stacked, is 0.05 to 25 $m^2$, and the light-emitting area ratio of the ultra-thin LED elements on the x-y plane in each subpixel area may be 50% or less.

In addition, the ultra-thin LED element may be an element in which a plurality of layers including a first conductive semiconductor layer, a photoactive layer and a second conductive semiconductor layer are stacked in the z-axis direction, and any one direction perpendicular to the z-axis becomes a long axis.

In addition, the ultra-thin LED element may be an element in which the layers forming the element are stacked in the z-axis direction, the thickness in the z-axis direction may be 0.1 to 3 μm, and the length of a long axis which is any one direction on the x-y plane may be 1 to 10 μm.

In addition, the display area may include in the z-axis direction a first substrate, a second layer area which is disposed on the first substrate and provided with a plurality of circuit elements, and a first layer area which is provided on the second layer area and includes a plurality of ultra-thin LED electrode assemblies and a partition wall that surrounds the exterior of each ultra-thin LED electrode assembly at a predetermined height, wherein the light transmittance of the first substrate, circuit elements and partition wall may be 60% or more.

In addition, the ultra-thin LED electrode assembly may include a plurality of first electrodes which are spaced apart from each other on the x-y plane; a plurality of ultra-thin LED elements in which a plurality of layers including a first conductive semiconductor layer, a photoactive layer and a second conductive semiconductor layer are stacked in the z-axis direction, and the long axis having a length that is longer than a thickness in the z-axis direction is arranged such that both ends of the elements in the long-axis direction formed on the x-y plane contact the upper surfaces of two adjacent first electrodes; and a second electrode which is disposed on the plurality of ultra-thin LED elements.

In addition, the transparent ultra-thin LED display may further include an alignment guide which is disposed on an upper surface of each of the plurality of first electrodes and extends along the longitudinal direction of the first electrode with a width that is narrower than that of each disposed first electrode, wherein among the disposed ultra-thin LED elements, the vertical mounting ratio, which is a ratio of the ultra-thin LED elements disposed such that the mounting angle between the long-axis direction of the ultra-thin LED element and the width direction of the first electrode satisfies 5° or less, may be 75% or more, more preferably, 82% or more, and even more preferably, 88% or more.

In addition, the ultra-thin LED element may have a first surface which faces the z-axis direction and is one surface of the lowest layer on the first conductive semiconductor layer side, and a second surface which is one surface of the uppermost layer on the second conductive semiconductor layer side, and wherein among all of the disposed ultra-thin LED elements, the selective mounting ratio, which is a ratio of ultra-thin LED elements mounted such that any one surface of the first surface or second surface is in contact with an upper surface of the first electrode, may satisfy 70% or more.

In addition, the first conductive semiconductor layer may be an n-type semiconductor, and the second conductive semiconductor layer may be a p-type semiconductor, and wherein among all of the disposed ultra-thin LED elements, the selective mounting ratio, which is a ratio of ultra-thin LED elements mounted such that the second surface is in contact with an upper surface of the first electrode, may satisfy 70% or more.

In addition, the ultra-thin LED element may have a width that is formed to be smaller than the thickness.

In addition, each of the subpixel areas may have a light-emitting area ratio of 30% or more.

In addition, the present invention provides a method for manufacturing a transparent ultra-thin LED display which includes a display area in which a plurality of subpixel areas and light transmission areas are arranged on the x-y plane based on mutually perpendicular x, y and z axes, and the light transmittance is 25% or more, wherein the display area is manufactured by including the steps of (1) introducing a solution including ultra-thin LED elements onto a plurality of first electrodes that are formed in each subpixel area and spaced apart from each other; (2) applying assembly power to the first electrode to self-align the ultra-thin LED elements that are introduced into each subpixel area such that both ends facing each other in the long-axis direction contact the upper surfaces of two adjacent first electrodes; and (3) forming a second electrode on a plurality of self-aligned ultra-thin LED elements to form an ultra-thin LED electrode assembly.

Hereinafter, the terms used in the present invention are defined.

In terms of describing the embodiments according to the present invention, the cases where it is described to be formed “on”, “above” and “on top”, or “under”, “below” or “at bottom” of each layer, area, line or substrate include all of the meanings of “directly” and “indirectly.”

In addition, as terms used in the present invention, the fact that certain components are arranged “on the x-y plane” includes not only the case where they are arranged on the same plane, but also the case where they are arranged on different planes in the z-axis direction. For example, the gate line and the data line may be arranged to intersect on the x-y plane within the display area (DA), and in this case, each line may be located on a different plane in the z-axis direction.

In addition, as terms used in the present invention, the ‘driveable mounting ratio’ refers to a ratio of the number of elements that are mounted in a drivable form among all LED elements mounted on the lower electrode. In addition, the ‘selective mounting ratio’ refers to a ratio of the number of elements among all LED elements that are mounted on the lower electrode such that any one surface of the first surface (B) or the second surface (T) of elements is in contact with an upper surface of the lower electrode.

The ultra-thin LED display according to the present invention can achieve high brightness with low power by overcoming the low durability and brightness of OLED, and can exhibit excellent transparency while ensuring durability without a separate encapsulation process. In addition, the high brightness characteristics can be widely applied to transparent displays as it solves the problems of low contrast ratio and visibility in transparent OLED displays due to external light.

BRIEF DESCRIPTION OF THE DRAWINGS

FIGS. 1 to 3 are diagrams of a transparent ultra-thin LED display according to an exemplary embodiment of the present invention. FIG. 1 is a plan view of the transparent ultra-thin LED display, FIG. 2 is a cross-sectional mimetic diagram along the boundary line X-X' of FIG. 1, and FIG. 3 is a mimetic diagram enlarging some subpixel areas of FIG. 1.

FIG. 8A is a plan view of the ultra-thin LED electrode assembly disposed in one subpixel area, and FIG. 8B is a cross-sectional view taken along the Y-Y' boundary line of FIG. 8A.

FIG. 9 is a mimetic diagram of various mounting shapes that an ultra-thin LED element disposed in an ultra-thin LED electrode assembly disposed in the subpixel area of a transparent ultra-thin LED display according to an exemplary embodiment of the present invention can exhibit.

FIG. 10 is a cross-sectional mimetic diagram of an ultra-thin LED electrode assembly disposed in the subpixel area of a transparent ultra-thin LED display according to an exemplary embodiment of the present invention.

FIG. 11 is a cross-sectional mimetic diagram of an ultra-thin LED electrode assembly disposed in the subpixel area of a transparent ultra-thin LED display according to an exemplary embodiment of the present invention.

In FIGS. 12 and 13, (a) is contour lines of voltage magnitude, and (b) is contour lines of electric field strength.

FIG. 18 is a diagram illustrating the movement of ultra-thin LED elements being attracted to the surfaces of two adjacent first electrode, and FIG. 19 is a diagram illustrating the rotational torque generated in the ultra-thin LED elements based on the x-axis, which is a long axis of the ultra-thin LED elements.

DETAILED DESCRIPTION OF THE INVENTION

Hereinafter, with reference to the attached drawings, the exemplary embodiments of the present invention will be described in detail so that those skilled in the art can easily practice the present invention. The present invention may be implemented in many different forms and is not limited to the exemplary embodiments described herein.

Figure 1:
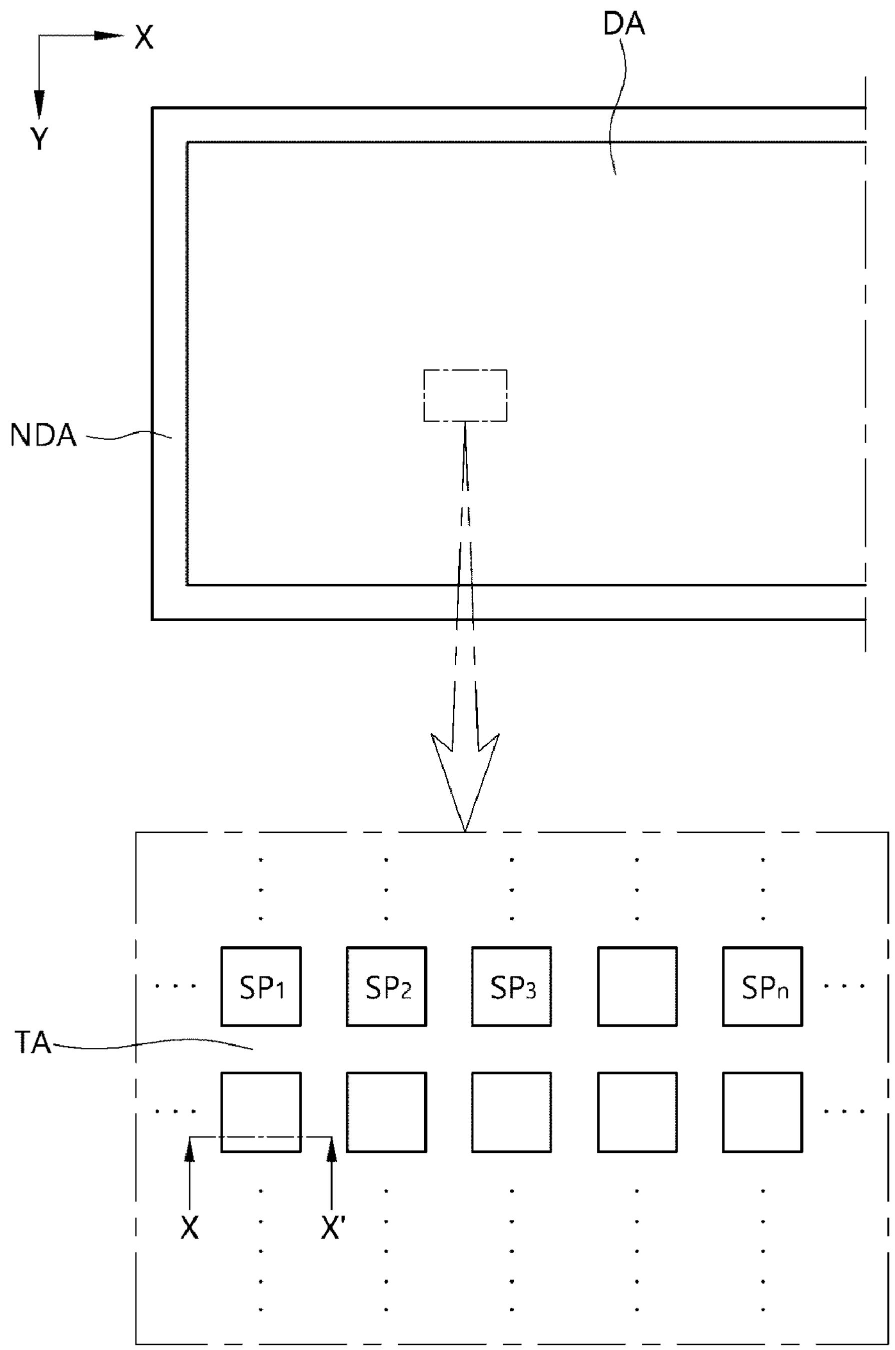

When it is described with reference to FIGS. 1 to 3, the transparent ultra-thin LED display of the present invention includes a plurality of subpixel areas ($SP_1$, $SP_2$, $SP_3$, $SP_n$) and a display panel including a display area (DA) in which a light transmission area (TA) is arranged on the x-y plane with respect to mutually perpendicular x, y and z axes, and even though LED elements other than OLED are provided in the subpixel areas ($SP_1$, $SP_2$, $SP_3$, $SP_n$), it may be advantageous to secure transparency as a transparent display, as the light transmittance of the display area (DA) satisfies 25% or more, preferably, 30% or more, and more preferably, 40% or more.

The display panel may further include a non-display area (NDA) located outside the display area (DA). In addition, the transparent ultra-thin LED display may include known components that constitute the display, such as a gate driving circuit, a data driving circuit, a controller and the like for driving the display panel, and all or part of these known components may be disposed in the non-display area (NDA). Meanwhile, since known components constituting a display, such as a controller or various driving circuits, may have structures and functions known in the display field, the detailed description thereof will be omitted in the present invention. In addition, the non-display area (NDA) may not be transparent, but the present invention is not limited thereto, and it is noted that the non-display area (NDA) may also be designed to be transparent depending on the purpose.

In addition, a gate driving circuit and a data driving circuit are connected to the controller, and a plurality of gate lines and a plurality of data lines that are respectively connected to the gate driving circuit and the data driving circuit may be arranged on the x-y plane in the display area (DA).

For example, the subpixel areas ($SP_1$, $SP_2$, $SP_3$, $SP_n$) may be located in a region where the gate line and the data line intersect. In addition, each of the subpixel areas ($SP_1$, $SP_2$, $SP_3$, $SP_n$) is provided with an ultra-thin LED electrode assembly, and each subpixel area ($SP_1$, $SP_2$, $SP_3$, $SP_n$) may express a light color emitted by the ultra-thin LED electrode assembly 101 which is provided in an ultra-thin LED element.

As an example, since the subpixel areas ($SP_1$, $SP_2$, $SP_3$, $SP_n$) are respectively provided with ultra-thin LED elements 101 that emit light colors corresponding to R, G and B and are provided with a blue ultra-thin LED electrode assembly, a green ultra-thin LED electrode assembly and a red ultra-thin LED electrode assembly, it may be constituted by blue subpixel areas, green subpixel areas and red subpixel areas. Alternatively, the subpixel areas ($SP_1$, $SP_2$, $SP_3$, $SP_n$) may equally include ultra-thin LED electrode assemblies that emit light of a specific color, and the subpixel areas ($SP_1$, $SP_2$, $SP_3$, $SP_n$) may be configured to have color conversion layers on the ultra-thin LED electrode assembly so as to emit a light color corresponding to R, G and B.

In addition, the subpixel areas ($SP_1$, $SP_2$, $SP_3$, $SP_n$) are not configured to emit only the light colors corresponding to R, G and B, and subpixel areas in which some of R, G and B are replaced or emit yellow or white may be included.

In addition, the size of each of the subpixel areas ($SP_1$, $SP_2$, $SP_3$, $SP_n$) may be configured to be all the same or to be sized differently depending on the designated light color. In addition, FIG. 1 illustrates that the subpixel areas ($SP_1$, $SP_2$, $SP_3$, $SP_n$) are arranged continuously in rows and columns, but the present invention is not limited thereto, and it is noted that they may be arranged in various arrangements rather than in a row, or may be arranged non-continuously in rows and columns. In addition, as illustrated in FIG. 3, the interval between the subpixel areas ($SP_1$, $SP_2$, $SP_3$, $SP_n$) may be implemented by being spaced apart at a predetermined interval in the x-axis direction and y-axis direction on the x-y plane, but the present invention is not limited thereto, and it may be appropriately selected in consideration of the resolution, transparency and the like of the display to be implemented, and the present invention does not particularly limit the same. In addition, if there is an interval between each subpixel area ($SP_1$, $SP_2$, $SP_3$, $SP_n$), the distance between each subpixel area ($SP_1$, $SP_2$, $SP_3$, $SP_n$) in all subpixel areas may be the same, or some of the above may be spaced apart at different intervals, and the present invention does not particularly limit in this regard.

In addition, at least two subpixel areas ($SP_1$, $SP_2$, $SP_3$, $SP_n$) may constitute one pixel, and since the configuration of the pixel may adopt known technologies in the display field, the present invention does not particularly limit the same.

In addition, each of the subpixel areas ($SP_1$, $SP_2$, $SP_3$, $SP_n$) may be driven independently. In addition, the subpixel areas ($SP_1$, $SP_2$, $SP_3$, $SP_n$) have an area of, for example, 100 $\mu m^2$ or less, another example of 100 $mm^2$ or less, still another example of 1 $\mu m^2$ to 100 $mm^2$, and another example of 10 $\mu m^2$ to 10 $mm^2$, but the present invention is not limited thereto.

In addition, the light transmission area (TA) may be located adjacent to the subpixel areas ($SP_1$, $SP_2$, $SP_3$, $SP_n$) on the x-y plane, and it may be the remaining area on the x-y plane of the display area (DA) in which the subpixel areas ($SP_1$, $SP_2$, $SP_3$, $SP_n$) are not disposed. Meanwhile, since the specific location of the light transmission area (TA) can be determined depending on the arrangement of the subpixel areas arranged on the x-y plane, the present invention does not specifically limit the specific arrangement or position of the light transmission area (TA). Meanwhile, as will be described below, the light transmission area (TA) may include circuit elements other than the ultra-thin LED electrode assembly or various electrode patterns in the z-axis direction of the display area (DA).

In addition, the display area (DA) may be partitioned into a first layer area (L1) where ultra-thin LED electrode assemblies provided in each of the plurality of subpixel areas ($SP_1$, $SP_2$, $SP_3$, $SP_n$) are located in the z-axis direction, and a second layer area (L2) for independently driving the ultra-thin LED electrode assemblies in the area (L1). In this case, the second layer area (L2) may be located between the first layer area (L1) and the first substrate 1. In addition, when the ultra-thin LED element 101 which is illustrated in FIG. 11 and provided in the ultra-thin LED electrode assembly is configured to emit a specific color, for example, blue, color conversion layers 400 on which color conversion patterns including a red conversion unit 411 and a green conversion unit 412 for implementing full-color are formed in some subpixel areas ($SP_2$, $SP_3$) may be further provided on an upper portion of the first layer area (L1) corresponding to the ultra-thin LED electrode assembly.

As described above, the transparent ultra-thin LED display according to the present invention may include a second layer area (L2) and a first substrate 1 below the first layer area (L1) in the z-axis direction of the display area (DA), which is a direction in which the image is displayed, and a second substrate (not illustrated) including a color conversion layer 400 on an upper portion of the first layer area (L1), and it includes several layers in the z-axis direction. Even though the light-emitting element provided in the first layer area (L1) is an inorganic LED element rather than an OLED, it is possible to exhibit excellent transparency by satisfying the light transmittance of the display area (DA) of 25% or more, and preferably, 30% or more.

To this end, according to an exemplary embodiment of the present invention, the light transmittance of each layer, substrate and the like of a first substrate 1, a second layer area (L2), a first layer area (L1), a color conversion layer 400 and a second substrate (not illustrated) disposed in the z-axis direction may be 60% or more, more preferably, 70% or more, and even more preferably, 80% or more. In addition, for the components provided in each layer disposed in the z-axis direction, for example, the light transmittances of a thin film transistor and various electrodes (conductive patterns, voltage wiring and source/drain electrodes to be described below), which are circuit elements disposed in the second layer area (L2), or various electrodes, partition walls and the like provided in the first layer area (L1) may each independently be 60% or more, more preferably, 70% or more, and even more preferably, 80% or more.

In addition, the various electrodes may be formed of known electrode materials with high light transmittance, and for example, they may be transparent electrodes (TCO). In addition, as specific examples, electrodes that are implemented by an alloy of at least one or at least two selected from the group consisting of ZnO, $In_2O_3$, MgO, $SnO_2$, graphene, carbon nanotubes, silver nanowires, ITO, FTO, IZO, IGZO and AZO may be used. Additionally, in order to implement the low resistance characteristics required to achieve high resolution with a larger panel size while maintaining transparency, the electrode may be implemented as a multi-layer transparent electrode provided with a metal layer having a thickness of 10 nm or less between TCOs, and for example, the multilayer transparent electrode may have a Ag metal film between ITO.

In addition, thin film transistors, which are circuit elements, may be used by appropriately employing or modifying known methods. In this case, the thin film transistor preferably has high transmittance, and an oxide thin film transistor may be used as an example.

In addition, the ultra-thin LED elements in the ultra-thin LED electrode assembly disposed in the first layer area (L1) prevent being recognized and prevent haze due to the diffraction of light passing between adjacent ultra-thin LED elements, and in order to have an excellent light transmittance, the thickness in the z-axis direction may be 0.1 to 3 μm, and the length of a long axis in any one direction on the x-y plane may be 1 to 10 μm.

Referring to FIGS. 2 and 3, a first layer area (L1) and a second layer area (L2) may be disposed on the first substrate 1 in the z-axis direction of the display area (DA), and a second substrate (not illustrated) may be disposed on the uppermost portion of the second layer area (L2).

The first substrate 1 and the second substrate are used to support the first layer area (L1) and the second layer area (L2), and they may be substrates provided in conventional displays. However, considering the light transmittance, the first substrate 1 and the second substrate may be transparent, and for example, glass or plastic may be selected, but the present invention is not limited thereto. In addition, the first substrate 1 and the second substrate may preferably be made of a bendable material. In addition, the size and thickness of the first substrate 1 and the second substrate may be appropriately changed in consideration of the size of the display panel to be implemented, but the present invention is not limited thereto.

In addition, various circuit elements and electrode patterns for driving an ultra-thin LED electrode assembly may be disposed in the second layer area (L2) disposed on the first substrate 1.

The transparent ultra-thin LED display may be classified into a passive matrix type display and an active matrix type display depending on the manner of driving the ultra-thin LED electrode assembly. When the display is implemented as an active matrix type, the circuit elements inside the second layer area (L2) may include a first thin film transistor (TFT1) and a second thin film transistor (TFT2) as a switching thin film transistor that transmits the data voltage to the first thin film transistor (TFT1), as driving thin-film transistors that control the amount of current supplied to an ultra-thin LED electrode assembly, specifically, the ultra-thin LED element 101 mounted on the ultra-thin LED electrode assembly. However, recently, in terms of resolution, contrast and operating speed, active matrix displays that select and light each subpixel area have become mainstream, but the present invention is not limited thereto, and it is noted that the circuit elements and electrode patterns inside the second layer area (L2) may be implemented in order to be implemented as a passive matrix-type display in which lighting is performed for each group of unit subpixels. Hereinafter, the detailed description will be provided based on the second layer area (L2) in the case of being implemented as an active matrix type.

The circuit element may include a plurality of thin film transistor units including a first thin film transistor (TFT1), which is a driving thin film transistor, a second thin film transistor (TFT2), which is a switching thin film transistor that supplies a data signal to the first thin film transistor (TFT1), and a capacitor unit that stores a driving voltage (Vgs) corresponding to the data signal supplied through the second thin film transistor (TFT2) and supplies the same to the first driving transistor (TFT1). In this case, each thin film transistor unit may be involved in driving each of a plurality of ultra-thin LED electrode assemblies. Accordingly, as illustrated in FIG. 2, one thin film transistor unit may be positioned to overlap an area corresponding to the ultra-thin LED electrode assembly in the z-axis direction within one subpixel area ($SP_1$). However, the present invention is not limited thereto, and unlike FIG. 2, the thin film transistor unit may be arranged to partially overlap or not overlap the ultra-thin LED electrode assembly. In addition, one thin film transistor unit may be involved in driving two or more subpixels. In addition, the number of the first thin film transistor (TFT1) and the second thin film transistor (TFT2) provided in each thin film transistor unit may be different from the drawings, and two or more of any one of the same may be provided. In addition, although not illustrated in FIG. 2, a power wire (not illustrated) which is connected to the second electrode to supply power may be provided, and the power wire may be located in the second layer area (L2), but the present invention is not limited thereto.

Specifically, a thin film transistor unit including a first thin film transistor (TFT1) and a second thin film transistor (TFT2) on a buffer layer 110 that is disposed to be adjacent to the first substrate 1 may be disposed in the second layer area (L2).

The buffer layer 110 prevents impurity ions from diffusing onto an upper surface of the first substrate 1, prevents moisture or external air from penetrating, and performs the function of flattening the surface. The buffer layer 110 may be used without limitation in the case of a known buffer material layer employed on a display substrate, and as non-limiting examples thereof, it may be formed of an organic material such as silicon oxide, silicon nitride, silicon oxynitride, aluminum oxide, aluminum nitride, titanium oxide or titanium nitride, an organic material such as polyimide, polyester or acrylic, or a laminate thereof. In addition, the buffer layer 110 may be formed by various deposition methods, such as plasma enhanced chemical vapor deposition (PECVD), atmospheric pressure CVD (APCVD) and low pressure CVD (LPCVD). In addition, it is noted that the buffer layer 110 may be omitted in some cases.

The first thin film transistor (TFT1) may be composed of a first active layer 121, a first gate electrode 122, a first drain electrode 123 and a first source electrode 124. In addition, a first gate insulating film 111 may be interposed between the first gate electrode 122 and the first active layer 121 to insulate therebetween. In addition, the first gate electrode 122 may be formed on the first gate insulating film 111 to overlap a portion of the first active layer 121. In addition, a second gate insulating film 112 may be formed to insulate the first gate electrode 122.

In addition, the second thin film transistor (TFT2) may be composed of a second active layer 131, a second gate electrode 132, a second drain electrode 133 and a second source electrode 134. In addition, a first gate insulating film 111 may be interposed between the second gate electrode 132 and the second active layer 131 to insulate therebetween. In addition, the second gate electrode 132 may be formed on the first gate insulating film 111 to overlap a portion of the second active layer 131. In addition, a second gate insulating film 112 may be formed to insulate the second gate electrode 132.

In addition, the first active layer 121 and the second active layer 131 may be formed on the buffer layer 110. The first active layer 121 and the second active layer 131 may be made of an inorganic semiconductor such as amorphous silicon or poly silicon, or an oxide semiconductor. Preferably, the first active layer 121 and the second active layer 131 may be formed of an oxide semiconductor in terms of light transmittance. The oxide semiconductor may include, for example, a Group 12, 13 or 14 metal element such as zinc (Zn), indium (In), gallium (Ga), tin (Sn), cadmium (Cd), germanium (Ge) or hafnium (Hf), and oxides of materials selected from combinations thereof.

In addition, the first gate insulating layer 111 is formed on the buffer layer 110, and it may be formed to cover the first active layer 121 and the second active layer 131. In addition, the second gate insulating film 112 may be formed to cover the first gate electrode 122 and the second gate electrode 132. The first gate insulating film 111 and the second gate insulating film 112 may include an inorganic film such as silicon oxide, silicon nitride or metal oxide, and may be formed as a single layer or as a multilayer.

In addition, the first gate electrode 122 and the second gate electrode 132 may be formed of a material with high light transmittance among known electrode materials used as gate electrodes, and may be a single-layer film of these electrode materials, or a multilayer film formed such that two or more types of electrode materials form a multilayer.

In addition, a first planarization layer 113 may be formed on the second gate insulating film 112, and the first planarization layer 113 may be formed of a known insulating material used in displays. For example, it may include an inorganic film such as silicon oxide or silicon nitride or an organic film.

In addition, the first data conductive layer is disposed on the first planarization layer 113, and it may include a first drain electrode 123 and a first source electrode 124 of the first thin film transistor (TFT1), and a second drain electrode 133 and a second source electrode 134 of the second thin film transistor (TFT2). Specifically, each of the first drain electrode 123 and the first source electrode 124 is in contact with the first active layer 121 through a contact hole. In addition, a first planarization layer 113 is formed, and each of the second drain electrode 133 and the second source electrode 134 is in contact with the second active layer 131 through a contact hole. In addition, the first drain electrode 123, the second drain electrode 133, the first source electrode 124 and the second source electrode 134 are formed of a material with high light transmittance among known electrode materials employed in displays, and they may be single-layer films of these electrode materials, or multilayer films formed such that one or two or more types of electrode materials form a multilayer, but the present invention does not particularly limit the same.

In addition, a second data conductive layer including a conductive pattern 141 and a first voltage wire 142 which are respectively connected to the first drain electrode 123 and the first source electrode 124 formed on the first planarization layer 113 through a contact hole may be provided. A high potential voltage supplied to the first thin film transistor (TFT1) may be applied to the first voltage line 142. The conductive pattern 141 may be connected to the first drain electrode 123 of the first thin film transistor TFT1 through a contact hole formed on the first planarization layer 113. In addition, the conductive pattern 141 may be electrically connected to first electrodes 211, 212, which will be described below. Accordingly, the first thin film transistor (TFT1) may transmit the high potential voltage applied through the first voltage wire 142 to the first electrodes 211, 212 through the conductive pattern 141. Meanwhile, although not illustrated, the second data conductive layer may further include at least one conductive pattern and/or first voltage wire, and the present invention does not particularly limit the same. The conductive pattern and first voltage wire disposed on the second data conductive layer may be formed of a material with high light transmittance among known electrode materials used in displays, and they may be single-layer films of these electrode materials, or multilayer films formed such that at least one or two types of electrode materials forms multiple layers, and the present invention does not particularly limit the same. In addition, the second data conductive layer includes a second planarization layer 115 that planarizes various conductive patterns and the first voltage wire. The second planarization layer 115 may be formed of a known insulating material used in displays, and may include, for example, an inorganic layer film such as silicon oxide or silicon nitride, or an organic layer film.

In addition, the first capacitance electrode (not illustrated) of a storage capacitor arranged to partially or fully overlap the first gate electrode 122 of the first thin film transistor (TFT1) in the z-axis direction may be formed on the second gate insulating film 112, and it may form a first gate electrode 122 and a storage capacitor with the second gate insulating film 112 interposed therebetween.

In addition, the second layer area (L2) may further include a variable transmittance element (not illustrated) in order to minimize changes in contrast ratio depending on the usage environment. If it is not intended to implement a transparent display, when the ultra-thin LED electrode assembly within the subpixel does not emit light, the corresponding subpixel may implement black. However, in a transparent display, even if it does not emit light, background light passes through the subpixel, and thus, in an environment with a bright background, it may be difficult to implement black simply because the ultra-thin LED electrode assembly does not emit light. Accordingly, a transmittance variable element which is capable of changing and adjusting the transmittance of the subpixel area may be further provided in the second layer area (L2) corresponding to the subpixel area such that black can be implemented even when it is used in an environment with a bright background, and since those known in the art may be employed for the transmittance variable element, the present invention does not particularly limit the same.

Next, the first layer area (L1) disposed on the second layer area (L2) will be described. The first layer area (L1) includes ultra-thin LED electrode assemblies that are provided in each of a plurality of subpixel areas ($SP_1$, $SP_2$, $SP_3$, $SP_n$), and it may further include a partition wall 250 for surrounding each ultra-thin LED electrode assembly.

The ultra-thin LED electrode assembly includes a plurality of ultra-thin LED elements 101 which are electrically connected between first electrodes 211, 212 and second electrodes 301 that are spaced apart in the z-axis direction.

The plurality of ultra-thin LED elements 101 may be used without limitation in the case of LEDs that are commonly referred to as inorganic LEDs employed in conventional displays, and for example, it may include a plurality of layers including a first conductive semiconductor layer, a photoactive layer and a second conductive semiconductor layer.

In addition, the ultra-thin LED element 101 is small in the micro- or nano-scale, and it may have a size that is difficult to mount by the pick-and-place mounting technology. In other words, in the case of LED devices that can be mounted by the pick-and-place mounting technology, the size is big such that the element itself can be easily recognized. In particular, considering that a light transmitting area can be placed around subpixels in order to implement a transparent display, the element itself is more easily recognized, which may be disadvantageous in implementing a transparent display. In addition, considering the size of the LED elements that can be mounted by the pick-and-place mounting technology, the LED elements may be arranged to fill the entire subpixel area, and in this case, there is no portion in the subpixel area through which light can pass through, and thus, the implementation of transparent displays may be more difficult. Furthermore, if a portion through which light can transmit is placed within the subpixel area to increase transparency, the area of the subpixel area itself increases, which may significantly reduce the resolution of the display.

In addition, the ultra-thin LED electrode assembly includes a plurality of ultra-thin LED elements 101, and through this, even if a defect occurs in one or part of the ultra-thin LED elements 101, the corresponding subpixel area may fully function through the remaining LED elements. However, when placing LED elements having a size that can be mounted by the pick-and-place mounting technology, in order not to reduce the resolution of the display, one LED element must be placed in the subpixel area, and in this case, when defects in the placed LED elements occur, there is a risk of causing a fatal defect in which one subpixel itself does not emit light.

Accordingly, the present invention implements ultra-thin LED elements 101 in a small size such that they can be arranged in multiples of two or more in the sub-pixel area in consideration of the subpixel area to be set, and in this case, even if a defect occurs in some of the ultra-thin LED elements 101 arranged therein, the corresponding subpixel area may fully perform its function due to the light emission of the remaining ultra-thin LED elements 101, and since the area of the light-emitting area can be adjusted by adjusting the number of ultra-thin LED elements 101 arranged in the subpixel area, there is an advantage in that it is easier to control the area of the non-light-emitting area within the subpixel area to in order increase transparency.

Meanwhile, in order to implement a higher-resolution display, the area of the subpixel area may be set to be small to increase the number of subpixel areas within the unit area of a display panel, and accordingly, the size of ultra-thin elements 101 provided in each subpixel area may also be implemented to be small, and it is virtually impossible to implement an ultra-thin LED electrode assembly by the pick-and-place mounting technology for the ultra-thin LED element 101 implemented in a small micro- or nano-scale size.

Figure 4:
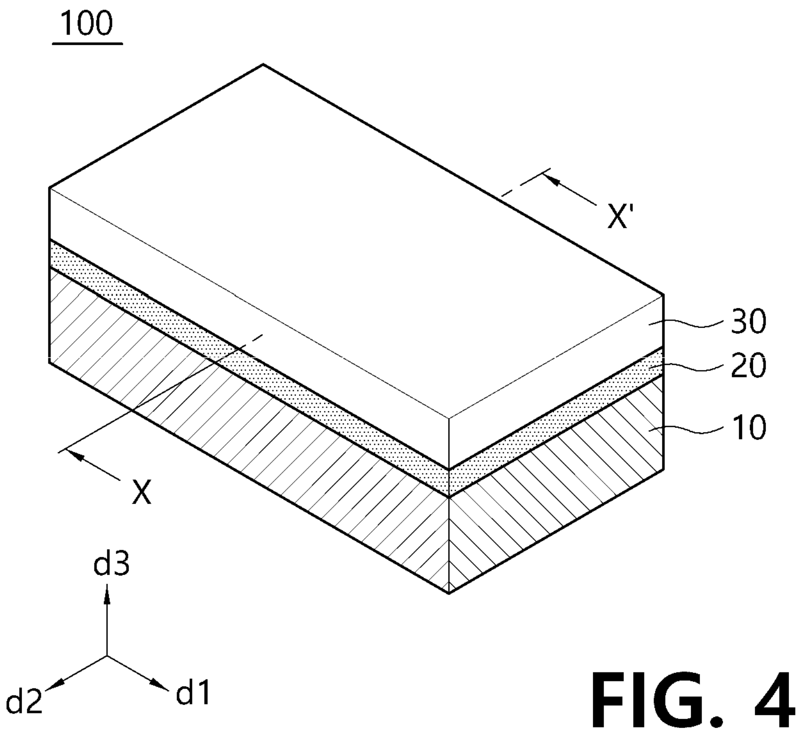
FIGS. 4 and 5 are a perspective view and a cross-sectional view along the boundary line X-X' of an ultra-thin LED element employed in a transparent ultra-thin LED display according to an exemplary embodiment of the present invention.

Accordingly, as illustrated in FIG. 04, the ultra-thin LED element 101 may be a rod-shaped element which is formed to have a length in the d1 direction of the element in the mutually perpendicular d1, d2 and d3 directions longer than a length in the other vertical d2 and d3 directions such that it can be self-aligned through dielectrophoresis by using an electric field.

According to an exemplary embodiment of the present invention, the ultra-thin LED electrode assembly is implemented by self-aligning the ultra-thin LED element 101 through dielectrophoresis by using an electric field, and accordingly, among a plurality of spaced apart first electrodes 211, 212, both ends in the d1 direction, which becomes a long axis of the ultra-thin LED element 101, may be placed in contact with the upper surfaces of two adjacent first electrodes 211, 212, and it may be implemented by placing the second electrode 301 on a plurality of ultra-thin LED elements 101 arranged therein.

However, in the case of a transparent display, since it has a certain level of light transparency, the light that is incident from the background to the rear surface of the transparent display is transmitted as is and delivered to the eyes, and the color distortion of light emitted from the subpixel due to the light that is incident from the rear surface may occur, or the contrast ratio decreases, thereby making it difficult to fully recognize the displayed image, or if the illuminance of the light that is incident on the rear surface is too high, the image itself may not be recognized. In addition, transparent displays may also cause some reflection of light that is incident on the front surface, and this front-incident light may cause a decrease in contrast ratio. If the illuminance in the environment in which the transparent display is used is high, there is a concern that the contrast ratio will be greatly reduced compared to low-light environments, and transparent displays employing OLED elements have problems with visibility and contrast ratio due to the low light-emitting characteristics of the OLED elements themselves.

However, the transparent ultra-thin LED display according to an exemplary embodiment of the present invention can achieve higher light-emitting characteristics by employing an inorganic LED element instead of OLED, and thus, it is suitable for solving the visibility and contrast ratio problems occurring in the above-mentioned transparent display.

Additionally, in order to solve these problems, in order for the transparent ultra-thin LED display to have high luminance characteristics, the main light-emitting surface of the LED element is configured to be perpendicular to the z-axis direction, which is the viewing direction of the display area (DA) such that it is advantageous that most of the light emitted from the LED element is emitted to the front surface (and rear surface) of the display. To this end, in order to maximize the area of the light-emitting surface of the LED elements, it is preferable that a plurality of layers forming the LED element are stacked in the d3 direction perpendicular to the d1 direction rather than in the d1 direction, which is the long-axis direction of the element. In addition, when the LED elements having this shape and stacking direction are mounted on the first electrodes 211, 212 such that the d3 direction of the LED elements matches the z-axis direction of the display, they increase the amount of light emitted from the front surface (and rear surface) of the display panel rather than the side surfaces, and thus, it is possible to achieve an excellent contrast ratio and visibility even in environments with high external light intensity.

In this respect, the ultra-thin LED electrode assembly provided in the transparent ultra-thin LED display according to an exemplary embodiment of the present invention includes an ultra-thin LED element 101 in which the layers forming the element are stacked in the z-axis direction, and when the ultra-thin LED element 101 is driven, any one surface that is perpendicular to the z-axis direction of the ultra-thin LED element 101 is placed to be in contact with the upper surface of the first electrodes 211, 212 such that the light-emitting surface corresponds to the x-y plane of the display area (DA), and the opposite surface of the ultra-thin LED element 101 that is not in contact with the first electrodes 211, 212 is implemented to contact the second electrode 301. In this case, compared to conventional rod-type LED elements of similar size, that is, elements in which the layers forming the element are stacked in the longitudinal direction of the element, the light-emitting area among the surface areas of the LED device becomes much larger, and since the light-emitting direction can be consistent with the viewing direction of the display panel, it is more advantageous to solve problems such as contrast ratio and visibility as described above.

In addition, the first electrodes 211, 212 serve as mounting electrodes for mounting the ultra-thin LED element 101 and function as one of the driving electrodes together with the second electrode 301. The plurality of first electrodes 211, 212 are respectively arranged at a predetermined distance from each other, and for example, each of the plurality of first electrodes 211, 212 is formed to extend to be long in any one direction, and each of the first electrodes 211, 212 may be spaced apart from each other such that any one first electrode has a direction different from the extending longitudinal direction of another adjacent first electrode. In this case, the interval between the first electrodes 211, 212 that are spaced apart from each other may be the same, or at least some of the intervals may be different. However, the shape of the first electrode is not limited thereto, and it is noted that the plurality of first electrodes may have various types of electrode shapes and electrode arrangements that can be spaced apart from each other at a predetermined interval.

In addition, the interval between the first electrodes 211, 212 that are spaced apart from each other may be smaller than the length of the ultra-thin LED element 101 in the long-axis direction, and through this, the mounting surface of the ultra-thin LED element 101 is controlled to be on a specific surface, and while mounting the mounted elements such that there is little deviation in the mounting angle, it may be advantageous for the mounted element to be mounted on the adjacent first electrode without bias in any one direction of the long axis. For example, the separation distance between adjacent first electrodes 211, 212 may be 0.3 to 0.7 times the length of the ultra-thin LED element. However, when the interval between two adjacent first electrodes 211, 212 is excessively narrowed, electrical short circuits may occur due to the assembly power supply for mounting ultra-thin LED elements, and in this case, the current that must flow from any one first electrode to the other adjacent first electrode through a solvent flows directly between the two adjacent first electrodes. Accordingly, the electric field that can induce self-alignment of the ultra-thin LED elements may not be properly formed, and as a result, the self-alignment of the ultra-thin LED elements may not be properly achieved.

In addition, the plurality of first electrodes 211, 212 include at least two that are not electrically connected to each other, and through this, in the manufacturing method described below, a high electric field may be formed between two adjacent first electrodes 211, 212.

Meanwhile, the first electrodes 211, 212 only function as mounting electrodes to which different types of power (e.g., (+) and (−) power) are applied between the adjacent first electrodes 211, 212 only in the process of self-aligning the ultra-thin LED element 101 in the manufacturing method described below. On the other hand, the first electrodes 211, 212 function as driving electrodes to which the same type of power (e.g., (+) or (−) power) is applied when driving. Accordingly, when driving the ultra-thin LED electrode assembly, the same type of power is applied to the first electrodes 211, 212, and thus, the risk of electrical short circuit between the first electrodes 211, 212 is reduced. As a result, when designing the first electrodes 211, 212, there is an advantage in that it is possible to design by narrowing the spacing interval between the electrodes. On the other hand, the first electrodes 211, 212, which are designed to have a narrow spacing interval such that an electrical short does not occur when assembly power is applied, may form a larger electric field between two adjacent first electrodes by the applied assembly power when used as mounting electrodes, and through this, it may be advantageous to improve the alignment of ultra-thin LED elements.

In addition, the first electrodes 211, 212 may have the material, shape, width, thickness, single-layer or multi-layer stacked structure of electrodes used in conventional displays, and since they can be manufactured by using known methods, the present invention does not specifically limit the same. However, it may be formed by using the transparent electrode (TCO) described above in consideration of light transparency. In addition, the first electrodes 211, 212 may have a width of 2 to 50 μm and a thickness of 0.1 to 100 μm, and more preferably, the width may be 8 to 50 μm in order to minimize the influence between adjacent first electrodes. However, the width and thickness of the first electrodes 211, 212 may be appropriately changed in consideration of the size of the desired ultra-thin LED electrode assembly.

Meanwhile, the plurality of first electrodes 211, 212 may further include known electrodes that are required for driving, controlling, repairing and wiring designing of LED elements, such as connecting electrodes and capacitor electrodes which connect two or more branch electrodes connected to the first electrode group that is grouped into two or more, with other parts such as a circuit board and the like.

Among the plurality of first electrodes 211, 212 described above, both ends in the d1 direction of the ultra-thin LED element 101 may be disposed on two adjacent first electrodes 211, 212, and any one surface in the d3 direction is implemented by being disposed to be in contact with the upper surfaces of the first electrodes 211, 212.

Referring to FIGS. 4 to 7, the ultra-thin LED elements 100, 101, 102 are elements in which a plurality of layers 10, 20, 30, 40, 60 are stacked in the d3 axis direction with respect to mutually perpendicular d1, d2 and d3 axes, and they may be rod-type LED elements in which since the length in the d1-axis direction is longer than the width in the d2-axis direction or the thickness in the d3-axis direction, the d1-axis direction becomes the long axis of the ultra-thin LED elements 100, 101, 102.

Specifically, the ultra-thin LED elements 100, 101, 102 may include a minimum number of layers to conventionally function as LED elements. Examples of the minimal layers may include conductive semiconductor layers 10, 30 and a photoactive layer 20.

The conductive semiconductor layers 10, 30 may be used without limitation if they are conductive semiconductor layers that are employed in conventional LED devices used in light sources such as lighting and displays. According to a preferred exemplary embodiment of the present invention, the ultra-thin LED elements 100, 101, 102 may include a first conductive semiconductor layer 10 and a second conductive semiconductor layer 30, and in this case, any one of the first conductive semiconductor layer 10 and the second conductive semiconductor layers 30 may include at least one n-type semiconductor layer, and the other conductive semiconductor layer may include at least one p-type semiconductor layer.

In addition, when the first conductive semiconductor layer 10 includes an n-type semiconductor layer, the n-type semiconductor layer may be selected from at least any one of semiconductor materials having the composition formula of $In_xAl_yGa_{1-x-y}N$ ($0 \le x \le 1$, $0 \le y \le 1$, $0 \le x+y \le 1$), and for example, InAlGaN, GaN, AlGaN, InGaN, AlN, InN and the like, and it may be doped with a first conductive dopant (e.g., Si, Ge, Sn, etc.). According to a preferred embodiment of the present invention, the thickness of the first conductive semiconductor layer including an n-type semiconductor layer may be 0.2 to 3 μm, but the present invention is not limited thereto.

In addition, when the second conductive semiconductor layer 30 includes a p-type semiconductor layer, the p-type semiconductor layer may be selected from at least any one of semiconductor materials having the composition formula of $In_xAl_yGa_{1-x-y}N$ ($0 \le x \le 1$, $0 \le y \le 1$, $0 \le x+y \le 1$), and for example, InAlGaN, GaN, AlGaN, InGaN, AlN, InN and the like, and it may be doped with a second conductive dopant (e.g., Mg). According to a preferred embodiment of the present invention, the thickness of the second conductive semiconductor layer 30 including a p-type semiconductor layer may be 0.01 to 0.35 μm, but the present invention is not limited thereto.

In addition, the photoactive layer 20 is formed between the first conductive semiconductor layer 10 and the second conductive semiconductor layer 30, and it may be formed in a single or multiple quantum well structure. The photoactive layer 20 may be used without limitation if it is a photoactive layer included in a conventional LED element used for lighting, displays and the like. A clad layer (not illustrated) which is doped with a conductive dopant may be formed above and/or below the photoactive layer 20, and the clad layer doped with a conductive dopant may be implemented as an AlGaN layer or an InAlGaN layer. In addition, materials such as AlGaN, AlInGaN and the like may also be used as the photoactive layer 20. When an electric field is applied to the photoactive layer 20, electrons and holes moving to the photoactive layer from the conductive semiconductor layers located above and below the photoactive layer, respectively, generate a bond of electron-hole pairs in the photoactive layer, and as a result, they emit light. According to a preferred exemplary embodiment of the present invention, the thickness of the photoactive layer 20 may be 30 to 300 nm, but the present invention is not limited thereto.

In addition, the ultra-thin LED elements 100, 101, 102 are illustrated as including the first conductive semiconductor layer 10, the photoactive layer 20 and the second conductive semiconductor layer 30 as minimum components, but other than the above, they may further include other active layers, conductive semiconductor layers, phosphor layers, hole blocking layers and/or electrode layers above/below each layer.

In addition, the ultra-thin LED elements 100, 101, 102 may further include a protective film 50 surrounding the side surface of elements when the x-z plane and y-z plane are referred to as the side surfaces of the elements, which are surfaces parallel to the z-axis direction. The protective film 50 functions to protect the surfaces of the first conductive semiconductor layer 10, the photoactive layer 20 and the second conductive semiconductor layer 30. For example, the protective film 50 may include at least any one of silicon nitride ($SiN_x$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN) and gallium nitride (GaN). The thickness of the protective film 50 may be 5 nm to 100 nm, and more preferably, 30 nm to 100 nm, and through this, it may be advantageous for protecting the side surfaces of the ultra-thin LED element from external physical stimulation.

In addition, the ultra-thin LED elements 100, 101, 102 may have an aspect ratio (a/b), which is a ratio between the length (a) of a long axis and the longer length (b) among the width which is the length in the y-axis direction or the length in the z-axis direction, of 3.0 or more, and preferable, 6.0 or more such that self-alignment can be more advantageously performed through dielectrophoresis by using an electric field as described above. Through this, in the electric field formed by the assembly power applied in the manufacturing method described below, it may be easy to arrange the ultra-thin LED elements 100, 101, 102 introduced by a dielectrophoretic force on the first electrodes 211, 212 such that both ends of the elements in the long axis direction are in contact on the adjacent first electrodes 211, 212. If the aspect ratio is less than 3.0, self-alignment may not occur at the desired level. Meanwhile, the aspect ratio may be 15 or less, and more preferably, 10 or less, which may be advantageous in achieving the objects of the present invention, such as optimizing the turning force that can be self-aligned by using an electric field.

Meanwhile, in the ultra-thin LED elements 100, 101, 102, the x-y plane is illustrated as a rectangle in the drawings, but the present invention is not limited thereto, and it may be employed without limitation from general rectangular shapes such as rhombus, parallelogram, trapezoid and the like to oval shapes.

In addition, the ultra-thin LED elements 100, 101, 102 have a length and width of micro or nanoscale, and for example, the length of a long axis in any one direction on the x-y plane may be 1 to 10 μm, and the width may be 0.25 to 1.5 μm. In addition, the thickness may be 0.1 to 3 μm. The length and width may have different standards depending on the shape of the plane, and for example, if the x-y plane is a rhombus or parallelogram, one of the two diagonals may be the length and the other one may be the width. In addition, if it is a trapezoid, one of the two diagonals may be the length and the other one may be the width. If it is a trapezoid, the longer one of the height, upper side and bottom side may be the length, and the shorter one perpendicular to the longer one may be the width. Alternatively, if the shape of the plane is an ellipse, the major axis of the ellipse may be the length, and the minor axis may be the width.

Figure 5:
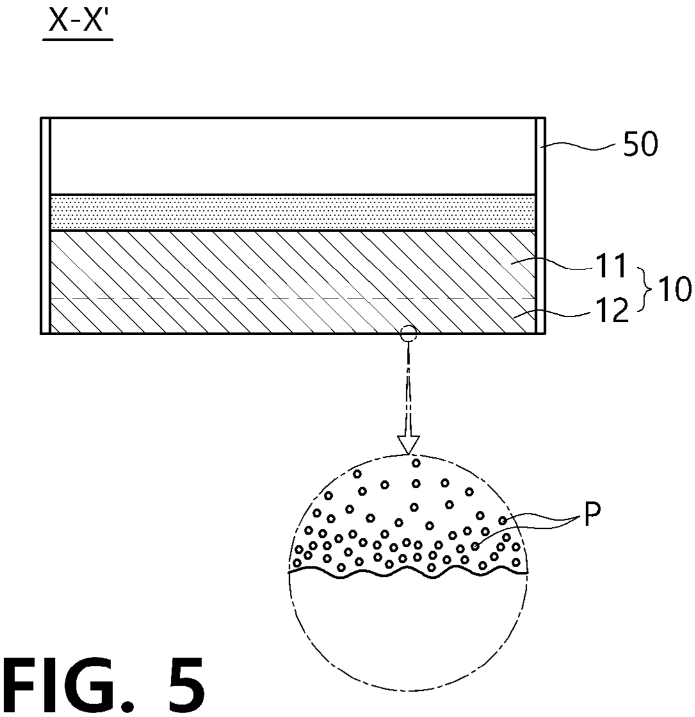

In addition, as illustrated in FIG. 5, the ultra-thin LED element 100 according to an exemplary embodiment of the present invention may have a structure of containing a plurality of pores (P) in a region 12 reaching a predetermined thickness from one surface of the first conductive semiconductor layer 10, and the structure containing a plurality of pores (P) has lower dielectric properties and electrical conductivity due to the air contained in the pores (P). As a result, by varying the material and structural differences from the second conductive semiconductor layer 30, which corresponds the uppermost layer, it is possible to improve selective alignment in which any one surface of the second conductive semiconductor layer 30 or the uppermost layer adjacent thereto, and the first conductive semiconductor layer 10 or the lowest layer adjacent thereto is mounted so as to selectively contact the first electrodes 211, 212. In addition, the structure containing a plurality of pores (P) has the advantage of increasing light-emitting efficiency by preventing light emitted from inside the ultra-thin LED element 100 from being trapped by internal reflection and not being able to escape. Meanwhile, after the structure containing the plurality of pores (P) is etched through the LED wafer to a portion of the thickness of the n-type GaN semiconductor in the shape and size of an ultra-thin LED element, it may be subjected to electrochemical etching treatment to separate the etched LED structure from the LED wafer to be formed on the n-type GaN portion exposed to the etching solution. Meanwhile, for example, the pores may have a diameter of 1 to 100 nm.

In addition, the ultra-thin LED electrode assembly includes a second electrode 301 that is electrically connected to a surface opposite to the surface of the ultra-thin LED element 101 described above in contact with the first electrodes 211, 212. The second electrode 301 may have the material, shape, width, thickness, a single-layer or multi-layer stacked structure of electrodes used in conventional displays, and since it may be manufactured by using a known method, the present invention does not specifically limit the same. However, considering light transparency, the second electrode 301 may be formed by using the transparent electrode (TCO) described above. In addition, the thickness of the second electrode 301 may be 0.1 to 100 μm, and since the width and length may be appropriately changed in consideration of the size of the desired ultra-thin LED electrode assembly, the number of second electrodes provided and the like, and thus, the present invention does not specifically limit the same.

Meanwhile, as illustrated in FIG. 3, the second electrode 301 may be disposed to electrically connect a plurality of ultra-thin LED elements 101 in one subpixel area ($SP_1$, $SP_2$, $SP_3$, $SP_n$) to one second electrode 301, but the present invention is not limited thereto, and a plurality of ultra-thin LED elements 101 in one subpixel area ($SP_1$, $SP_2$, $SP_3$, $SP_n$) may be in electrical contact through two or more second electrodes 301.

In addition, as illustrated in FIG. 3, two or more second electrodes 301 may be electrically connected to a second voltage wire 300, and two or more second voltage wires 300 may be provided. In addition, the second voltage line 300 may be arranged to be located outside the subpixel areas ($SP_1$, $SP_2$) on the x-y plane. However, the present invention is not limited to the descriptions of the second electrode 301 and the second voltage wire 300 described above, and since they may be changed in consideration of the electrode wiring design used in known displays and the arrangement form of the subpixel area, the present invention does not particularly limit the same.

According to an exemplary embodiment of the present invention, the ultra-thin LED elements 100, 101, 102 provided in the ultra-thin LED electrode assembly disposed in each of the subpixel areas ($SP_1$, $SP_2$, $SP_3$, $SP_n$) are elements having an area of the light-emitting surface in a plane perpendicular to a direction in which the layers forming the elements are stacked of 0.05 to 50 $\mu m^2$, and more preferably, 0.05 to 25 $\mu m^2$, and since it has an area smaller than the area of the subpixel, two or more ultra-thin LED elements 101 are disposed inside one sub pixel. Therefore, the ratio of the light-emitting area (A') of the ultra-thin LED elements 101 disposed on the x-y plane among the total area (A) of the x-y plane of each subpixel area ($SP_1$, $SP_2$, $SP_3$, $SP_n$) may satisfy 50% or less, and more preferably, it may be configured such that the ratio of the light-emitting area (A') satisfies 30% or more.

In this way, when the area of the light-emitting surface of each ultra-thin LED element 101 provided in the transparent display and the ratio of the light-emitting areas of the ultra-thin LED elements 101 in each subpixel area ($SP_1$, $SP_2$, $SP_3$, $SP_n$) are satisfied, each subpixel area ($SP_1$, $SP_2$, $SP_3$, $SP_n$) may have a high level of luminance without recognizing each ultra-thin LED, which can be advantageous in improving visibility, image clarity and contrast ratio even in a high-illuminance environment, and it is possible to have increased transparency at the same time.

If the light-emitting area ratio exceeds 50%, each subpixel area may have high luminance characteristics, but it may be difficult to implement increased transparency. In addition, if the light-emitting area ratio is less than 30%, the luminance expressed in each subpixel area may be low, and as a result, there is a concern that the visibility, image clarity and contrast ratio may be deteriorated. In addition, as the non-light-emitting area corresponding to the remaining area on the x-y plane of the subpixel area increases excessively, visibility, contrast ratio deterioration and color distortion become more severe due to light that is incident from the rear surface of the display, and thus, it may not be possible to achieve the objects of the present invention.

In addition, even when the ratio of the light-emitting area, which is an area occupied by the ultra-thin LED elements 100, 101, 102 in each subpixel area ($SP_1$, SP2, $SP_3$, $SP_n$), satisfies 50% or less, if the light-emitting area of the ultra-thin LED element 101 exceeds 50 $m^2$, the light transmittance may be deteriorated and be recognized by the user, and there is a concern that the contrast ratio may decrease due to an increase in the reflectance of front incident light. In addition, if the light-emitting surface area of the ultra-thin LED elements 100, 101, 102 is less than 0.05 $\mu m^2$, it is not easy to implement an ultra-thin LED element having the corresponding size, and the number of the ultra-thin LED elements 100, 101, 102 that must be provided to achieve the desired light-emitting area ratio increases excessively. As a result, the cost and process difficulty increase, and there is a concern that element characteristics may deteriorate due to heat generation from closely adjacent LEDs. Additionally, in some cases, when the area of the light-emitting surface is small due to the structure of the element itself, for example, rod-type elements in which the direction in which the layers forming the elements are stacked becomes the long-axis direction of the elements have a small area of the light-emitting surface even if the size is similar, compared to rod-type elements in which the stacking direction of the layers forming the element and the long axis direction are different. In this case, even if the LED elements are mounted tightly in the subpixel area, it may be difficult to achieve the desired level of light-emitting area ratio.

Meanwhile, the area of a region where each subpixel area ($SP_1$, $SP_2$, $SP_3$, $SP_n$), which becomes the basis for the light-emitting area ratio, occupies the x-y plane may be the area of a region where one subpixel area ($SP_{-1}$) in the first layer area (L1) occupies on the x-y plane of the display area (DA). For example, as illustrated in FIG. 2, when a partition wall 250 surrounding the exterior of each ultra-thin LED electrode assembly at a predetermined height is provided in the first layer area (L1), the area of a region where the subpixel area ($SP_1$) occupies on the x-y plane may be the area of a region surrounded by the inner side of the partition wall 250. Specifically, referring to FIG. 8A, it may be the area (a) of a second planarization layer 115 which corresponds to a surface on which the first electrodes 211, 212 are formed inside the partition wall 250. Alternatively, if, unlike in FIG. 2, the partition wall 250 is not provided and the subpixel area is located in a region where the gate line and the data line intersect, any one subpixel area may be a region corresponding to the intersection area, and the x-y plane area of the subpixel area may be the area of the second planarization layer 115 which corresponds to a surface on which the first electrodes 211, 212 in the corresponding area are formed. In addition, when looking at a plurality of ultra-thin LED elements 101 mounted on the ultra-thin LED electrode assembly in the x-y plane, the light-emitting area (A') of the ultra-thin LED elements 101 refers to the total area of the light-emitting surfaces of each ultra-thin LED element 101 that are capable of emitting light when driving power is applied, and if it does not emit light even when mounted, the light-emitting surface of the ultra-thin LED element itself is excluded from the total area.

Figure 8A:
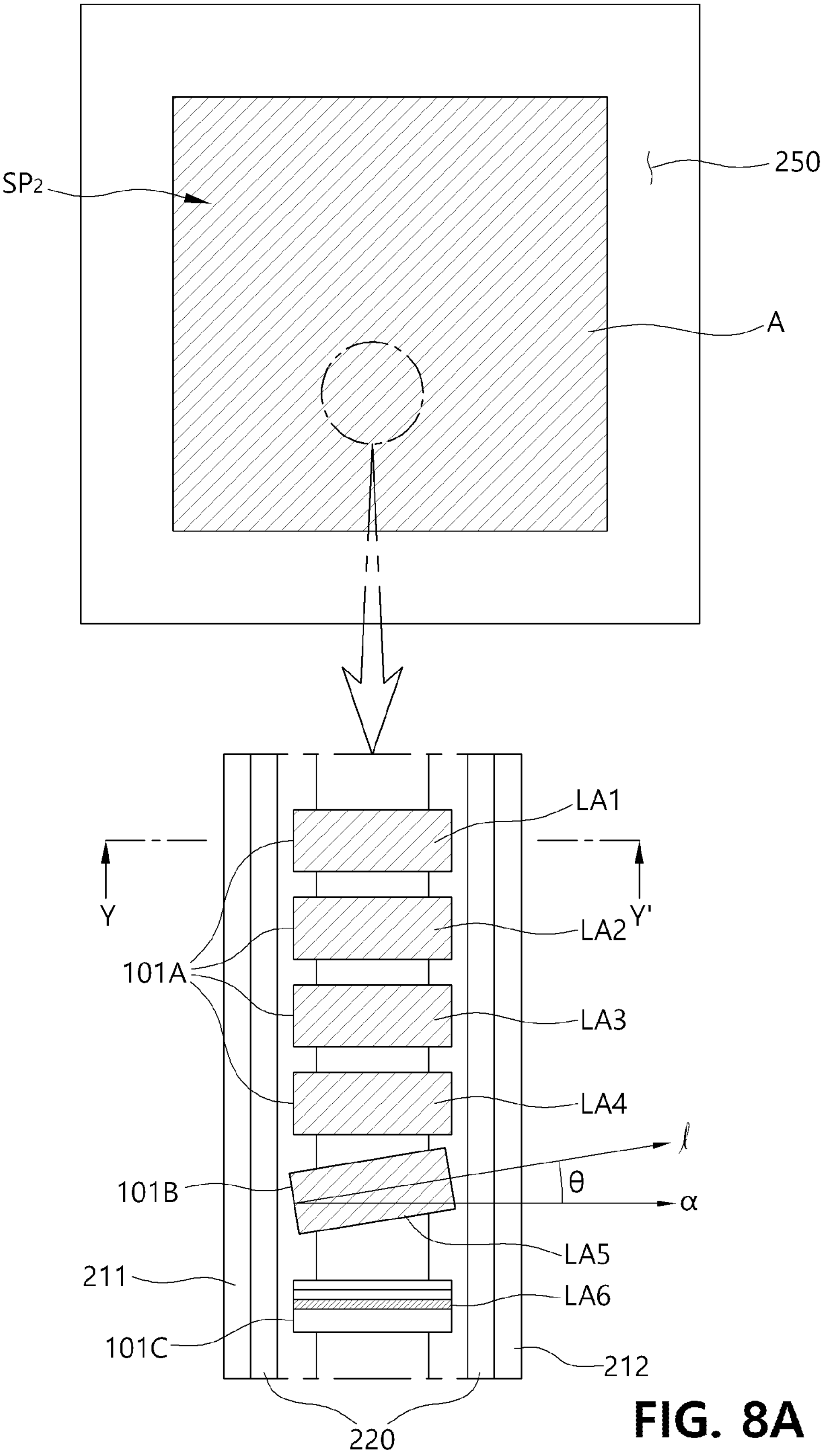
FIGS. 8A to 8B are diagrams of an ultra-thin LED electrode assembly disposed in a subpixel area of a transparent ultra-thin LED display according to an exemplary embodiment of the present invention.
Figure 8B:
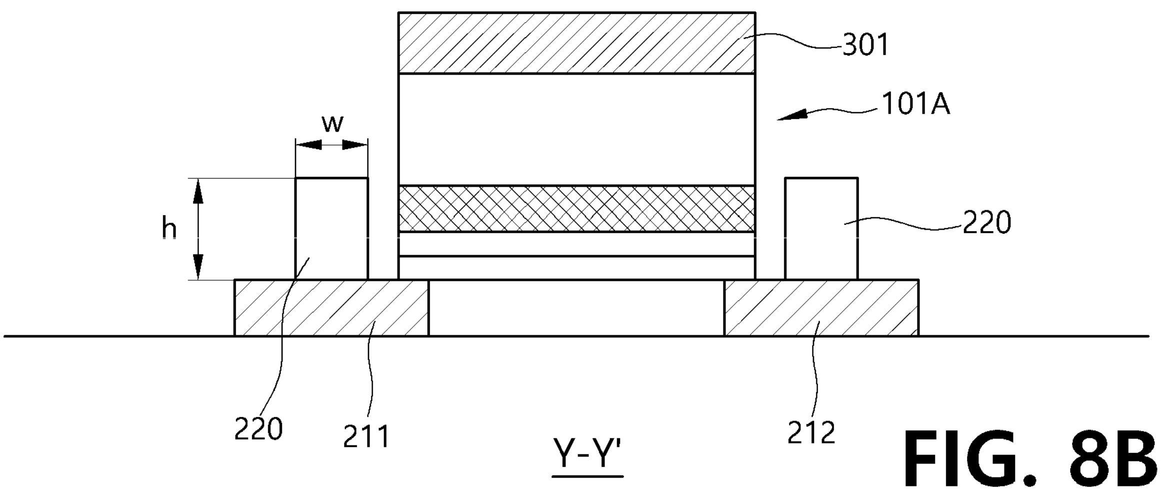

When it is described with reference to FIG. 8A, 6 ultra-thin LED elements in which layers forming the elements are stacked in the z-axis direction are mounted on the first electrodes 211, 212, of which 5 ultra-thin LED elements 101A, 101B are mounted such that the upper or lower surfaces in a direction where the layers forming the elements are stacked are in contact with the first electrodes 211, 212, and accordingly, light emission is possible when driving power is applied through the first electrodes 211, 212 and the second electrode (not illustrated). In contrast, the remaining 1 ultra-thin LED element 101C is mounted such that the side surface of the element, which is a surface parallel to the stacking direction of the layers forming the element, is in contact with the first electrodes 211, 212, and thus, it does not emit light even when driving power is applied. Therefore, the light-emitting area (A'), which is the total light-emitting surface area occupied by the ultra-thin LED elements in one subpixel area ($SP_2$) as illustrated in FIG. 8A, is calculated as $A'_{LA1}+A'_{LA2}+A'_{LA3}+A'_{LA4}+A'_{LA5}$, and the area of the light-emitting surface (LA6) of 1 ultra-thin LED element 101C, which cannot emit light, is excluded from the total.

In addition, the number of ultra-thin LED elements 100, 101, 102 provided in each subpixel area ($SP_1$, $SP_2$, $SP_3$, $SP_n$) may be 2 to 100,000, but the present invention is not limited thereto.

Meanwhile, in order to implement high resolution, the area of the subpixel area ($SP_1$, $SP_2$, $SP_3$, $SP_n$) may be designed to be smaller, but when the size of the ultra-thin LED elements 100, 101, 102 is implemented to be excessively small, there is a concern that the possibility that defects may occur in the ultra-thin LEDs obtained individually increases. Accordingly, the area of the subpixel areas ($SP_1$, $SP_2$, $SP_3$, $SP_n$) is implemented to be smaller to express high resolution, but without significantly reducing the size of the ultra-thin LED elements 100, 101, 102, the number of the ultra-thin LED elements 100, 101, 102 provided in each subpixel area is reduced to 2 to 15 so as to implement an ultra-thin LED electrode assembly. However, in a situation where the size of the ultra-thin LED elements 100, 101, 102 is not significantly reduced, in order to greatly reduce the area of the subpixel area and at the same time satisfy a light-emitting area ratio of 50% or less, it is necessary that the ultra-thin LED elements 100, 101, 102 must be concentrated and mounted in a limited area on the first electrodes 211, 212. In order to achieve this, the mounting area occupied by any one of the ultra-thin LED elements 100, 101, 102 mounted on the first electrodes 211, 212 must be minimized, and through this, it is possible to secure a mounting area on the first electrodes 211, 212 so as to allow other ultra-thin LED elements 100, 101, 102 to be mounted.

Figure 8C:
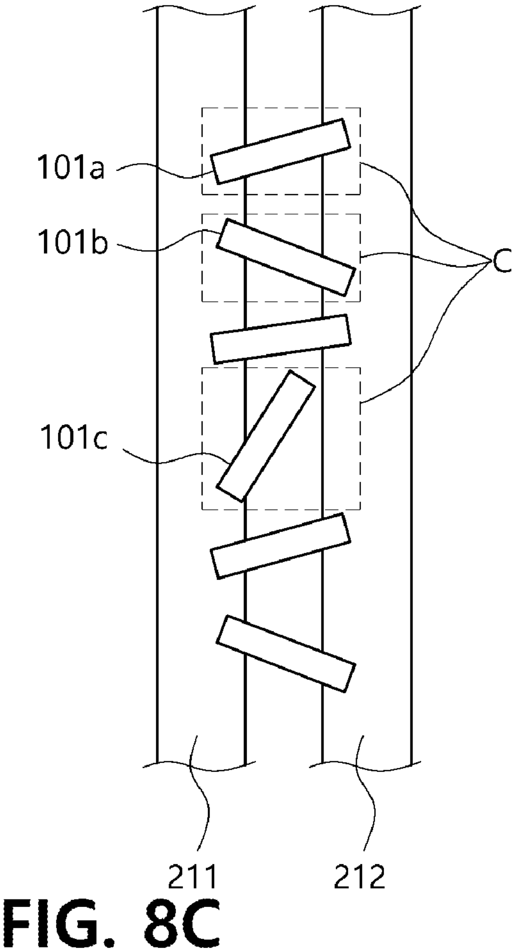
FIG. 8C is a partial plan view of an ultra-thin LED electrode assembly disposed in the subpixel area of a transparent ultra-thin LED display according to an exemplary embodiment of the present invention.

When it is described with reference to FIG. 8C, assuming that the long axis direction is the alignment direction, the first ultra-thin LED element 101*a*, the second ultra-thin LED element 101*b* and the third ultra-thin LED element 101*c* disposed on the first electrodes 211, 212 are disposed on the first electrodes 211, 212 such that the alignment direction is very irregular, and accordingly, the mounting area (C) of each ultra-thin LED element 101*a*, 101*b*, 101*c* occupying the first electrode 211, 212 is larger than the upper surface (or lower surface) of the ultra-thin LED elements 101*a*, 101*b*, 101*c*, and as a result, it can be confirmed that the mounting area of the first electrodes 211, 212, where other ultra-thin LED elements can be mounted, is being reduced. In this case, even if the ultra-thin LED element itself has a light-emitting surface with a large ratio compared to the surface area of the element, the number of ultra-thin LED elements provided in one subpixel area has to decrease. In this case, in order to implement high resolution, it may be difficult to dispose a large number of ultra-thin LED elements in a small mounted subpixel area while maintaining the light emitting area ratio below 50%.

As such, the ultra-thin LED electrode assembly provided in the transparent ultra-thin LED display according to an exemplary embodiment of the present invention is mounted such that the alignment direction of the ultra-thin LED elements is close to any one direction, and thus, the size of the mounting area (C) occupied by one ultra-thin LED element is reduced such that it may be implemented such that more ultra-thin LED elements 100, 101, 102 are mounted within the first electrodes 211, 212 in a limited area. Accordingly, the ultra-thin LED electrode assembly implemented as illustrated in FIG. 8A may greatly improve the ratio of the ultra-thin LED elements that are disposed such that the mounting angle (θ) formed by the long axis direction (l) of the ultra-thin LED elements 101A, 101B, 101C among the entire ultra-thin LED elements regardless of whether they are driven and the width direction (α) perpendicular to the longitudinal direction of the first electrodes 211, 212 satisfies 100 or less. In particular, the vertical mounting ratio, which is the ratio of the ultra-thin LED elements disposed such that the mounting angle (θ) satisfies 5° or less, may satisfy 75% or more, more preferably, 82% or more, and even more preferably, 88% or more.

Meanwhile, as described in the manufacturing method described below, the uniformity of the alignment direction as described above and the concentrated arrangement of the ultra-thin LED elements 100, 101, 102 within the limited area of the first electrodes 211, 212 may be possible through the adjustment of dielectric properties between a solvent used for movement during the dispersion and alignment of the ultra-thin LED elements 100, 101, 102 introduced into the process and the alignment guide 220 formed on the first electrodes 211, 212. In this regard, it will be specifically described in the description of the manufacturing method.

In addition, according to an exemplary embodiment of the present invention, in order to solve the deterioration of contrast ratio, visibility and clarity due to the illuminance in the usage environment that occurs due to the light transparency of the transparent display by implementing high luminance, an ultra-thin LED electrode assembly with improved light-emitting efficiency may be disposed in the subpixel areas ($SP_1$, $SP_2$, $SP_3$, $SP_n$).

The improvement of the light-emitting efficiency of the ultra-thin LED electrode assembly is achieved through selective self-alignment such that the types of semiconductor layers of the ultra-thin LED elements 100, 101, 102 become p-type semiconductor layers (or electrode layers adjacent to the p-type semiconductor layers) which come into contact such that direct current conversion of the driving power, contact resistance between the ultra-thin LED element 101 and the first electrodes 211 212, and contact resistance with the first electrodes 211, 212 are reduced.

First of all, the direct current conversion and selective self-alignment of the driving power of the ultra-thin LED electrode assembly will be described.

As described above, the ultra-thin LED electrode assembly includes first electrodes 211, 212 and second electrodes 301 that are spaced apart in the z-axis direction, and ultra-thin LED electrode elements 100, 101, 102 are disposed between the spaced first electrodes 211, 212 and the second electrode 301. In this case, the ultra-thin LED elements 100, 101, 102 mounted in a drivable state are in a case where the stacking direction (d3) of the layers forming the ultra-thin element 101 matches the z-axis direction, and in this case, the possible mounting form of the ultra-thin LED elements 100, 101, 102 may be a first mounting form in which the n-type semiconductor layer side corresponding to the first conductive semiconductor layer 10 of the ultra-thin LED elements 100, 101, 102 is in contact with the first electrode 211, 212, is conversely a second mounting type in which the p-type semiconductor layer side corresponding to the second conductive semiconductor layer 30 of the ultra-thin LED elements 100, 101, 102 is in contact therewith. In this case, if the mounting form of the ultra-thin LED elements 100, 101, 102 provided in the implemented ultra-thin LED electrode assembly includes both of the first and second mounting forms at a similar ratio, AC power must be necessarily applied to drive the ultra-thin LED electrode assembly, and direct current power may not be selected as the driving power.

Accordingly, in order to convert the driving power to direct current power, most of the ultra-thin LED elements 100, 101, 102 provided in the ultra-thin LED electrode assembly must be mounted to have the first or second mounting form. However, as the number of ultra-thin elements 100, 101, 102 provided in the ultra-thin LED electrode assembly increases, the probability of being mounted in a specific mounting type decreases, and it is very difficult to control the same. For example, when 2 ultra-thin LED elements 100 with the d1 direction as the long axis are brought into contact with the upper surfaces of the first electrodes 211, 212 through a dielectrophoretic force, the surfaces of the contactable elements are 1 first conductive semiconductor layer 10 surface, 1 second conductive semiconductor layer 30 surface or 2 first conductive semiconductor layer 10/photoactive layer 20/second conductive semiconductor layer 30 surfaces. Among these, the probability that the same surface of both of 2 ultra-thin LED elements 100 contacts the upper surfaces of the first electrodes 211, 212 while being in contact to enable driving is only $2\times(1/4)^2=1/8$, and the probability that any specific surface of two ultra-thin LED elements 100, for example, a side surface of the second conductive semiconductor layer 30, contacts the upper surfaces of the first electrodes 211, 212 is $(1/4)^2$ $1/16$, and thus, it is not even easier.

In other words, assuming that n number of ultra-thin LED elements 100 are provided, the probability of self-alignment by dielectrophoresis that can select DC power as the driving power is very low at $2(1/n)^n$, and among these, the probability of self-alignment to be mounted so that one surface of the p-type semiconductor layer side is in contact with the upper surfaces of the first electrodes 211, 212 is much lower at $(1/n)^n$.

However, the ultra-thin LED electrode assembly provided in the transparent ultra-thin LED display according to an exemplary embodiment of the present invention not only allows the driving power to be selected as direct current by controlling a surface that touches the first electrodes 211, 212 during self-alignment by dielectrophoresis, and furthermore, by mounting one surface of the p-type semiconductor layer of the ultra-thin LED elements 100, 101, 102 to be in contact with the upper surfaces of the first electrode 211, 212, it is possible to exhibit higher luminance characteristics, and through this, the visibility and contrast ratio of the transparent display may be further improved.

In this regard, before describing this in detail, in the ultra-thin LED element described below, the lowest and uppermost layers facing a direction in which the layers are stacked are referred to as a first surface (B) and a second surface (T), respectively, and the lowest layer may be the first conductive semiconductor layer 10 or the outermost layer adjacent thereto, and the uppermost layer may be the second conductive semiconductor layer 30 or the outermost layer adjacent thereto.

Meanwhile, in order to help understand how the first surface (B) or the second surface (T) among the various surfaces of the ultra-thin LED elements 100, 101, 102 are controlled to be self-aligned such that they are in contact with the first electrodes 211, 212 through a dielectrophoresis force, first of all, the dielectrophoresis mechanism for the movement of particles in a medium due to a dielectrophoretic force will be explained.

Dielectrophoresis refers to a phenomenon in which a directional force is applied to particles by a dipole induced in the particles when the particles are placed in a non-uniform electric field. In this case, the strength of the force may vary depending on the electrical properties of the particles and the medium, dielectric properties, frequency of the alternating electric field and the like, and the time average force ($F_{DEP}$) received by the particles during dielectrophoresis is expressed in Mathematical Formula 3 below.

$$F_{DEP} = 2\pi r^3 \varepsilon_m Re[K(\omega)]\nabla|E|^2 \quad \text{[Mathematical Formula 3]}$$

In Mathematical Formula 3, r, εm and E represent the radius of the particle, the dielectric constant of the medium, and the root mean square magnitude of the applied alternating current electric field, respectively. In addition, Re[K(ω)] is a factor that determines a direction in which nearly spherical particles move, and it means the real number part of the values according to Mathematical Formula 1 below.

$$K(\omega) = \frac{\varepsilon_p^* - \varepsilon_m^*}{\varepsilon_p^* + 2\varepsilon_m^*} \quad \text{[Mathematical Formula 1]}$$

Herein, εp* and εm* are the complex dielectric constants of the particle and the medium, respectively, and ε* is based on Mathematical Formula 4 below.

$$\varepsilon^* = \varepsilon - j\frac{\sigma}{\omega} \quad \text{[Mathematical Formula 4]}$$

Herein, σ is the electrical conductivity coefficient, F is the dielectric constant, ω is the angular frequency (ω=2πf), and j is the imaginary number part ($j=\sqrt{-1}$).

In this case, the movement of particles during dielectrophoresis largely depends on the change in factors according to Mathematical Formula 1. In other words, the sign change according to the frequency of Re[K(ω)] is the most important factor in determining the direction of a phenomenon in which particles move toward or away from the high electric field region. In this case, if Re[K(ω)] has a positive value, the particle moves toward the high electric field region, which is called positive dielectrophoresis (pDEP). If Re[K(ω)] has a negative value, the particle moves in a direction away from the high electric field region, which is called negative dielectrophoresis (nDEP).

The ultra-thin LED elements 100, 101, 102 are subjected to a dielectrophoretic force while being dispersed in a solvent, which is a medium, and the electrical conductivity coefficient and dielectric constant of each type of materials that can be included in the solvent and the ultra-thin LED elements 100, 101, 102 are shown in Table 1 below.

TABLE 1

| | Solvent | | Materials that can be provided in LED elements | | | | | |
|---|---|---|---|---|---|---|---|---|
| | Acetone | IPA | GaN | ITO | $SiO_2$ | $SiN_x$ | $Al_2O_3$ | $TiO_2$ |
| Dielectric constant (ε) | 20.7 | 18.6 | 12.2 | 3.2 | 3.9 | 6.2 | 9.0 | 80 |
| Electrical conductivity (σ; S/m) | $20 \times 10^{-6}$ | $6 \times 10^{-6}$ | $1 \times 10^{4}$ | $1 \times 10^{5}$ | $1 \times 10^{-10}$ | $2 \times 10^{-13}$ | $1 \times 10^{-14}$ | $1 \times 10^{-13}$ |

Figure 15:
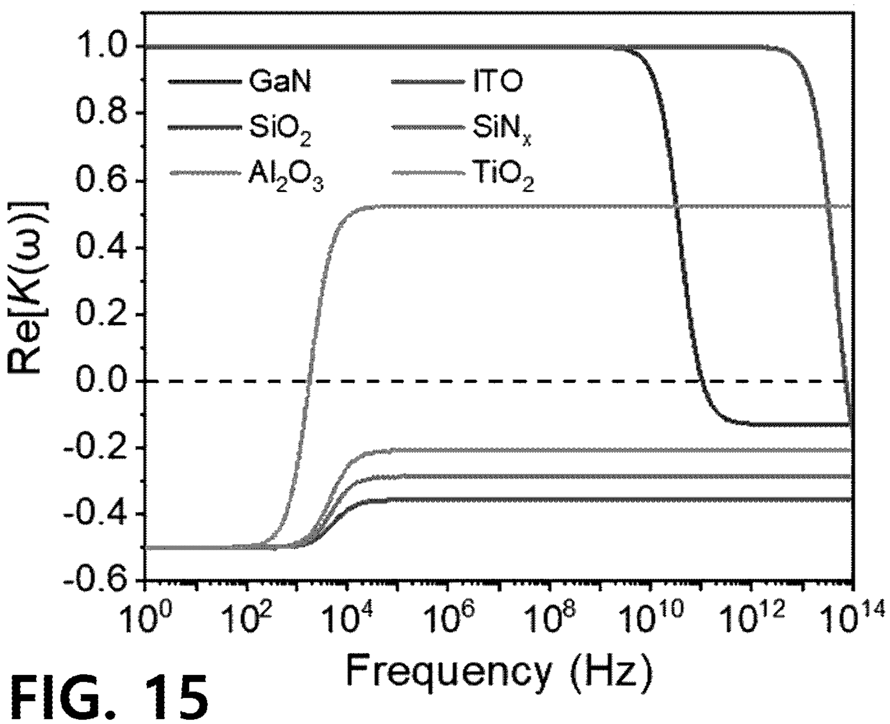
FIGS. 15 and 16 are graphs illustrating the real number part of values according to Mathematical Formula 1 for each frequency of an electric field formed when a single particle formed of each material as illustrated is placed in a medium of acetone and isopropyl alcohol, respectively.
Figure 16:
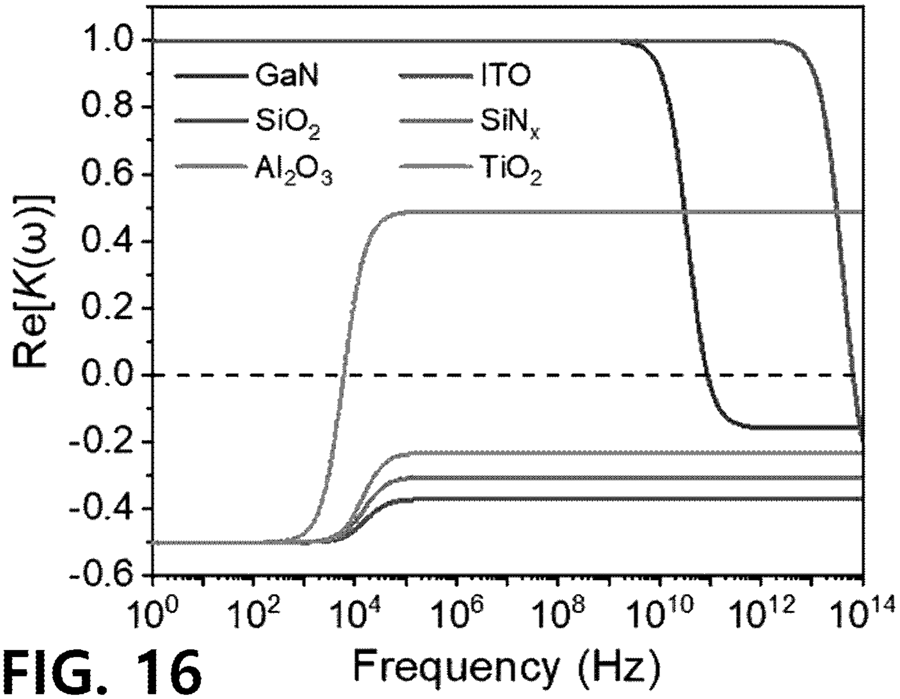
Figure 17A:
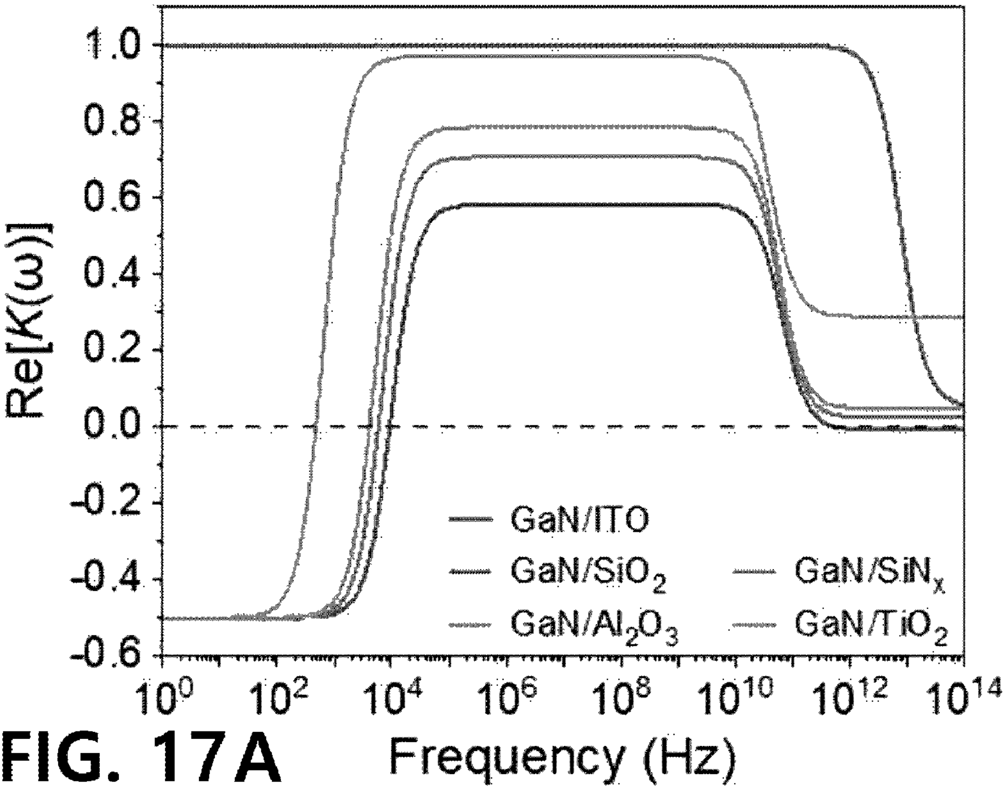
FIGS. 17A to 17D are graph illustrating the real number part values of values according to Mathematical Formula 1 for each frequency of an electrical field formed when spherical core-shell particles with a rotation inducing film formed of each material as illustrated with a thickness of 30 nm on the surface of a GaN core with a radius of 400 nm are placed in solvents with changing dielectric constants of 10, 15, 20.7 and 28, respectively.
Figure 17B:
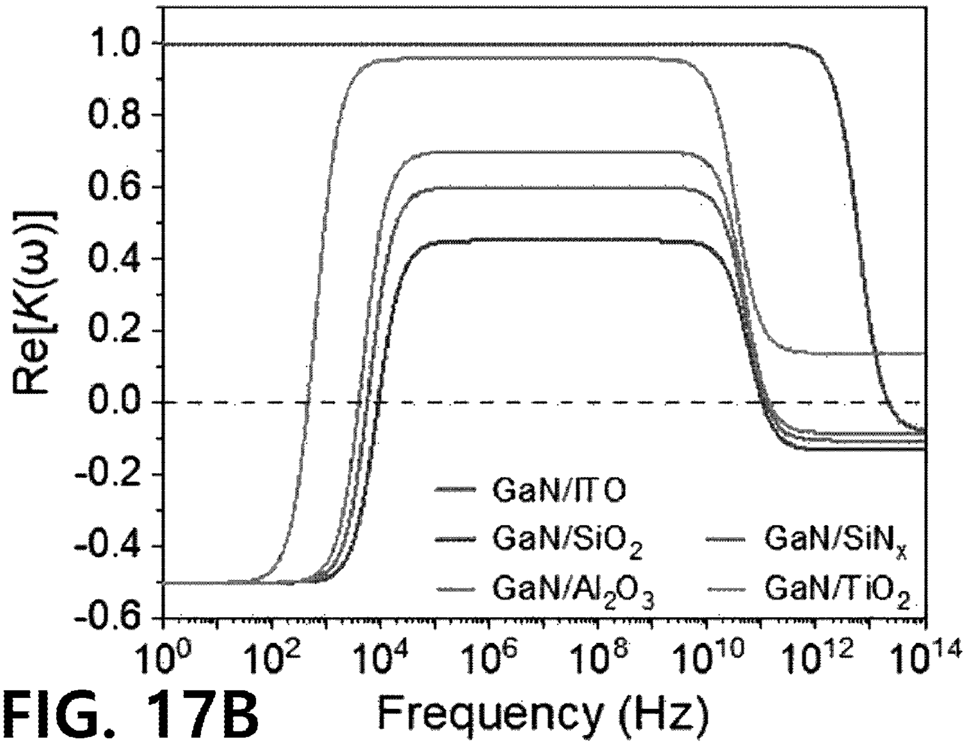
Figure 17C:
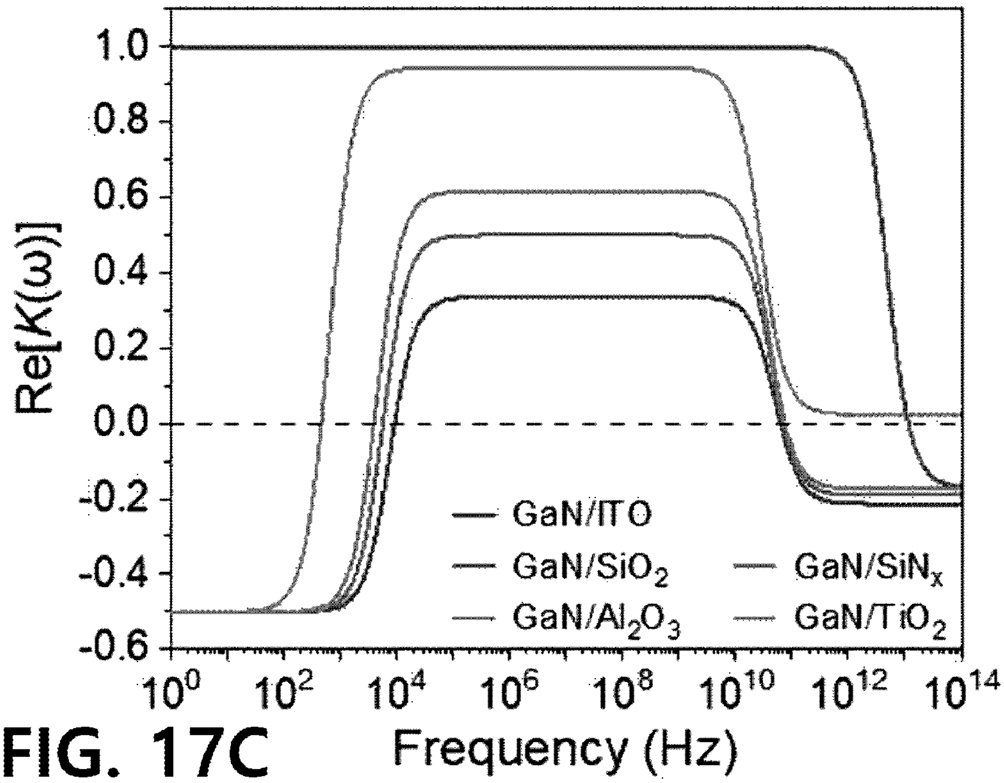
Figure 17D:
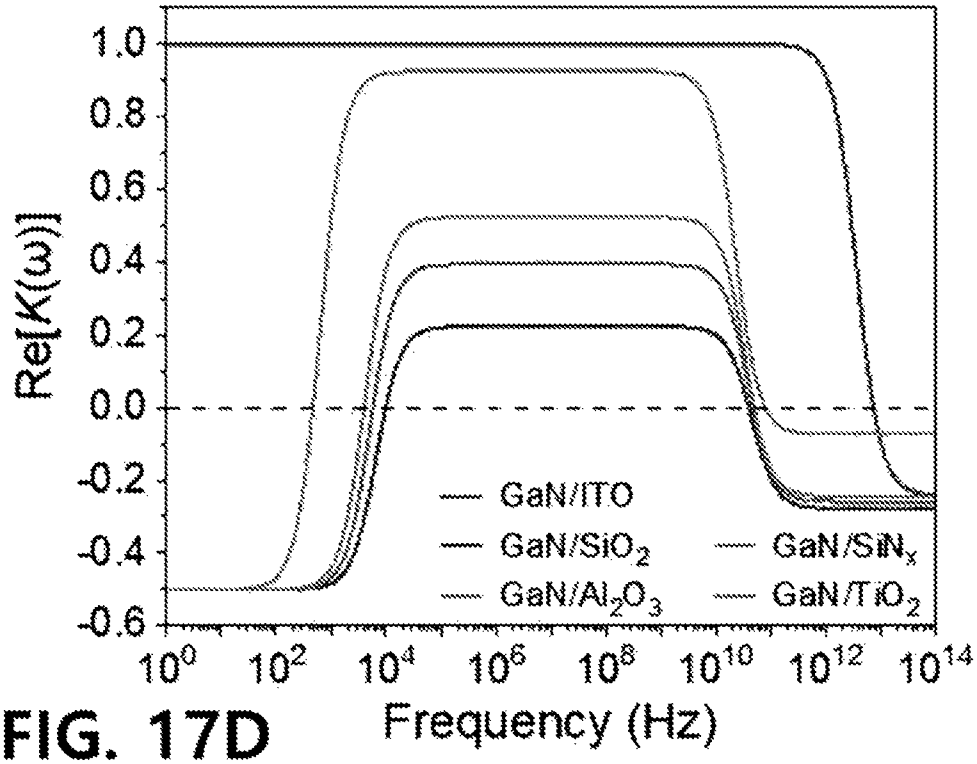

In addition, referring to FIGS. 15 and 16, assuming that the material that can be included in the ultra-thin LED elements 100, 101, 102 placed in acetone and isopropyl alcohol (IPA), respectively, as examples of solvents is a single particle, Re[K(ω)]'s frequency dependence generally has a positive dielectrophoresis (pDEP) value over a wide frequency range in the case of ITO and GaN, but on the contrary, in the case of $TiO_2$, it has a negative value at low frequencies and a positive value at high frequencies. In addition, particles that are made of materials such as $SiO_2$, $SiN_x$, $Al_2O$ and the like have negative dielectrophoresis (nDEP) values regardless of frequency. Therefore, GaN particles, ITO particles or TiO2 particles have a directionality in which they are attracted toward or away from a strong electric field depending on the frequency. In addition, particles that are made of materials such as $SiO_2$, $SiN_x$, $Al_2O$ and the like always move away from a strong electric field regardless of the type of medium, such as acetone or IPA, and the frequency of the applied power.

Therefore, also for the dielectrophoretic force applied to the ultra-thin LED elements, the sign (positive/negative) of the Re[K(ω)] values and the level of values thereof acting on each surface of the ultra-thin LED elements, which are determined by the dielectric constant and electrical conductivity of the materials that constitute the ultra-thin LED elements and the solvent, which is the medium in which the ultra-thin LED elements are placed, and the frequency of the applied power may be adjusted to control the movement such that the surface of the desired element is selectively positioned on the first electrodes 211, 212. However, the ultra-thin LED elements are not a single element made of one type of material, and therefore, it is almost impossible to predict the movement of the ultra-thin LED elements in which the layers of various materials are stacked by using experimental results assuming a single material, such as those shown in FIGS. 15 and 16.

Accordingly, the inventor of the present invention assumed that the spherical particles were not particles of a single material, but particles of a core-shell structure with different electrical conductivity coefficients and dielectric constants for each layer, and considered the particles as particles of a core-shell structure in Mathematical Formula 1. In addition, the complex permittivity of the core-shell structure particle was derived through Mathematical Formula 2 below, and the values of Mathematical Formula 1 were calculated by using the same to determine the dielectrophoretic force and moving direction according to the dielectric constant of the solvent as a medium and the frequency of the applied power.

[Mathematical Formula 2]

$$\varepsilon_p^* = \varepsilon_2^* \frac{\left(\frac{R_2}{R_1}\right)^3 + 2\left(\frac{\varepsilon_1^* - \varepsilon_2^*}{\varepsilon_1^* + 2\varepsilon_2^*}\right)}{\left(\frac{R_2}{R_1}\right)^3 - \left(\frac{\varepsilon_1^* - \varepsilon_2^*}{\varepsilon_1^* + 2\varepsilon_2^*}\right)}$$

In Mathematical Formula 2, $R_1$ is the radius of the core part, $R_2$ is the radius of the core-shell particle, and ε1* and ε2* are the complex dielectric constants of the core part and the shell part, respectively.

When it is described with reference to FIGS. 17*a* to 17*d*, FIGS. 17*a* to 17*d* show the real number part of values according to Mathematical Formula 1 by the dielectric constant of solvent for spherical core-shell particles with a radius of 430 nm, which are implemented by fixing the core part to GaN with a radius of 400 nm and changing the shell part to ITO, $SiO_2$, $SiN_x$, $Al_2O_3$ and $TiO_2$ with a thickness of 30 nm each, and the frequency of the applied power. Specifically, as confirmed in FIG. 15 and FIG. 16, GaN and ITO respectively have positive dielectrophoresis (pDEP) values approaching 1 up to a fairly large high frequency band when they are single particles, and FIGS. 17*a* to 17*d* show that particles with a core-shell structure in which ITO is placed as the shell part on GaN, which is the core part, still have a large positive dielectrophoresis (pDEP) value close to 1. Additionally, in the case of core-shell structure particles in which $TiO_2$ is placed as the shell part on GaN, which is the core part, it is affected by GaN, which has a large positive dielectrophoresis value when it is a single particle, and they move so as to have a larger positive dielectrophoresis (pDEP) value than when $TiO_2$ is a single particle, and it can be seen that the frequency band with positive dielectrophoresis (pDEP) values is reduced compared to that for $TiO_2$ single particles. On the other hand, in the case of $SiO_2$, $SiN_x$ and $Al_2O_3$ which respectively have negative dielectrophoresis (nDEP) values in single particles, the core-shell structure particles arranged as the shell of the GaN core part are affected by the large positive dielectrophoresis (pDEP) value of GaN, and thus, it is changed to a positive dielectrophoresis value in some frequency ranges such that GaN has a positive dielectrophoresis (pDEP) value, more preferably, a positive dielectrophoresis (pDEP) value of 1.0, and for example, a frequency range below 10 GHz. pDEP) value. Therefore, when these results are summarized, when a Group III-nitride compound, for example, any material layer is provided as the outermost layer in GaN LED elements, it has a frequency band with a positive dielectrophoresis (pDEP) value, although there is a difference in size.

Through these results, the electrical conductivity coefficient and dielectric constant characteristics of the layers (or surfaces) that constitute the ultra-thin LED elements are adjusted materially and/or structurally, and by adjusting the frequency of power and the power applied in the self-alignment step through dielectrophoresis in accordance with the material/structural characteristics to be adjusted, the ultra-thin LED elements are guided toward the first electrodes 211, 212. Furthermore, the first surface (B) or second surface (T) of the elements is directed toward the upper surface of the first electrodes 211, 212, thereby implementing a mounting form which is in contact with the upper surfaces of the first electrodes 211, 212.

However, with only the above-described conductive semiconductor layers 10, 30 and the photoactive layer 20, among the various surfaces of the ultra-thin LED elements, the first surface (B) or the second surface (T) may be predominantly attracted to the upper surfaces of the first electrodes 211, 212, thereby making it difficult to contact the same. Accordingly, the ultra-thin LED elements may be constituted to have different materials and/or structures that constitute the elements depending on the location within the elements.

For example, as illustrated in FIG. 5, the ultra-thin LED element 100 may have a structure containing a plurality of pores in a region 12 extending from the first surface (B) of the first conductive semiconductor layer (10) corresponding to the lowest layer having the first surface (B) to a predetermined thickness, and the structure containing the plurality of pores (P) may have much lower dielectric properties and electrical conductivity due to the air contained in the pores (P), and as a result, the materials and structures may be different from the second conductive semiconductor layer 30, which corresponds to the uppermost layer having the second surface (T).

Figure 6:
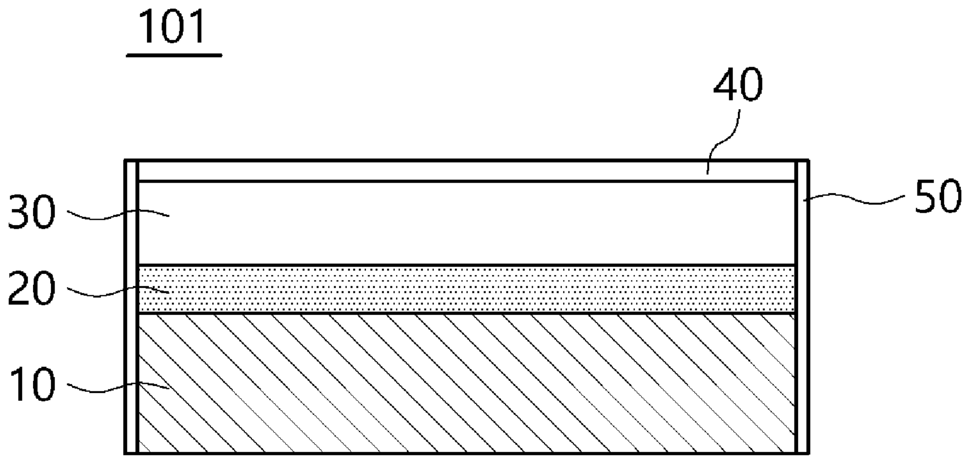
FIGS. 6 and 7 are cross-sectional views perpendicular to the longitudinal direction of ultra-thin LED elements according to various exemplary embodiments that can be employed in a transparent ultra-thin LED display according to an exemplary embodiment of the present invention.
Figure 7:
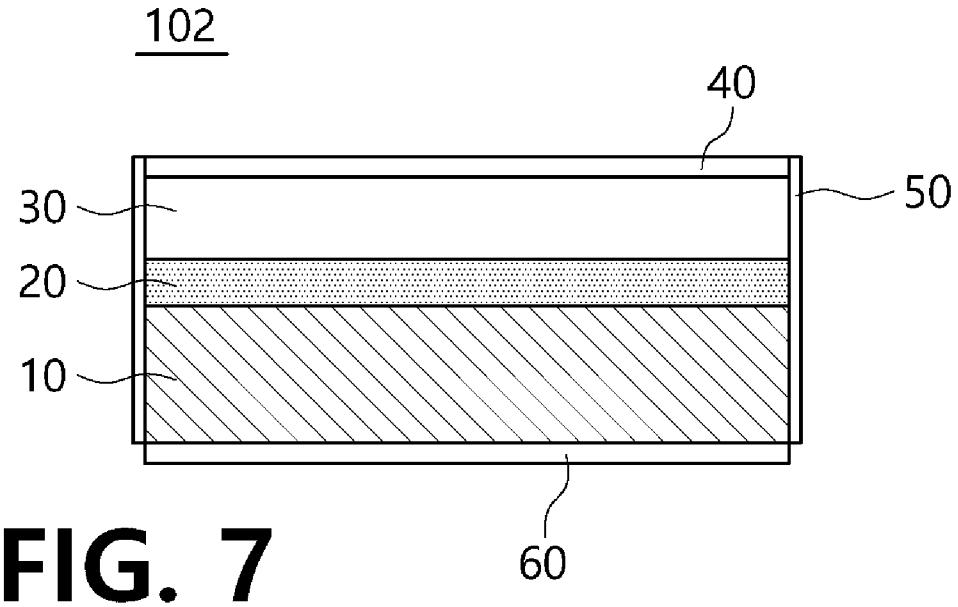

Alternatively, as illustrated in FIGS. 6 and 7, the ultra-thin LED elements 101, 102 may be composed of a material in which the lowest layer with one surface (B) and the uppermost layer with the second surface (T) are different from each other in at least any one of the electrical conductivity coefficient and dielectric constant. Preferably, the electrical conductivity coefficients may be different, and for example, the electrical conductivity coefficient of the uppermost layer having the second surface (T) may be greater than the electrical conductivity coefficient of the lowest layer having the first surface (B). More preferably, the electrical conductivity coefficient of the uppermost layer may be 10 times or more, and more preferably, 100 times or more than the electrical conductivity coefficient of the lowest layer, which may be advantageous in achieving a further increased selective mounting ratio.

Specifically, in addition to the first conductive semiconductor layer 10, the photoactive layer 20 and the second conductive semiconductor layer 30, the ultra-thin LED elements 101, 102 may include a selective alignment directing layer 40 or a selective alignment rejecting layer 60 as the uppermost layer having a second surface (T) or the lowermost layer having a first surface (B) of the ultra-thin LED elements 101, 102 by disposing above or below the second conductive semiconductor layer 30 or the first conductive semiconductor layer 10.

The selective alignment directing layer 40 may be a material with higher electrical conductivity compared to the first conductive semiconductor layer 10, and it may be an electrode layer as a specific example. The electrode layer may be used without limitation in the case of a conventional electrode layer provided in an LED device. In this regard, as non-limiting examples, Cr, Ti, Al, Au, Ni, ZnO, AZO, ITO and oxides or alloys thereof may be used alone or as a mixed material. However, preferably, in order to increase the selective mounting ratio in which the second surface (T) is in contact with the upper surface of the mounting electrode compared to other electrode layer materials, the electrical conductivity coefficient of the selective alignment direction layer 40 may be 10 times or more, and more preferably, 100 times or more than the electrical conductivity of the first conductive semiconductor layer 10, and through this, it may be advantageous in achieving a further increased selective mounting ratio In addition, when the selective alignment directing layer is an electrode layer, the thickness may be 10 to 500 nm, but the present invention is not limited thereto.

Alternatively, the selective alignment directing layer 60 may be a material with lower electrical conductivity compared to the second conductive semiconductor layer 30, and for example, it may be an electron delay layer with an electron delay function. That is, in the ultra-thin LED element 102, the thickness in the stacking direction of each layer is implemented to be smaller than the length, and accordingly, the thickness of the n-type GaN layer is bound to be relatively thin. In contrast, since the movement speed of electrons is greater than the movement speed of holes, the light-emitting efficiency may be reduced because the bonding location of electrons and holes is not on the photoactive layer 20 but on the second conductive semiconductor layer 30. In addition, the selective alignment directing layer 60, which is an electron delay layer, prevents a decrease in the light-emitting efficiency by balancing the number of recombined holes and electrons in the photoactive layer 20, and it may selectively increase the probability that the second surface (T) of several surfaces contacts the electrodes 211, 212. Preferably, the electrical conductivity coefficient of the uppermost layer, for example, the second conductive semiconductor layer 30, may be 10 times or more, and more preferably, 100 times or more, than the electrical conductivity coefficient of the selective alignment directing layer 60, and through this, it may be advantageous to achieve a further improved selective mounting ratio in which the second conductive semiconductor layer 30 is in contact with the upper surfaces of the first electrodes 211, 212.

For example, the electron delay layer may contain at least one selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, poly(paraphenylene vinylene) and a derivative thereof, polyaniline, poly(3-alkylthiophene) and poly(paraphenylene). Alternatively, assuming that the first conductive semiconductor layer 10 is a doped n-type III-nitride semiconductor layer, the electronic delay layer may be constituted by a III-nitride semiconductor whose doping concentration is lower than that of the first conductive semiconductor layer 10. In addition, the thickness of the electronic delay layer may be 1 to 100 nm, but the present invention is not limited thereto, and it may be appropriately changed in consideration of the material of the n-type conductive semiconductor layer, the material of the electronic delay layer and the like.

A rotation inducing film surrounding the outermost surface of the ultra-thin LED elements 100, 101, 102 may be further provided to generate a rotational torque (Tx) based on a virtual rotation axis that passes through the center of the element in the d1 direction, which is the long axis of the ultra-thin LED element. In FIG. 5 to 7, the protective film 50 is illustrated as surrounding the side surfaces of the ultra-thin LED elements 100, 101, 102, but a rotation inducing film may be provided instead of the protective film 50 or as the outermost film on the protective film 50.

The rotation inducing film generates a rotational torque ($T_x$) based on a virtual rotation axis passing through the center of the element in the d1 axis direction, which is the long axis of the ultra-thin LED element, under the electric field formed in the first electrodes 211, 212 to which power is applied. Through this, the mounting surface may be controlled such that any one specific one of the first surface (B) and the second surface (T) of the ultra-thin LED element, for example, the second surface (T) is selectively directed toward the upper surfaces of the first electrodes 211, 212.

The rotation inducing film is assumed to be a spherical core-shell particle composed of GaN as the core part and the rotation inducing film as the shell part in Mathematical Formula 1 described above, and considering the dielectric constant of the solvent, it may be formed of a material that satisfies that the real number part of the K(ω) value calculated according to Mathematical Formula 1 in at least part of the frequency range within the range, where the frequency of the applied power is 10 GHz or less, is greater than 0 and 0.72 or less, and more preferably, greater than 0 and 0.62 or less (refer to FIGS. 17*a* to 17*d*).

Figure 18:
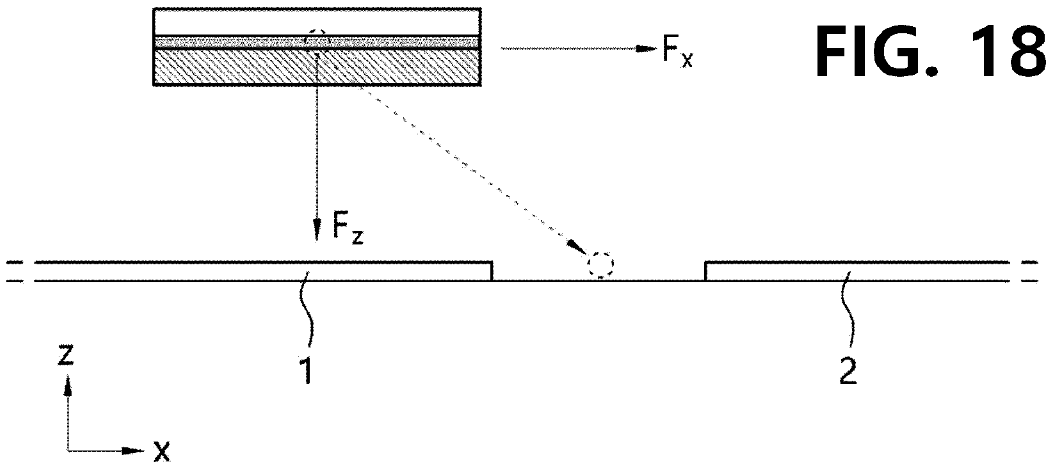
FIGS. 18 and 19 are diagrams illustrating the movement of ultra-thin LED elements placed in a medium above the first electrode where an electric field is formed when they are mounted on the first electrode through a dielectrophoretic force.
Figure 19:
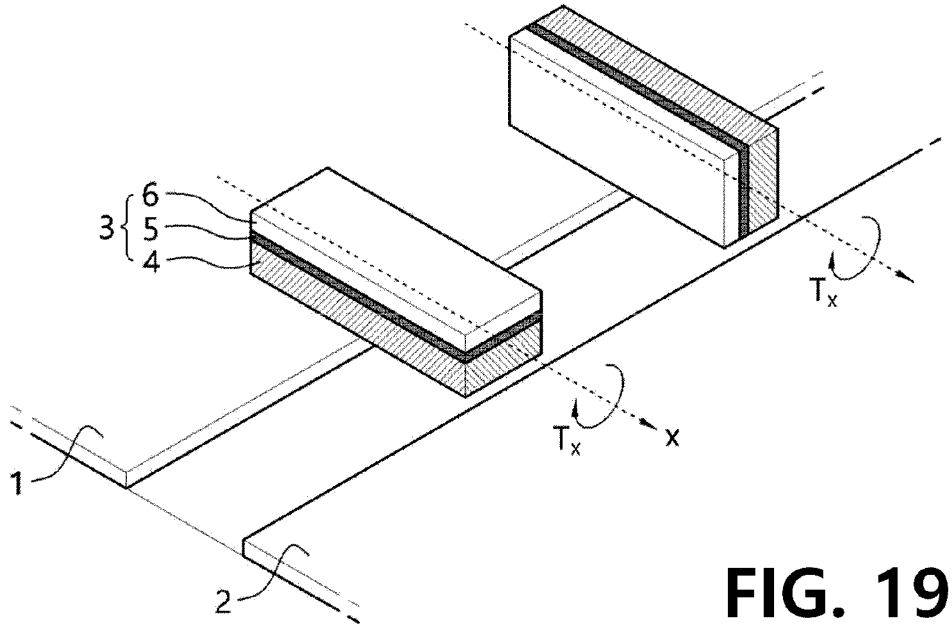

When it is described with reference to FIGS. 18 and 19, the ultra-thin LED element 3 has a positive value of Re[K(ω)] in Mathematical Formula 3 as described above such that it may be attracted toward the high magnetic field formed by the power applied to the first electrodes 1, 2. In this case, the rotation inducing film generates a rotational torque (Tx) based on the virtual x-axis that passes through the center of the ultra-thin LED element (3) such that it rotates the selected one surface of the first surface (B) or the second surface (T), and for example, the second surface (T) faces the upper surfaces of the first electrode 1, 2. Therefore, it increases the drivable mounting ratio in which the first surface (B) or second surface (T) of the ultra-thin LED element 3 is mounted to be in contact with the upper surfaces of the first electrode 1, 2. Furthermore, the selective mounting ratio, in which a specific one surface of the first surface (B) and second surface (T) of the ultra-thin LED element (3) is mounted to be in contact with the upper surfaces of the first electrodes 1, 2 may be further increased.

In addition, the rotation inducing film is a core part in which the lowest layer having the first surface (B) is GaN, and the real number part of the K(ω) value according to Mathematical Formula 1 for spherical core-shell particles, in which the rotation inducing film is disposed as a shell part, has a positive number exceeding 0. Therefore, without interfering with the movement of the ultra-thin LED elements 100, 101, 102 toward the first electrodes 211, 212, the material of the rotation inducing film having a value of 0.072 or less is selected, and through this, among all ultra-thin LED elements 100, 101, 102, the drivable mounting ratio to be mounted such that it can be driven (light emitting) and the selective mounting ratio to be arranged such that a specific one surface of the first surface (B) and the second surface (T) is in contact with the mounting electrode surface may be improved significantly. If the real number part of the K(ω) value according to Mathematical Formula 1 is 0 or a negative number, or the rotation inducing film exceeding 0.72 is provided on the side surface of the ultra-thin LED element, the driveable mounting ratio and the selective mounting ratio where a specific one surface of the first surface (B) and the second surface (T) becomes the mounting surface (or contact surface) among the ultra-thin LED elements that are mounted are reduced, and particularly, the selective mounting ratio may be greatly reduced.

In addition, the ultra-thin LED elements 100, 101, 102 have differences in electrical conductivity and/or dielectric constant depending on material and/or structural adjustment between the lowest layer having the first surface (B) and the uppermost layer having the second surface (T), and at the same time, by providing a rotation inducing film 50 on the side surface where the real number part of the K(ω) value is greater than 0 and 0.72 or less, the drivable mounting ratio and selective mounting ratio of ultra-thin LED elements may be further increased in step (2), which will be described below (refer to Table 2).

Figure 20:
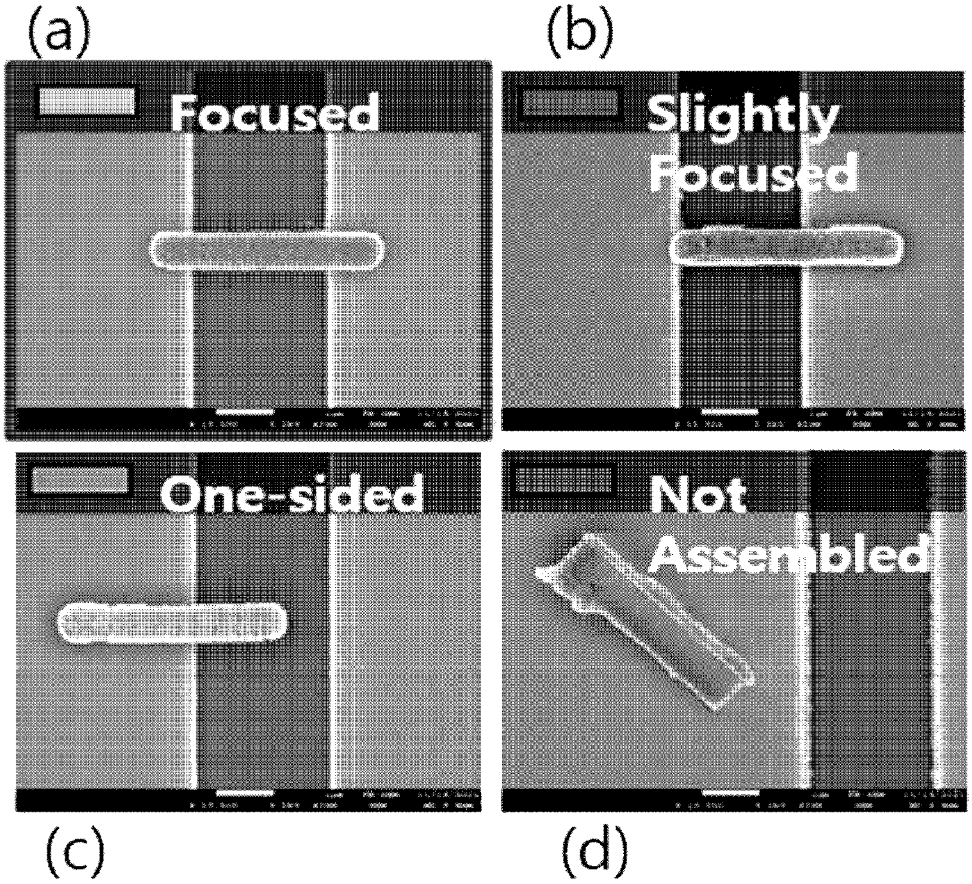
FIG. 20 is a scanning electron microscope (SEM) photograph of various mounting appearances after the ultra-thin LED elements included in an exemplary embodiment of the present invention are mounted on a lower electrode line through dielectrophoresis.

Meanwhile, when the ultra-thin LED element is provided with a rotation inducing film that satisfies the real number part of the K(ω) value according to Mathematical Formula 1 under the conditions described above, it increases the drivable mounting ratio of ultra-thin LED elements and the selective mounting ratio in which a specific one surface of the first side (B) and the second side (T) is selectively contacted. At the same time, after self-alignment on the first electrodes 211, 212, when the second electrode 301 is formed above the self-aligned ultra-thin LED elements, it exhibits an effect of increasing the non-defective mounting ratio, which is a mounting ratio of ultra-thin LED elements that are capable of implementing a non-defective ultra-thin LED electrode assembly. Specifically, when it is described with reference to FIG. 20, even when the first surface (B) or the second surface (T) is aligned to contact the first electrodes 211, 212, it may be shown as a mounting appearance according to FIG. 20(*a*) where each end of the ultra-thin LED elements is mounted on the adjacent first electrode 211, 212 surface with a similar contact area, a mounting appearance according to FIG. 20(*b*) where each end is located on the adjacent first electrode 211, 212 surface but is mounted with a bias toward any one side, or a mounting appearance according to FIG. 20(*c*) which is arranged to contact only the surface of any one of the adjacent first electrodes 211, 212. In order for the second electrode 301 to be formed while smoothly contacting the upper surface of the ultra-thin LED element, it may be advantageous to have mounting appearances as illustrated in FIGS. 20(*a*) and 20(*b*). However, for ultra-thin LED elements that are provided with a rotation inducing film whose real number part of the K(ω) value exceeds 0 and 0.62 or less, the ratio of elements mounted in the form illustrated in FIG. 20(*c*) may be increase significantly compared to ultra-thin LED elements that are not, and it may not be preferable to implement a non-defective ultra-thin LED electrode assembly. Additionally, when the second electrode 301 is not formed properly, contact resistance may increase, and thus, there is a concern that the luminance of the subpixel areas that are provided with such an ultra-thin LED electrode assembly may decrease.

As described above, the electrical conductivity coefficient and dielectric constant characteristics of the layers (or surfaces) constituting the ultra-thin LED elements may be adjusted materially and/or structurally, and the ultra-thin LED elements are attracted toward the first electrodes 211, 212 by adjusting the frequency of power and the power applied in the self-alignment step through dielectrophoresis corresponding to the adjusted material/structural characteristics. Furthermore, a mounting type in which the first surface (B) or second surface (T) of the elements is facing the upper surface of the first electrodes 211, 212 and contacts the upper surfaces of the first electrodes 211, 212 is implemented, and therefore, the ultra-thin LED electrode assembly provided in each subpixel area may satisfy a drivable mounting ratio of 70% or more, more preferably, 75% or more, and even more preferably, 80% or more, 90% or more, or 95% or more. Through this, by minimizing cases where the introduced ultra-thin LED elements are not mounted or are mounted on the side surface, the implemented display may achieve excellent brightness and reduce manufacturing costs by reducing the number of wasted ultra-thin LED elements.

In addition, the ultra-thin LED electrode assembly may be constituted such that the selective mounting ratio, which is a ratio in which the mounted ultra-thin LED elements are selectively mounted on any one surface of the first surface (B) or the second surface (T), satisfies 70% or more, more preferably, 85% or more, and even more preferably, 90% or more, and still more preferably, 93% or more. Through this, it is possible to increase the driving rate and luminance of mounted ultra-thin LED elements, and particularly, since the driving power may be converted to direct current rather than alternating current, transparent displays may implement increased luminance.

In addition, by providing ultra-thin LED elements with a selective alignment directing layer 40 on the second surface and a rotation inducing film on the side surface, the second surface (T) among the first surface (B) and the second surface (T) of the ultra-thin LED elements may be in contact with the first electrodes 211, 212, and since the p-type semiconductor may be positioned to be adjacent to the first electrodes 211, 212 and the second surface (T), it is possible to improve the light-emitting efficiency. In addition, furthermore, since contact resistance may be lowered through ohmic contact between the second surface (T) of the ultra-thin LED element and the first electrodes 211, 212, it is possible to further improve the light-emitting efficiency.

The ohmic contact may be performed through a known method that is performed on the electrode on which the LED device is mounted. For example, the ohmic contact may be performed on an interface between the first electrodes 211,

212 and the ultra-thin LED elements through the rapid thermal annealing (RTA) process.

In addition, after the ultra-thin LED elements are self-aligned on the first electrodes 211, 212 provided with a fixed layer having a low melting point, heat is applied to melt and solidify the fixed layer, thereby firmly fixing the ultra-thin LED elements on the first electrodes 211, 212, and thus, it is possible to maintain ohmic contact. For example, the fixed layer may be a conventional solder material used as electrical and electronic materials.

Additionally, in order to improve electrical connectivity between the ultra-thin LED elements and the first electrodes 211, 212, the step of forming a metal layer for conducting electricity may be further performed. The conductive metal layer may be manufactured by applying a photolithography process using a photosensitive material to pattern a line on which the conductive metal layer is to be deposited and then depositing the conductive metal layer, or by patterning the deposited metal layer and then etching the same. This process may be performed by appropriately employing known methods, and Korean Patent Application No. 10-2016-0181410 by the inventors of the present invention may be incorporated herein by reference.

In addition, even when the ultra-thin LED elements 100, 101, 102 provided in the ultra-thin LED electrode assembly are mounted such that any one surface contacts the upper surfaces of the first electrode 211, 212, they may not always be mounted to be drivable. When it is described with reference to FIG. 9, the long-axis end of the ultra-thin LED element 3 is self-aligned through dielectrophoresis such that it contacts each of the two adjacent first electrodes 1, 2, and the stacking direction of the layers 4, 5, 6 constituting the ultra-thin LED element 3 and the long axis direction of the element become perpendicular to each other. Accordingly, the mounting appearances of the ultra-thin LED element 3 mounted on the two first electrodes 1, 2 are divided into cases where the first conductive semiconductor layer 4 or the second conductive semiconductor layer 6 facing in the thickness direction of the ultra-thin LED element 3 is in contact with the surfaces of the two first electrodes 1, 2 or the surface of the LED element 3. Among the mounting appearances thereof, when the side surface of the ultra-thin LED element 3 is mounted such that it contacts the two first electrodes 1, 2, the first conductive semiconductor layer 4, the photoactive layer 5 and the second conductive semiconductor layer 6 all come into contact with the first electrodes 1, 2. Accordingly, when driving power is applied to the second electrode (not illustrated) and the first electrodes 1, 2, they fail to emit light (drive) and even cause an electrical short circuit.

Meanwhile, the case where an electrical short circuit occurs as explained above is when the width perpendicular to the length in the long-axis direction of the ultra-thin LED element is equal to or greater than the thickness. Among these, when the same case is explained as an example, when the ultra-thin LED electrode assembly is viewed from the side surface, in the case of an ultra-thin LED element whose side surface is mounted on the upper surface of the first electrode, the height from the upper surface of the first electrode to the opposite surface facing the mounting surface of the ultra-thin LED element may be the same as that of the ultra-thin LED element mounted to be able to be driven. In this case, the ultra-thin LED element mounted such that the side surface of the element where the photoactive layer is exposed is in contact with the upper surface of the first electrode also comes into electrical contact with the second electrode, and as a result, there is a concern that an electrical leakage or electrical short circuit may occur.

As such, according to an exemplary embodiment of the present invention, the width of the ultra-thin LED element 101 may be smaller than the thickness, and through this, the side surface of the element where the photoactive layer is exposed, which may occur just in case, is in contact with the first electrode to prevent an electrical short circuit or leakage. When it is described with reference to FIG. 10, even when the side surfaces of the element are mounted to be in contact, such as the ultra-thin LED elements 101 in contact with the first electrode 211, 212 located on the right side of the 4 first electrodes 211, 212, the width (W) is smaller than the thickness (t) of the ultra-thin LED element 101, and thus, there is no concern that the ultra-thin LED element in contact with the side surface of the element comes into contact with the second electrode 301. As a result, when driving power is applied, it is possible to prevent an electrical short circuit or leakage that may occur due to the ultra-thin LED element 101 on the right side.

In addition, the first layer area (L1) may be provided with a partition wall 250 for surrounding the outer perimeter of the ultra-thin LED electrode assembly described above at a predetermined height. The partition wall may be formed of an insulating material so as not to have an electrical effect when driving the ultra-thin LED element in the final ultra-thin LED electrode assembly implemented by mounting the ultra-thin LED element 101. In addition, preferably, for the insulating material, at least any one of inorganic insulating materials such as silicon dioxide ($SiO_2$), silicon nitride ($SiN_x$), aluminum oxide ($Al_2O_3$), hafnium oxide ($HfO_2$), yttrium oxide ($Y_2O_3$), and titanium dioxide (TiO2), and various transparent polymer insulating materials may be used.

In addition, the first layer area (L1) may further include a passivation layer 260 which fills a space between the ultra-thin LED electrode assembly and the partition wall 250 and flattens the upper portion of the ultra-thin LED electrode assembly. The passivation layer 260 prevents electrical contact between the first and second electrodes 211, 212 and the second electrode 301 facing each other in the vertical direction, and serves a function of making the implementation of the second electrode 301 easier. The passivation layer 260 may be used without limitation as long as it is a passivation material commonly used in electrical and electronic components and has excellent light transmittance. For example, the passivation layer 260 may be formed of a passivation material such as $SiO_2$, $SiN_x$, AlN, GaN, $Al_2O$, $HfO_2$ and $ZrO_2$, and the present invention does not particularly limit the same.

The transparent ultra-thin LED display according to an exemplary embodiment of the present invention is implemented as two types of displays depending on the method of implementing the colors of images. As an example, all ultra-thin LED elements emit a specific color, specifically blue, and colors, for example, R, G and B, may be implemented through a color-by-blue display that is implemented through a color conversion layer including a phosphor excited by light having a specific light color emitted from the ultra-thin LED element, and an R, G and B display in which R, G and B themselves are directly implemented through ultra-thin LED elements.

Depending on this color implementation method, the light colors of the ultra-thin LED elements provided in the ultra-thin LED electrode assembly and the presence or absence of a color conversion layer may be changed.

First of all, when the color-by-blue display form corresponding to the first embodiment is described, the ultra-thin LED electrode assembly may be provided with ultra-thin LED elements of substantially the same light color. The substantially same light color does not mean that the wavelength of the emitted light is completely the same, but generally refers to light belonging to a wavelength range that can be referred to as the same light color. For example, when the light color is blue, all ultra-thin LED elements that emit light belonging to the wavelength range of 420 to 470 nm may be considered to emit substantially the same light color. The light color emitted by the ultra-thin LED element provided in the display according to the first embodiment of the present invention may be, for example, blue, white or UV.

In addition, when it is described with reference to FIG. 11, the display according to the first embodiment may be provided with a color conversion layer 400 that is capable of converting blue, which is the light color emitted on the first layer area (L1), into green and red light, which are other light colors, above the second electrode 301 corresponding to the subpixel areas ($SP_R$, $SP_G$) in order to implement colors. Preferably, in order to further increase color purity and improve color reproducibility, improve the front light-emitting efficiency of light converted from the color conversion layer to the front, for example, green/red, a short-wavelength transmission filter (not illustrated) may be disposed above the first layer area (L1), and a red color conversion unit 411 and a green color conversion unit 412 may be disposed above the short-wavelength transmission filter corresponding to the subpixel areas ($SP_R$, $SP_G$) designated to emit green and red colors, respectively. Meanwhile, when the ultra-thin LED elements provided in the display according to the first embodiment emit a third light color such as UV instead of blue, green and red, it will be apparent that the color conversion layer provided differently from FIG. 11 will include a blue color conversion unit to implement all R, G and B, and if necessary, it is noted that a color conversion unit for a third color other than these 3 colors, for example, a yellow color conversion unit, may be further provided.

In addition, considering the wavelength of light emitted by the ultra-thin LED element 101 provided in the subpixel area, the color conversion unit provided in the color conversion layer 400 may be a known color conversion unit that converts the light passing through the color conversion unit into blue, green and red, or other third colors, and thus, the present invention does not particularly limit the same.

Meanwhile, when it is described specifically based on the case where the ultra-thin LED element 101 is an LED element that emits blue light, a short-wavelength transmission filter may be disposed above the second electrode 301, or if the plane on which the second electrode 301 is formed is not flat, after further forming a planarization layer (not illustrated) to flatten the plane on which the second electrode 301 is formed, a short-wavelength transmission filter may be disposed above the planarization layer. The short-wavelength transmission filter may be a multilayer film made by repeating thin films of high-refractive/low-refractive materials, and the composition of the multilayer film may be $[(0.125)SiO_2/(0.25)TiO_2/(0.125)SiO_2]_m$ (m=number of repeating layers, m is 5 or more) in order to transmit blue and reflect light colors with a longer wavelength than blue. In addition, the thickness of the short-wavelength transmission filter may be 0.5 to 10 μm, but the present invention is not limited thereto. The method of forming the short-wavelength transmission filter may be any one method of e-beam, sputtering and atomic deposition, but the present invention is not limited thereto.

Next, a color conversion layer 400 may be formed on the short-wavelength transmission filter, and specifically, for the color conversion layer 400, a green color conversion unit 412 may be patterned on a short-wavelength transmission filter corresponding to some selected subpixel areas ($SP_G$) that are determined to be green among the subpixel areas ($SP_1$, $SP_2$, $SP_3$, $SP_n$), and a red color conversion unit 411 may be formed by patterning on a short wavelength transmission filter corresponding to some selected subpixel areas ($SP_R$) that are determined to be red among the remaining subpixel areas. The method of forming the patterning may be at least one method selected from the group consisting of screen printing, photolithography and dispensing. Meanwhile, the patterning order of the green color conversion unit 412 and the red color conversion unit 411 is not limited, and they may be formed simultaneously or in reverse order. In addition, the green color conversion unit 412 and the red color conversion unit 411 may include color conversion layers that are known in the display field, for example, color conversion materials such as phosphors and the like that can be excited by a color filter or blue LED element and converted into the desired light color, and known color conversion materials may be used.

For example, the green color conversion unit 412 has a fluorescent layer including a green fluorescent material, and specifically, it may include at least any one phosphor selected from the group consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce,Li, β-SiALON:Eu, $CaSc_{204}$:Ce, $Ca_3Sc_2Si_3O_{12}$:Ce, Caa-SiALON:Yb, Caα-SiALON:Eu, Liα-SiALON:Eu, $Ta_3Al_5O_{12}$:Ce, $Sr_2Si_5N_8$:Ce, $(Ca,Sr,Ba)Si_2O_2N_2$:Eu, $Ba_3Si_6O_{12}N_2$:Eu, γ-AlON:Mn and γ-AlON:Mn,Mg, but the present invention is not limited thereto. In addition, the green color conversion unit 412 has a fluorescent layer including a green quantum dot material, and specifically, it may include at least any one quantum dot selected from the group consisting of CdSe/ZnS, InP/ZnS, InP/GaP/ZnS, InP/ZnSe/ZnS and Peroviskite green nanocrystals, but the present invention is not limited thereto.

In addition, the red color conversion unit 411 may be a fluorescent layer containing a red fluorescent material, and specifically it may include at least any one phosphor selected from the group consisting of $(Sr,Ca)AlSiN_3$:Eu, $CaAlSiN_3$:Eu, (Sr,Ca)S:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce and $Sr_2Si_5N_8$:Eu, but the present invention is not limited thereto. In addition, the red color conversion unit 411 has a fluorescent layer including a red quantum dot material, and specifically, it may include at least one quantum dot selected from the group consisting of CdSe/ZnS, InP/ZnS, InP/GaP/ZnS, InP/ZnSe/ZnS and Peroviskite red nanocrystals, but the present invention is not limited thereto.

Additionally, in some subpixel areas, only the short-wavelength transmission filter is disposed on the uppermost layer, and the green color conversion unit 412 and the red color conversion unit 411 are not formed at the vertical top. In these areas, the light color emitted by the ultra-thin LED element, for example, blue light may be irradiated. On the other hand, some subpixel areas ($SP_G$) where the green color conversion unit 412 is formed on the upper portion of the short-wavelength transmission filter may emit green light through the green conversion unit 412. In addition, the remaining subpixel area ($SP_R$) may emit red light through the red color conversion unit 411 formed on the upper portion of the short-wavelength transmission filter, and through this, it is possible to implement a color-by-blue LED display.

In addition, preferably, a long-wavelength transmission filter (not illustrated) may be further disposed above the green color conversion unit 412 and the red color conversion unit 411, and the long-wavelength transmission filter functions as a filter to prevent color purity from deteriorating due to mixing of blue light emitted from the ultra-thin LED elements and color-converted green/red light. The long-wavelength transmission filter may be formed on part or the entire area of the color conversion layer 400, and preferably, it may be formed only above the green color conversion unit 412 and the red color conversion unit 411. In this case, the long-wavelength transmission filter that can be used may be a multilayer film made by repeating thin films of high-refractive/low-refractive materials that can achieve the purposes of long-wavelength transmission and short-wavelength reflection to reflect blue, and the composition may be $[(0.125)TiO_2/(0.25)SiO_2/(0.125)TiO_2]_m$ (m=number of repeating layers, m is 5 or more). In addition, the thickness of the long-wavelength transmission filter may be 0.5 to 10 μm, but the present invention is not limited thereto. The method of forming the long-wavelength transmission filter may be any one method of electron beam (e-beam), sputtering and atomic deposition, but the present invention is not limited thereto. Additionally, in order to form a long-wavelength transmission filter only above the green/red color conversion layer, a metal mask that can expose the green/red color conversion layers and mask the rest may be used to form a long-wavelength transmission filter only in the target area.

Meanwhile, after forming the color conversion units 411, 412, a protective layer 420 may be further provided to flatten the upper surface step caused by the color conversion units 411, 412 and protect the color conversion units 411, 412. Since the protective layer 420 can be formed by employing a suitable forming method in consideration of the material of the protective layer used in a conventional display provided with the color conversion layer 400, the present invention does not particularly limit the same.

Next, when the display according to the second embodiment in which ultra-thin LED elements implement colors by directly emitting specific light colors such as R, G and B is described, a plurality of subpixel areas ($SP_1$, $SP_2$, $SP_3$, $SP_n$) are predetermined to emit any one color among the colors to be implemented, such as R, G and B, and the ultra-thin LED electrode assembly may be disposed such that ultra-thin LED elements that emit a determined specific color are provided in each subpixel area ($SP_1$, $SP_2$, $SP_3$, $SP_n$). Ultra-thin LED elements that directly emit a color to be implemented, such as R, G or B, may be known in the light source and display fields, and the present invention does not particularly limit the same. In addition, it is noted that the colors provided on the display may be configured such that a third color other than R, G and B replaces any one or more of R, G and B, or a third color may be configured in addition to R, G and B.

In addition, the display according to the first embodiment described above or the display according to the second embodiment may further include a second substrate (not illustrated) on the first layer area (L1) or the color conversion layer 400. The second substrate may be a substrate that is conventionally provided in a display, and since it is the same as the description of the first substrate 1 described above, the detailed description thereof will be omitted.

The method for manufacturing the displays according to the above-described first and second embodiments will be described below.

After a second layer area (L2) including circuit elements and the like is formed on a substrate, the manufacture of the displays according to the first and second embodiments may be performed through the step of forming a first layer area (L1) in which the ultra-thin LED electrode assembly is disposed on the second layer area (L2). Alternatively, it is noted that in some cases, the first layer area (L1) may be formed first, and then, the second layer area (L2) may be formed on the first layer area.

Meanwhile, in the displays according to the first and second embodiments, the second layer area (L2) may be implemented by a known method in consideration of the driving method, which is employed in known displays, and thus, the present invention does not particularly limit the same, and the detailed description thereof will be omitted. Hereinafter, the manufacturing method for forming the first layer area (L1) will be described in detail.

First of all, when the manufacturing method of forming the first layer area (L1) in the display according to the first embodiment is described, the ultra-thin LED electrode assembly disposed in the first layer area (L1) may be manufactured by using a method of self-aligning ultra-thin LED elements 101 on the first electrodes 211, 212 through dielectrophoresis using an electric field formed by the assembly power applied to the first electrodes 211, 212. Specifically, the first layer area (L1) may be manufactured by including the steps of (1) introducing a solution including a plurality of ultra-thin LED elements 101 emitting substantially the same light color into a plurality of first electrodes 211, 212 that are formed and spaced apart from each other formed in a plurality of subpixel areas ($SP_1$, $SP_2$, $SP_3$, $SP_n$), (2) applying assembly power to the first electrodes 211, 212 to self-align the ultra-thin LED elements 101 introduced into each subpixel area ($SP_1$, $SP_2$, $SP_3$, $SP_n$) so as to come into contact with the upper surfaces of the two adjacent first electrodes 211, 212, and (3) forming a second electrode 301 on a plurality of self-aligned ultra-thin LED elements 101 to form an ultra-thin LED electrode assembly.

In steps (1) to (3) above, Korean Patent Application No. 10-2013-0080412 and Korean Patent Application No. 10-2021-0038999 by the inventors of the present invention, which implement displays by self-aligning LED elements through dielectrophoresis by using an electric field, are incorporated herein by reference, and the present invention does not specifically describe the content disclosed in the patent application documents referenced herein.

However, steps (1) to (3) will be explained in the following two cases, namely, a first manufacturing method of the ultra-thin LED electrode assembly according to FIGS. **8*a* and 8*b*** in terms of uniform alignment and concentrated arrangement of the ultra-thin LED elements, and a second manufacturing method of the ultra-thin LED electrode assembly in terms of converting the driving power of the ultra-thin LED electrode assembly into direct current power and selectively aligning the p-type semiconductor layer that is in contact with the first electrode.

First of all, the ultra-thin LED electrode assembly which is implemented in each subpixel area implemented through the first manufacturing method greatly improves the vertical mounting ratio in which the ultra-thin LED elements 101 introduced in the process have a mounting angle of 5° after self-alignment through the adjustment of dielectric properties between the used solvent and the alignment guide 220 formed on the first electrodes 211 and 212. Through this, alignment is improved, and the ultra-thin LED elements 101 may be concentrated and disposed on the first electrodes 211, 212 in a limited area. Accordingly, it may be more advantageous to improve the light-emitting area ratio, which is the area occupied by ultra-thin LED elements on the x-y plane within each subpixel area.

Specifically, step (1) according to the present invention may performed by including the steps of 1-1) forming an alignment guide 220 extending in the same direction as the extended longitudinal direction of the first electrodes 211, 212 with a narrower width on the upper surface of each of the plurality of first electrodes 211, 212 that are spaced apart from each other, and 1-2) introducing a solution including a plurality of ultra-thin LED elements 101A, 101B, 101C onto the first electrodes 211, 212.

First of all, in step 1-1), the step of forming an alignment guide 220 extending in the same direction as the extended longitudinal direction of the first electrodes 211, 212 with a narrower width on the upper surface of each of the plurality of first electrodes 211, 212 that are spaced apart from each other is performed.

The alignment guide 220 improves the alignment of the ultra-thin LED elements that are self-aligned in step (2), which will be described below, and allows mounting a large number of ultra-thin LED elements in the limited first electrode area where the ultra-thin LED elements can be mounted, and it has an advantage in that the luminance per unit area may be greatly increased through such concentrated mounting. In addition, the improvement of element alignment has the advantage of ensuring stable contact between the first electrode and both ends of the long axis direction of the ultra-thin LED elements, thereby facilitating the formation of the second electrode and enabling various designs of the second electrode.

The alignment guide 220 is formed on the upper surface along the first electrodes 211, 212 in the extending direction of each of the plurality of first electrodes 211, 212, and in this case, the width (w) of the formed alignment guide 220 is formed to be narrower than the width of the first electrodes 211, 212, thereby securing an electrode surface that the ultra-thin LED elements 101A, 101B, 101C can contact. To this end, preferably, it may be formed along the extending direction of the first electrodes 211, 212 with a predetermined width at the central portion in the width direction of the first electrodes 211, 212. Specifically, the upper surfaces of the first electrodes 211 and 212 are partitioned into three regions in the width direction, and an alignment guide 220 is formed in the central part corresponding to the middle region among the 3 regions. In addition, the upper surfaces of the first electrodes corresponding to both sides based on the alignment guide 220 may be contactable surfaces where the ultra-thin LED elements 101A, 101B, 101C can contact. In addition, the width (w) of the alignment guide 220 may preferably be less than ½ of the width of the first electrode, and through this, it may be advantageous to secure a contactable area of the upper surfaces of the first electrodes 211, 212 that can sufficiently contact the ends of the ultra-thin LED elements 101A, 101B, 101C.

In addition, the height (h) of the alignment guide 220 may be less than or equal to the length in the z-axis direction corresponding to the thickness of the ultra-thin LED elements 101A, 101B, 101C. If the height of the alignment guide 220 is greater than the thickness of the ultra-thin LED element, it may not be easy to form the second electrode 301 above the ultra-thin LED elements 101A, 101B, 101C that are mounted in step (3), which will be described below.

In addition, the alignment guide 220 may be formed through a known method in which an alignment guide forming material having a predetermined dielectric constant can be formed to a predetermined width and height on the upper surfaces of each first electrode 211, 212. For example, after coating or deposition by using a known method, it may be manufactured through a patterning and etching process to have a narrower width than the upper surface of the first electrode. Specifically, when the alignment guide forming material is an inorganic material, the alignment guide may be formed by any one method of chemical vapor deposition, atomic layer deposition, vacuum deposition, e-beam deposition and spin coating. Alternatively, if the alignment guide forming material is an organic polymer, it may be formed by using coating methods such as spin coating, spray coating and screen printing. In addition, the patterning may be formed through photolithography using a photosensitive material, or may be performed using known nanoimprinting methods, laser interference lithography, electron beam lithography and the like.

Meanwhile, the improvement in the alignment of the ultra-thin LED elements 101A, 101B, 101C is not due to the structural characteristics of the alignment guide 220. That is, the alignment guide 220 may be physically helpful for the ultra-thin LED elements 101A, 101B, 101C to be concentrated and mounted in a region between two adjacent alignment guides 202, and for example, a region between two alignment guides 200 that are respectively formed on the two adjacent first electrodes 211, 212, but it is not possible to control the mounting directionality of the ultra-thin LED elements 101A, 101B, 101C that are concentrated and mounted. In conclusion, the reason why the alignment of the ultra-thin LED elements 101A, 101B, 101C is improved is due to the dielectric properties between the solvent for forming a solution including the ultra-thin LED elements 101A, 101B, 101C that are introduced in step 1-2) described below and the materials forming the alignment guide 220. As a result, through the assembly power applied in step (2) to be described below, the difference in electric field strength at each location may be increased, and through this, the direction in which the ultra-thin LED elements 101A, 101B, 101C are mounted is substantially the same. Specifically, the long axis direction (l) of the ultra-thin LED elements 101A, 101B, 101C may be aligned to be close to or substantially perpendicular to the longitudinal direction of the first electrode.

Figure 12:
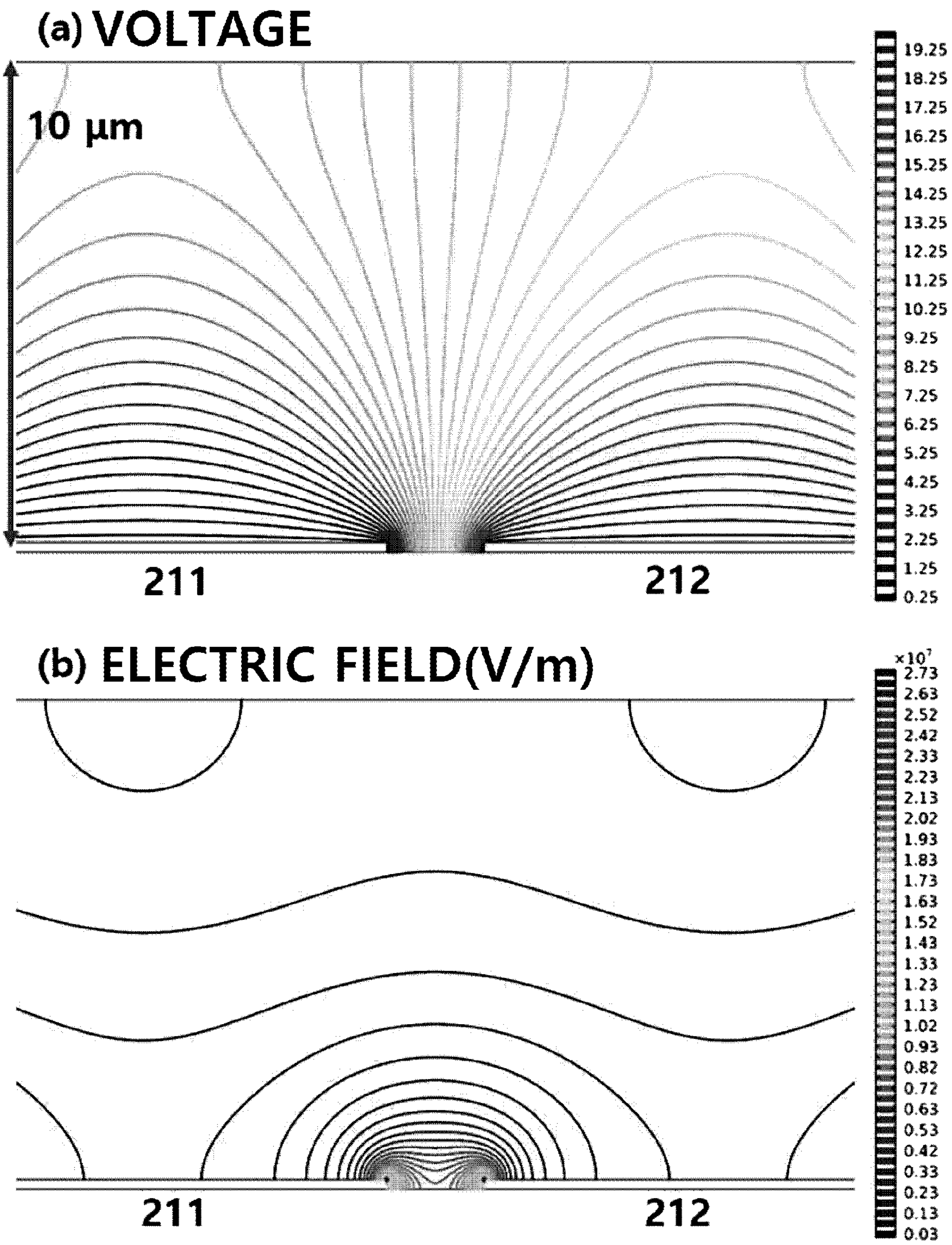
FIGS. 12 and 13 are the simulation results of electric fields formed in two first electrodes 211, 212 when an assembly power of 40 Pap and 10 kHz is applied to the first electrodes 211, 212 in a state of being filled with a solvent having a dielectric constant of 20.7.
Figure 13:
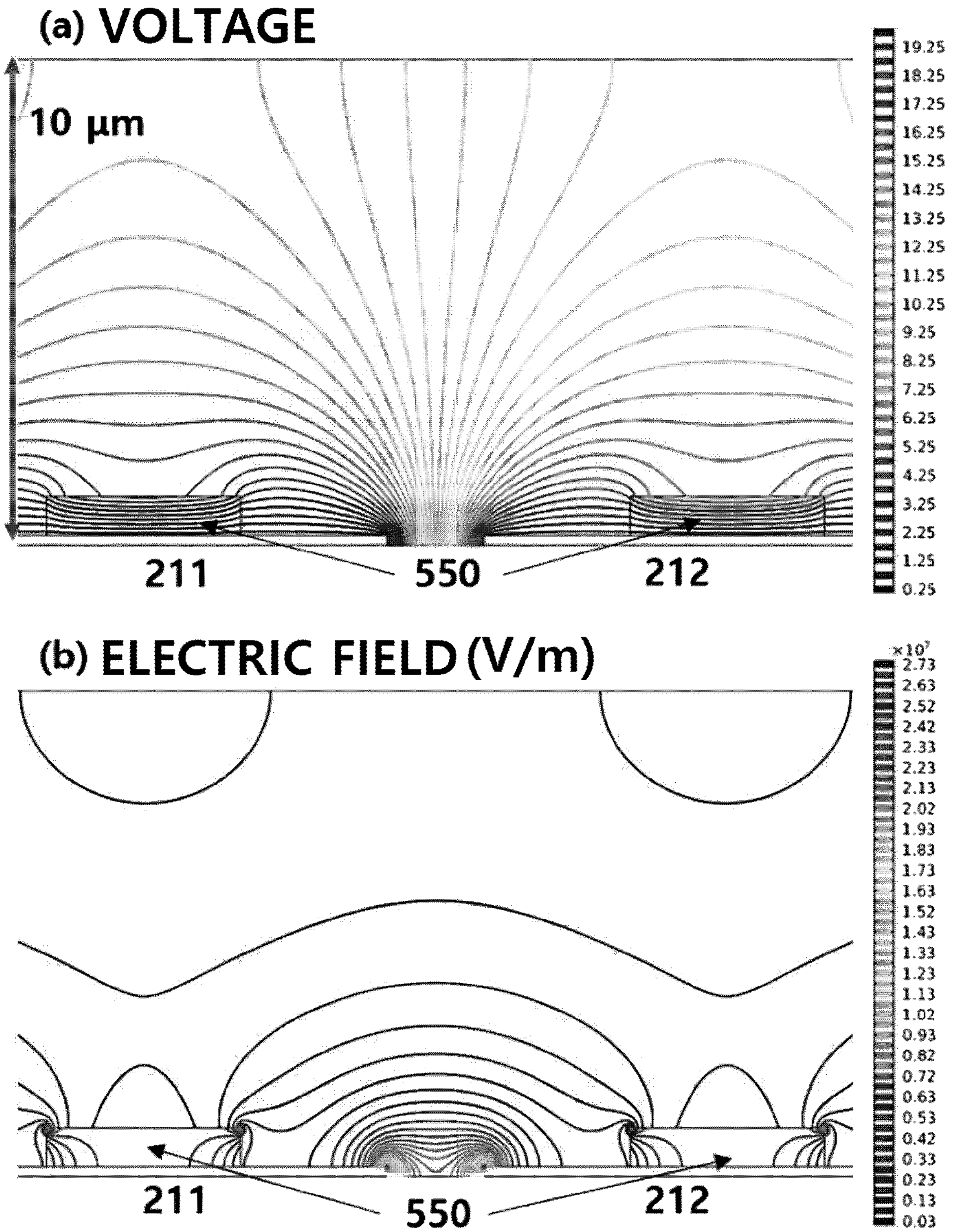

When it is described with reference to FIGS. 12 and 13, FIG. 12 and FIG. 13 illustrate contour lines of voltage magnitude (($\alpha$) of FIG. 12 and FIG. 13) and contour lines of electric field strength ((b) of FIG. 12 and FIG. 13) formed at the two first electrodes 211, 212, which are formed when assembly power of 40 Vpp and 10 kHz is applied to the first electrodes 211, 212 while a solvent with a dielectric constant of 20.7 is filled in the upper region (region at a height of 10 μm from the ground where the first electrodes are formed) of the two first electrodes 211, 212 that have a width of 10 μm, a thickness of 0.2 μm and a spacing interval of 2 μm.

Looking at FIG. 12, even when the alignment guide 220 is not formed, the point where the intensity of the electric field formed in the first electrodes 211, 212 is strongest is near the side surfaces where the two first electrodes 211, 212 face each other, particularly the upper edge of the side surfaces. Accordingly, the ultra-thin LED elements are simultaneously pulled and mounted to the upper edges of the side surfaces where the two first electrodes 211, 212 face each other, and as a result, the ultra-thin LED elements may be mounted such that they are placed between the two first electrodes 211, 212. However, as illustrated in FIG. 8C, even when it does not span both of the first electrodes 211, 212 and only one end spans any one first electrode or spans both of first electrodes 211, 212, it can be seen that the long-axis direction of the elements is differently mounted.

However, as can be confirmed in FIG. 13, when the alignment guide 220 (width 4 μm, height 0.8 μm) made of $SiO_2$ is disposed on the upper surface of the first electrodes 211, 212, the electric field strength at the upper edge of the side surfaces where the two first electrodes 211, 212 face each other increases significantly compared to FIG. 12, and the difference in electric field strengths from location to location also becomes much larger. As a result, the ultra-thin LED elements are more strongly attracted to the upper edge of the side surfaces where the two first electrodes 211, 212 face each other. Furthermore, the long axis direction (l) of the elements may be aligned such that it is substantially perpendicular to the extension direction of the first electrode.

Meanwhile, the improvement in the alignment of ultra-thin LED elements due to the presence of the alignment guide 220 as illustrated in FIG. 13 may be further maximized by adjusting the dielectric properties between the solvent and the alignment guide 220. Specifically, FIGS. 14*a* to 14*c* are the results of simulation that when the alignment guide 220 is formed as illustrated in FIG. 13, the change in electric field strengths formed between the two first electrodes 211, 212 is controlled by changing the type of alignment guide according to the position (first electrode width direction (x-axis), height (y-axis)) when the ultra-thin LED elements in a solvent having a specific dielectric constant are drawn from the upper region of the first electrode 211, 212 toward the first electrode 211, 212.

Figure 14A:
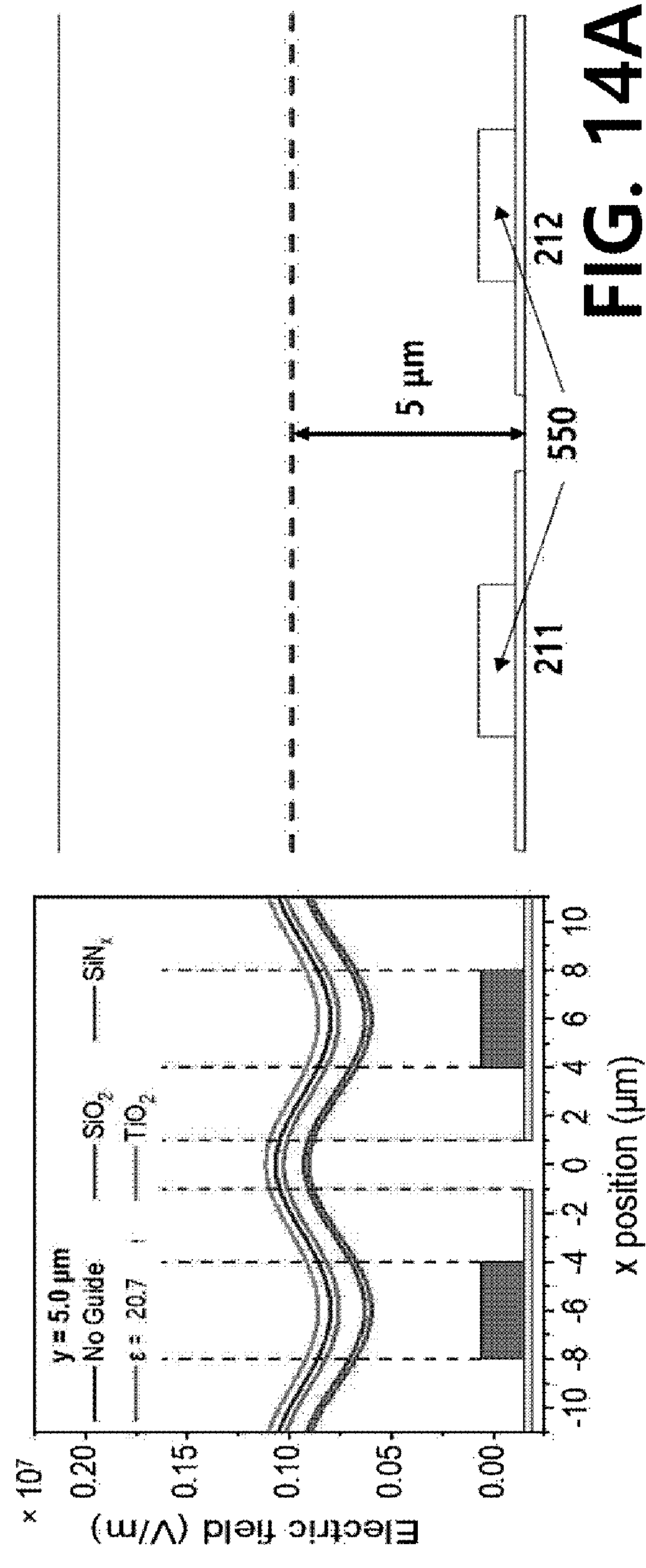
FIGS. 14A to 14C are the results of simulating a change in electrical field intensity formed between the two first electrodes 211, 212 by varying the type of alignment guides according to the position (first electrode width direction (x-axis), height (y-axis)) when the ultra-thin LED element in a solvent having a specific dielectric constant is drawn from the upper region of the first electrode 211, 212 toward the first electrodes 211, 212.

Specifically, as can be confirmed in FIG. 14A, at a position of 5 μm from the ground where the first electrodes 211, 212 are formed, regardless of the type of the alignment guide 220, the differences in electric field strengths between the central point of the left alignment guide 220 (−6.0 based on the x-axis), the central point of the right alignment guide 220 (+6.0 based on the x-axis) and the central point between the two first electrodes 211, 212 (0.0 based on the x-axis) are not large. However, as illustrated in FIG. 14B, at a position of 2 μm from the ground where the first electrodes 211, 212 are formed, the strength of the electric field on the alignment guide 220 side is weaker than that of FIG. 14A, whereas the intensity of the electric field increases toward the central point between the two first electrodes 211, 212 (0.0 based on the x-axis). Therefore, it can be seen that the differences in electrical field intensities between the central point of the left alignment guide 220 (−6.0 based on the x-axis), the central point of the right alignment guide 220 (+6.0 based on the x-axis) and the central point between the two first electrodes 211, 212 (0.0 based on the x-axis) further increase. Accordingly, it can be expected that the ultra-thin LED elements that are drawn toward the first electrode will be strongly attracted between the two first electrodes 211, 212 in which the differences in electric field strengths are formed to be large.

Figure 14B:
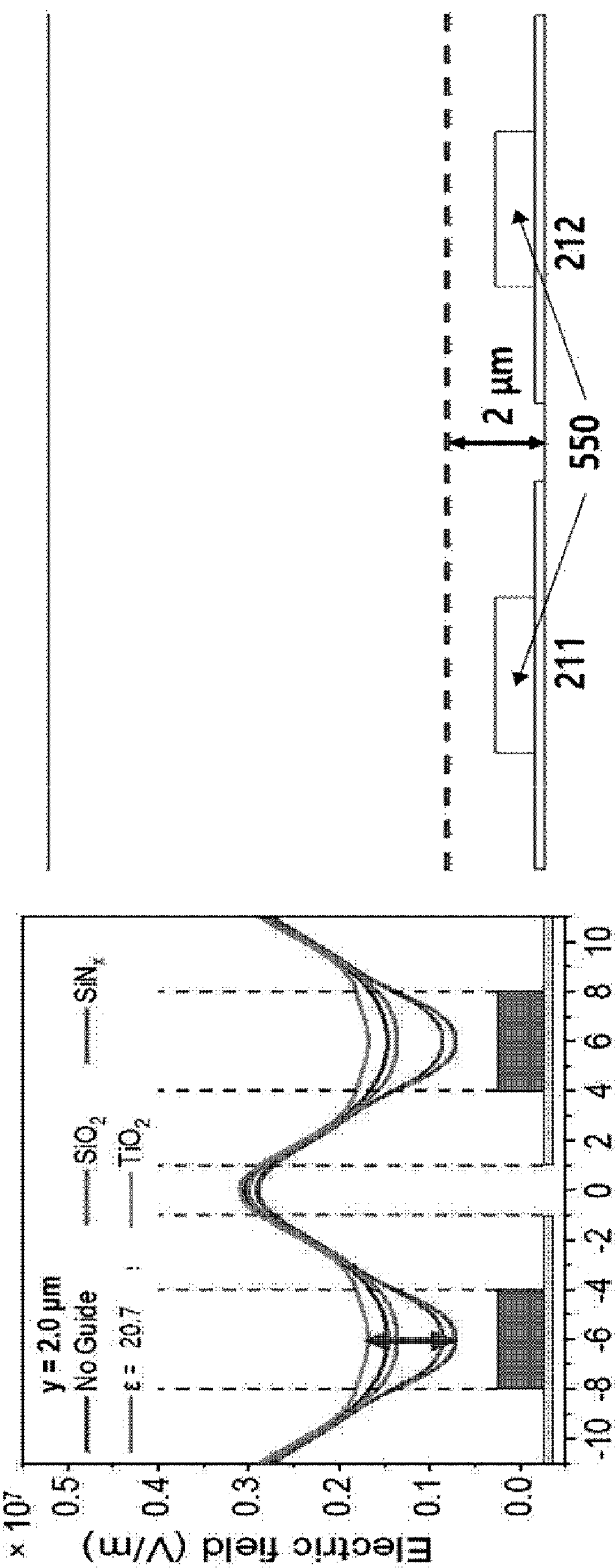

Meanwhile, when the dielectric properties of the alignment guide 220 formed through FIGS. 14*a* and 14*b* are different, the difference between the electric field strength on the alignment guide side and the electric field strength at the central point (0.0 on the x-axis) between the two first electrodes 211, 212 varies greatly. Therefore, it can be seen that the difference in the force with which the ultra-thin LED elements are drawn between the two first electrodes 211, 212 varies depending on the difference in dielectric properties between the solvent and the alignment guide 220. Specifically, compared to the case where the alignment guide 220 is formed of a material having the same dielectric constant as the dielectric constant of the solvent, when the alignment guide is not formed or the alignment guide made of a $TiO_2$ material is formed, it can be expected that the force that the ultra-thin LED elements are drawn between the two first electrodes 211, 212 will be similar or rather small. Conversely, when the alignment guide is formed of $SiO_2$ or $SiN_x$, it can be seen that the force with which the ultra-thin LED elements are drawn between the two adjacent first electrodes 211, 212 is formed to be much larger than when there is no alignment guide. Eventually, for the alignment of the ultra-thin LED elements, even if there is no alignment guide 220 or there is an alignment guide 220, it can be expected that the alignment of the ultra-thin LED elements will be remarkably excellent when it is formed of $SiO_2$ or $SiN_x$ which has a dielectric constant that is smaller than the solvent, compared to the case where it is formed from a material with the same dielectric constant as the solvent or $TiO_2$ having a dielectric constant greater than the dielectric constant of the solvent.

Figure 14C:
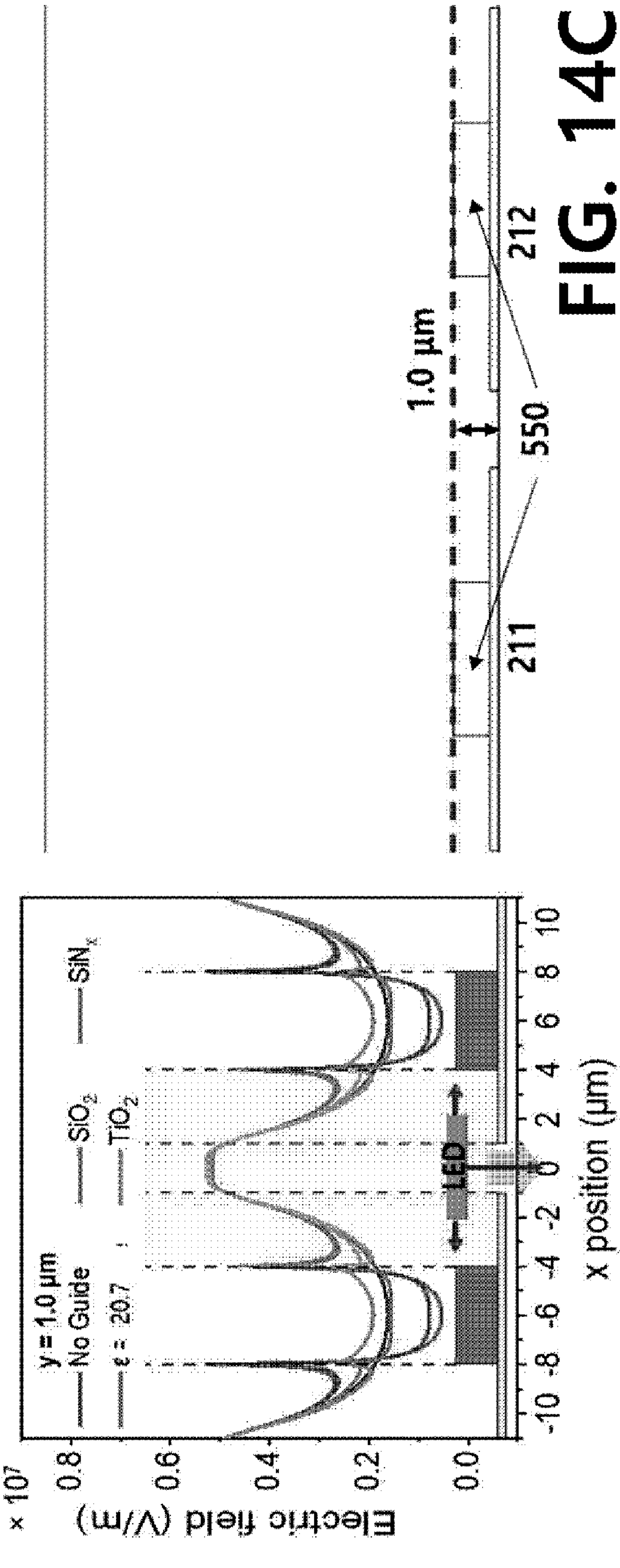

In addition, as can be confirmed in FIG. 14C, at 1 μm from the ground where the first electrodes 211, 212 are formed, the strength of electric field increases significantly at the edge of the alignment guide 220, unlike FIG. 14B, but the electric field strength trends at other positions are similar. Even if the electric field strength at the edge of the alignment guide 220 increases significantly, it is still smaller than the electric field strength between the two first electrodes 211, 212, and thus, it is difficult to hinder the movement of attracting the ultra-thin LED elements between the two first electrodes 211, 212. Eventually, it can be seen that the alignment of the ultra-thin LED elements will be the same as expected in FIG. 14B.

Eventually, when steps 1-1) and 1-2) according to the present invention are constituted such that the dielectric constant (ε1) of the solvent is comparatively greater than the dielectric constant (ε2) of the alignment guide 220 through FIGS. 14*a* to 14*c*, the long axis direction (l) of the ultra-thin LED elements may be arranged to be close to perpendicular to the width direction (α) perpendicular to the extending direction of the first electrodes 211, 212, and at the same time, the mounting area (C) occupied by one ultra-thin LED element is reduced, thereby allowing the ultra-thin LED elements to be more concentrated and disposed. Preferably, the dielectric constant (ε1) of the solvent may be greater than the dielectric constant (ε2) of the alignment guide 220 by 3.0 or more, more preferably, 5.0 or more, and even more preferably 10.0 or more, and through this, the alignment and concentrated arrangement of the ultra-thin LED elements, and specifically, the ratio of the ultra-thin LED elements mounted at a mounting angle (θ) of 100 or less, and more preferably, a mounting angle (θ) of 5° or less, which will be described below, may be further improved. As another example, the dielectric constant (ε1) of the solvent may be greater at 80.0 or less compared to the dielectric constant (ε2) of the alignment guide 550.

Additionally, in order to prevent the solution including the ultra-thin LED elements 101A, 101B, 101C introduced in step 1-2) from flowing through parts other than the target area, and concentrating and disposing the ultra-thin LED elements 101A, 101B, 101C on the desired first electrodes 211, 212, the step of forming a partition wall 250 consisting of side walls surrounding the first electrodes 211, 212 disposed in one subpixel area at a certain height may be further performed at or before step 1-1), and in step 1-2), a solution including the ultra-thin LED elements 101A, 101B, 101C may be introduced into the partition wall 250.

The partition wall 250 may be manufactured through patterning and etching processes so as to become a partition wall that surrounds the subpixel area corresponding to the partitioned subpixel area after the material forming the partition wall is formed at a certain height on the upper portion of the second layer area (L2) where the first electrodes 211, 212 are formed.

In this case, when the material of the partition wall 250 is an inorganic insulating material, it may be formed by any one method of chemical vapor deposition, atomic layer deposition, vacuum deposition, e-beam deposition and spin coating methods. In addition, if the material is a polymer insulating material, it may be formed by using coating methods such as spin coating, spray coating and screen printing. In addition, the patterning may be formed through photolithography using a photosensitive material, or may be performed by using known nanoimprinting methods, laser interference lithography, electron beam lithography and the like. In this case, the height of the formed partition wall 250 is ½ of the thickness of the ultra-thin LED elements 101A, 101B, 101C or more, and it is a thickness that may not affect step (3) and subsequent post-processes described below, and it may be preferably 0.1 to 100 m, and more preferably, 0.3 to 10 μm. If the above range is not satisfied, it may affect step (3) and subsequent post-processes, thereby making it difficult to manufacture the ultra-thin LED electrode assembly. In particular, when the thickness of the insulating material is too thin compared to the thickness of the ultra-thin LED elements 101A, 101B, 101C, there is a risk that a solution such as an ink composition including the ultra-thin LED elements 101A, 101B, 101C may overflow outside the partition wall 250, and thus, it may be difficult to prevent the ultra-thin LED elements from spreading out of the partition wall 250 through the partition wall 250.

In addition, the etching may be performed by using an appropriate etching method in consideration the material of the insulating material, and for example, it may be performed through wet etching or dry etching, and preferably, it may be performed by any one dry etching method of plasma etching, sputter etching, reactive ion etching and reactive ion beam etching.

Next, in step 1-2), the step of introducing a solution including a plurality of ultra-thin LED elements 101A, 101B, 101C onto the first electrodes 211, 212 is performed.

The ultra-thin LED elements 101A, 101B, 101C are introduced on the first electrodes 211, 212 in a solution state of being dispersed in a solvent. In this case, the solvent functions as a dispersion medium to disperse the ultra-thin LED elements 101A, 101B, 101C, and moreover, it affects the dielectrophoretic force received by the ultra-thin LED elements due to an electric field formed on the first electrodes 211, 212, thereby performing a function of moving the ultra-thin LED elements 101A, 101B, 101C toward the first electrodes 211, 212. The solvent may be used without limitation if it is a solvent that does not cause physical or chemical damage to the ultra-thin LED elements and preferably increases the mobility of the ultra-thin LED elements by dispersibility and dielectrophoresis. However, as described above, the solvent must be selected appropriately in consideration of the dielectric properties of the alignment guide 220, and preferably, the solvent may have a dielectric constant of 30 or less, and as another example, 28 or less. In addition, preferably, the solvent may have a dielectric constant of 10.0 or more, and through this, it may be more advantageous in terms of improving the alignment of ultra-thin LED elements. Meanwhile, the solvent that satisfies the above dielectric constant may be, for example, acetone, isopropyl alcohol and the like. In addition, the solution containing the ultra-thin LED elements may contain 0.01 to 99.99 wt. % of the ultra-thin LED elements in the solution, and the present invention does not particularly limit the same. In addition, the solution may be an ink or paste phase.

Additionally, in step 1-2), the solution including the ultra-thin LED elements 101A, 101B, 101C may be treated on the first electrodes 211, 212 through a known method, and in order to be applied in mass production, printer devices such as an inkjet printer and the like may be used. Additionally, in order to be used in the printer device and the like, a solution including the ultra-thin LED elements 101A, 101B, 101C to be suitable for the printer device and method may be implemented as an ink composition, and in this case, the type of solvent may be appropriately selected in consideration of the physical properties such as the viscosity of a solvent and the like. Additionally, in consideration of the printing method and device, additives that are conventionally added to the composition used in the corresponding device may be further included, and the present invention does not particularly limit the same.

Meanwhile, steps 1-2) has been explained as introducing the ultra-thin LED elements into a solution state mixed with a solvent, but it is also included in step 1-2) when it is the same case as a solution is introduced eventually such as when the ultra-thin LED elements 101A, 101B, 101C are first introduced on the first electrodes 211, 212, and then, the solvent is introduced, or conversely, when the solvent is introduced first, and then, the ultra-thin LED elements 101A, 101B, 101C are introduced.

Next, in step (2), the step of applying assembly power to the first electrodes 211, 212 to self-align the ultra-thin LED elements 101 introduced into each subpixel area ($SP_1$, $SP_2$, $SP_3$, $SP_n$) so as to come into contact with the upper surfaces of the two adjacent first electrodes 211, 212 is performed.

In step (2), the ultra-thin LED elements 101A, 101B, 101C introduced on the first electrodes 211, 212 are self-aligned such that both ends of the ultra-thin LED elements 101A, 101B, 101C in the long axis direction come into contact with the upper surfaces of the two adjacent first electrodes 211, 212 through a dielectrophoretic force caused by an electric field formed by the assembly power applied to the first electrodes 211, 212.

In this case, the application of the assembly power may be performed before, together with, or after the solution including the ultra-thin LED elements 101A, 101B, 101C is introduced, and the present invention does not particularly limit the same.

In addition, the applied assembly power may preferably have a frequency of 1 kHz to 100 MHz and a voltage of 5 to 100 Vpp. In addition, more preferably, the assembly power may have a frequency of 1 kHz to 200 kHz and a voltage of 10 to 80 Vpp. If the voltage of the assembly power is applied below 5 Vpp and/or the frequency is applied below 1 kHz, it is difficult to achieve the desired level of alignment, and concentrated placement may also be difficult. In addition, if the voltage exceeds 100 Vpp, there is a risk that the first electrodes 211, 212 or the electrode layer that may be provided in the ultra-thin LED elements may be damaged. In addition, even if the frequency of the power source exceeds 100 MHz, it may be difficult to achieve alignment at the desired level, and it may be difficult to concentrate and dispose the elements.

Next, in step (3), the step of forming a second electrode 301 on a plurality of self-aligned ultra-thin LED elements 101 to form an ultra-thin LED electrode assembly is performed.

When the second electrode 301 is designed to make electrical contact with the upper portion of the ultra-thin LED elements 101A, 101B, 101C mounted on the above-described first electrodes 211, 212, there are no limitations on the number, arrangement or shape.

In addition, the second electrode 301 may be implemented by depositing an electrode material after patterning an electrode line using known photolithography, or by dry and/or wet etching after depositing an electrode material, and the description of the specific forming method will be omitted.

Meanwhile, in order to improve the electrical contact between the first electrodes 211, 212 and each of the ultra-thin LED elements 101A, 101B, 101C in contact with the first electrodes 211, 212 between steps (2) and (3) described above, the step of forming a conductive metal layer (not illustrated) for connecting the same to each other and the step of forming a passivation layer 260 on the first electrodes 211, 212 by not covering the upper surfaces of the self-aligned ultra-thin LED elements 101A, 101B, 101C may be further included.

The conductive metal layer (not illustrated) may be manufactured by applying a photolithography process using a photosensitive material to pattern a line where the conductive metal layer is to be deposited and then depositing the conductive metal layer, or by patterning the deposited metal layer and then etching the same. This process may be performed by appropriately employing known methods, and Korean Patent Application No. 10-2020-0062462 by the inventors of the present invention may be incorporated herein by reference.

In addition, after forming the conductive metal layer, the step of forming a passivation layer 260 on the first electrodes 211, 212 so as not to cover the upper surfaces of the self-aligned ultra-thin LED elements 101A, 101B, 101C may be performed. As an example, the passivation layer 260 may be deposited by depositing a passivation material such as $SiO_2$ or $SiN_x$ through the PECVD method, by depositing a passivation material such as AlN or GaN through the MOCVD method, or by depositing a passivation material such as $Al_2O$, $HfO_2$, $ZrO_2$ and the like through the ALD method. Meanwhile, the passivation layer 260 may be formed not to cover the upper surfaces of the self-aligned ultra-thin LED elements 101A, 101B, 101C. To this end, the passivation layer may be formed through deposition to a thickness not covering the upper surface. Alternatively, a passivation layer may be deposited to cover the upper surface, and then, dry etching may be performed until the upper surface of the element is exposed.

Next, the second manufacturing method will be described. When it is described by focusing on the parts of the second manufacturing method that are not explained among the above-described first manufacturing method, for the ultra-thin LED elements introduced in step (1), as described above, the ultra-thin LED elements that are designed to improve the drivable mounting ratio and selective mounting ratio may be introduced. In addition, the solvent that constitutes an ink composition or ink paste with the ultra-thin LED elements may be used without limitation, preferably, if it is a solvent that can increase the dispersibility of the ultra-thin LED elements without causing physical or chemical damage to the ultra-thin LED elements. In addition, the solvent may have an appropriate dielectric constant such that the ultra-thin LED elements dispersed in the solvent have a dielectrophoretic force that is attracted toward the first electrode during dielectrophoresis. Preferably, the solvent may have a dielectric constant of 10.0 or more, in another example, 30 or less, and in still another example, 28 or less, and through this, it may be more advantageous to implement the ultra-thin LED electrode assembly that us desired to be implemented through the second manufacturing method. Meanwhile, for example, the solvent that satisfies the above dielectric constant may be acetone, isopropyl alcohol and the like. In addition, the solution containing the ultra-thin LED elements may contain 0.01 to 99.99 wt. % of the ultra-thin LED elements in the solution, and the present invention does not particularly limit the same.

In addition, the assembly power applied during self-alignment in step (2) may preferably have a frequency of 1 kHz to 100 MHz and a voltage of 5 to 100 Vpp. In addition, more preferably, the assembled power supply may have a frequency of 1 kHz to 500 kHz, and even more preferably, 1 kHz to 200 kHz, and the voltage may be 10 to 80 Vpp. If the frequency of the assembly power supply is applied at less than 5 Vpp and/or the frequency is applied at less than 1 kHz, among the mounted ultra-thin LED elements, the proportion of ultra-thin LED elements that are mounted to be in contact with the side surfaces rather than the first surface (B) or second surface (T) increases, and the proportion of ultra-thin LED elements that cannot be driven even by AC power also increase such that the luminance of transparent ultra-thin LED displays may be significantly reduced. In addition, even if the mounting ratio that can be driven by AC power exceeds a certain percentage, it is difficult to use DC power as a driving power because it is difficult to increase the selective mounting ratio. In addition, even if DC power is used as a driving power, the achieved luminance may be lower compared to when AC power is used as a driving power. In addition, if the voltage exceeds 100 Vpp, the first electrodes 211, 212 may be damaged. In addition, if an electrode layer is provided as a selective alignment directing layer 40 on the uppermost layer of the ultra-thin LED elements, there is a concern that the electrode layer may also be damaged. In addition, if the frequency of power exceeds 100 MHz, even when the side surface (S) of the elements is mounted predominantly on the first electrode, or the first surface (B) or second surface (T) is mounted more dominantly on the first electrode than the side surface (S), the drivable mounting ratio and/or selective mounting ratio may not be high.

Through the first manufacturing method and the second manufacturing method described above, it is possible to implement displays according to the first embodiment and the second embodiment in which the ultra-thin LED electrode assembly is disposed in each of a plurality of subpixel areas ($SP_1$, $SP_2$, $SP_3$, $SP_n$) in the first layer area (L1)

Additionally, in the case of the display according to the first embodiment, in step (4) after step (3) described above, the plurality of subpixel areas ($SP_1$, $SP_2$, $SP_3$, $SP_n$) include blue, green and red, respectively, and depending on the light color of the emitted light designated to each subpixel area ($SP_1$, $SP_2$, $SP_3$, $SP_n$) such that each subpixel area ($SP_1$, $SP_2$, $SP_3$, $SP_n$) emits any one of these three colors, it is possible to implement the display by further including the step of forming a color conversion layer 400 on the upper portion of the first layer area (L1) corresponding to the second electrode 301 in some subpixel areas ($SP_1$, $SP_2$, $SP_3$, $SP_n$).

EXAMPLES

The present invention will be described in more detail through the following examples, but the following examples do not limit the scope of the present invention, and should be interpreted to aid understanding of the present invention.

Example 1

First of all, the ultra-thin LED elements were prepared as follows. Specifically, a conventional LED wafer (Epistar), in which an undoped n-type III-nitride semiconductor layer, an n-type III-nitride semiconductor layer doped with Si (thickness 4 μm), a photoactive layer (thickness 0.15 μm) and a p-type III-nitride semiconductor layer (thickness 0.05 μm) were sequentially stacked on a substrate, was prepared. On the prepared LED wafer, after ITO (thickness 0.15 μm) as a selective alignment directing layer, $SiO_2$ (thickness 1.2 μm) as a first mask layer, and Ni (thickness 80.6 nm) as a second mask layer were sequentially deposited, a SOG resin layer on which a rectangular pattern was transferred was transferred onto the second mask layer by using nanoimprint equipment. Thereafter, by using RIE, the SOG resin layer was cured, and the residual resin portion of the resin layer was etched through RIE to form a resin pattern layer. Thereafter, by following the pattern, the second mask layer was etched by using ICP, and the first mask layer was etched by using RIE. Thereafter, the first electrode layer, p-type III-nitride semiconductor layer and photoactive layer were etched by using ICP, and subsequently, the doped n-type III-nitride semiconductor layer was etched to a thickness of 0.5 μm, and an LED wafer on which a plurality of LED structures (long side 4 μm, short side 750 nm, height 850 nm) with the mask pattern layer removed were formed through KOH wet etching was manufactured. Afterwards, a temporary protective film of $Al_2O_3$ was deposited on the LED wafer on which a plurality of LED structures were formed (deposition thickness of 72 nm based on the side of the LED structure), and thereafter, the temporary protective film material formed between the plurality of LED structures was removed through RIE to expose the upper surface of the doped n-type III-nitride semiconductor layer between the LED structures.

Afterwards, the LED wafer on which the temporary protective film was formed was impregnated with an electrolyte, which is a 0.3M oxalic acid aqueous solution, and connected to an anode terminal of a power supply. After connecting a cathode terminal to a platinum electrode impregnated in an electrolyte, a 15V voltage was applied for 5 minutes to form a plurality of pores in the thickness direction from the surface of the doped n-type III-nitride semiconductor layer between the LED structures. Thereafter, after removing the temporary protective film, in Mathematical Formula 1 described above, it was assumed that the particle is a spherical core-shell particle with a radius of 430 nm composed of GaN with a radius of 400 nm as a core part and a rotation inducing film with a thickness of 30 nm as a shell part, and the solvent was acetone with a dielectric constant of 20.7, and when the frequency of the applied power was in the frequency band of 10 kHz to 10 GHz, a $SiO_2$ rotation inducing film in which the real number part value of the $K(\omega)$ value according to Mathematical Formula 1 was 0.336 was deposited to a thickness of 60 nm based on the side surface of the LED structure. Thereafter, the rotation inducing coating material formed between the LED structures was removed through RIE to expose the upper surface of the doped n-type III-nitride semiconductor layer between the LED structures, and then, the LED wafer was immersed in a 100% gamma-butyrolactone bubble-forming solution and then irradiated with ultrasound at an intensity of 160 W and 40 kHz for 10 minutes. In addition, the generated bubbles were used to collapse the pores formed in the doped n-type III-nitride semiconductor layer, thereby manufacturing a plurality of ultra-thin LED elements that emit blue light.

Afterwards, on a base substrate made of quartz with a thickness of 500 μm, transparent first electrodes with a light transmittance of 70% or more extending long in the first direction were alternately formed at intervals of 3 μm in the second direction perpendicular to the first direction. In this case, a plurality of first electrodes respectively had a width of 10 μm and a thickness of 0.2 μm, the material of the first electrode was ITO, and the area of the subpixel area where the ultra-thin LED element was mounted was set to 1 $mm^2$. In addition, an insulating partition wall made of $SiO_2$ with a height of 0.5 μm was formed on the base substrate so as to surround the subpixel area.

Afterwards, a solution was prepared by mixing a plurality of prepared ultra-thin LED elements in acetone with a dielectric constant of 20.7, and then, 9 μL of the prepared solution was dropped into each subpixel area twice. Thereafter, the ultra-thin LED elements were mounted on the two adjacent first electrodes through dielectrophoresis by applying AC power of sine wave at 10 kHz and 40 Vpp as an assembly power source to the two adjacent first electrodes.

Afterwards, heat treatment was performed to reduce the contact resistance between the ultra-thin LED elements and the first electrodes. The heat treatment was performed at 500° C. for 10 minutes in a nitrogen atmosphere at a pressure of $5.0\times10^{-1}$ torr.

Afterwards, a passivation material of $SiO_2$ was deposited in the subpixel area where the ultra-thin LED elements were mounted by using the PECVD method to a height corresponding to the thickness of the ultra-thin LED elements, and then, it was extended in a second direction perpendicular to the first direction. In addition, second electrodes (width 10 m, thickness 0.2 μm, interval between electrodes 3 μm, material ITO) that were spaced apart from each other in the first direction were formed on the upper surface of the mounted ultra-thin LED elements. Thereafter, a color conversion layer was patterned on the upper electrode line corresponding to the subpixel area such that it became the subpixel area that expresses any one color among blue, green and red in a plurality of subpixel areas, and as a result, the light transmittance was 25%, and the light-emitting area ratio within the plurality of subpixel areas was around 34 to 35%. A color-by-blue transparent ultra-thin LED display was implemented.

Example 2

It was manufactured in the same manner as in Example 1, except that a rotation inducing film was not formed, and the manufactured ultra-thin LED elements were used to implement a transparent ultra-thin LED display.

Example 3

It was manufactured in the same manner as in Example 1, except that the ultra-thin LED elements without ITO were used as a selective alignment directing layer to implement a transparent ultra-thin LED display.

Example 4

It was manufactured in the same manner as in Example 1, except that the ultra-thin LED elements in which the rotation inducing film was changed to a $TiO_2$ rotation inducing film with a real number part value of K(ω) of 0.944 according to Mathematical Formula 1 under the same conditions were used to implement a transparent ultra-thin LED display.

Example 5

It was manufactured in the same manner as in Example 4, except that it was changed to ultra-thin LED elements without forming ITO as a selective alignment direction layer to implement a transparent ultra-thin LED display.

Experimental Example

1. Analysis of the Mounting Surface of Ultra-Thin LED Elements

For the transparent ultra-thin LED displays according to Examples 1 to 5, the mounting surfaces of the ultra-thin LED elements were evaluated as follows, and the results are shown in Table 2 below.

Specifically, during the manufacturing process of the transparent ultra-thin LED display, after an assembly voltage was applied, the ultra-thin LED elements were self-aligned, and SEM images were photographed to observe and count what surface the mounting surface of each ultra-thin LED element that was in contact with the supper surface of the lower electrode in each subpixel area was, and the percentage compared to the number of ultra-thin LED elements that were mounted was calculated and shown in Table 2 below.

In addition, the driveable mounting ratio in which the mounting surface of the ultra-thin LED element became the first surface (B) on the n-type semiconductor layer side or the second surface (T) on the p-type semiconductor layer side or the selective mounting ratio in which any specific one surface among the first surface (B) and the second surface (T) by the comparative examples became a mounting surface was shown together in Table 2.

2. Evaluations of Luminance and Peak Intensity

In order to drive a transparent ultra-thin LED display, primarily, an alternating voltage of sine wave with a frequency of 10 Vrms and 60 Hz was applied as the driving power source and measured with a spectrophotometer, and secondarily, a direct current voltage of 10V was applied and measured with a spectrophotometer. The area value (Sum %) and the intensity ratio (peak %) of light with the maximum intensity on the electroluminescence spectrum in each example were calculated, and in this case, the area value and intensity ratio during the secondary driving in each example were expressed relatively based on the area value and intensity ratio during the primary driving.

TABLE 2

| | | Example 1 | Example 2 | Example 3 | Example 4 | Example 5 |
|---|---|---|---|---|---|---|
| Ultra-thin LED elements | First surface (B) | Pore/N | Pore/N | Pore/N | Pore/N | Pore/N |
| | Second surface (T) | Selective alignment directing layer (ITO) | Selective alignment directing layer (ITO) | P | Selective alignment directing layer (ITO) | P |
| | Rotation inducing film K (ω) | $SiO_2$/0.336 | None | $SiO_2$/0.336 | $TiO_2$/0.944 | $TiO_2$/0.944 |
| Mounting surface of ultra-thin LED elements (percentage) | Second surface (T) | 94% | 88% | 12% | 54% | 14% |
| | Side surface | 6% | 7% | 17% | 25% | 30% |
| | First surface (B) | 0% | 5% | 71% | 21% | 56% |
| | Total | 100% | 100% | 100% | 100% | 100% |
| Mounting ratio | Drivable mounting | 94% | 93% | 83% | 75% | 70% |
| | Selective mounting (percentage/surface) | 94%/second surface | 88%/second surface | 71%/first surface | 54%/second surface | 56%/first surface |
| Percentage of light-emitting areas in subpixel area (%) | | 34~35 | 34~35 | 30~31 | 26~28 | 24~27 |
| AC driving | Sum % | 1.0 | 1.0 | 1.0 | 1.0 | 1.0 |
| | Peak % | 1.0 | 1.0 | 1.0 | 1.0 | 1.0 |
| DC driving | Sum % | 1.92 | 1.85 | 1.69 | 1.20 | 1.22 |
| | Peak % | 1.98 | 1.91 | 1.74 | 1.25 | 1.26 |

In Table 2, N refers to the n-type III-nitride semiconductor layer, and P refers to the p-type III-nitride semiconductor layer.

As can be confirmed in Table 2, in terms of the transparent ultra-thin LED displays according to Examples 1 to 5, the transparent ultra-thin LED displays according to Examples 1 to 3 could be driven with direct current power compared to Examples 4 and 5, and since the luminance was greatly increased when driven with direct current, it can be seen that it is more advantageous to implement a transparent display with excellent visibility, contrast ratio and color reproducibility, even when the illuminance of external light increases significantly.

Example 6

It was manufactured in the same manner as in Example 1, except that an alignment guide made of $SiO_2$ material with a width of 4 μm, a height of 0.8 μm and a dielectric constant of 3.9 in the central portion of each transparent first electrode was subjected to patterning by photolithography by using a photosensitive material in the longitudinal direction of the first electrode, and then, ultra-thin LED elements were mounted by using the first electrode formed by plasma chemical vapor deposition to manufacture a transparent ultra-thin LED display.

Examples 7 to 8

These were manufactured in the same manner as in Example 6, except that the material of the alignment guide and/or the type of solvent were changed as shown in Table 3 below to implement transparent ultra-thin LED displays.

In this case, the solvent changed in Example 8 was tert-butanol and had a dielectric constant of 10.9.

Comparative Example 1

It was manufactured in the same manner as in Example 6, except that the material of the alignment guide and/or the type of solvent were changed as shown in Table 3 below to implement an ultra-thin LED display.

Comparative Example 2

An ultra-thin LED display was manufactured in the same manner as in Example 6, except that an alignment guide was not formed.

Experimental Example 2

For the transparent ultra-thin LED displays according to Examples 6 to 8 and Comparative Examples 1 to 2, the mounting angles of the ultra-thin LED elements were evaluated as follows, and the results are shown in Table 3 below.

Specifically, in the same manner as in Experimental Example 1, after applying an assembly voltage during the manufacturing process of the transparent ultra-thin LED display, SEM images were photographed while the ultra-thin LED elements were self-aligned, and the mounting angle of each ultra-thin LED elements mounted on the upper surface of the first electrode was measured. In addition, the vertical alignment ratio, which is a ratio of ultra-thin LED elements with a mounting angle of 5° or less compared to all ultra-thin LED elements that were mounted, was measured, and the results are shown in Table 3 below.

TABLE 3

| | Dielectric constant of solvent | Dielectric constant of alignment guide (material) | Difference in dielectric constants between solvent and alignment guide | Vertical mounting ratio (%) |
|---|---|---|---|---|
| Example 6 | 20.7 | 3.9 ($SiO_2$) | 16.8 | 91.8 |
| Example 7 | 20.7 | 9.0 ($Al_2O_3$) | 10.2 | 88.2 |
| Example 8 | 10.9 | 9.0 ($Al_2O_3$) | 1.1 | 75.5 |
| Comparative Example 1 | 20.7 | 80 ($TiO_2$) | −59.3 | 41.5 |
| Comparative Example 2 | 20.7 | Not installed | — | 59.0 |

As can be confirmed in Table 3, in Comparative Example 2 without an alignment guide, the vertical mounting ratio was only 59.0%, but in Examples 6 to 8 with an alignment guide, the vertical mounting ratio increased significantly to 75.5% or more. In this way, when the vertical mounting ratio is greatly increased, the number of ultra-thin LED elements arranged per unit area in the limited subpixel area can be increased, and through this, since it is possible to increase the ratio of a light transmission area in the subpixel area and exhibit greater luminance characteristics, it can be seen that it is more advantageous to implement a transparent display with excellent visibility, contrast ratio and color reproducibility, even when the illuminance of external light increases.

However, even when an alignment guide is formed, it can be seen that the vertical mounting ratio was significantly lowered in Comparative Example 1, in which an alignment guide with a higher dielectric constant than the solvent was formed, compared to the examples.

Although one exemplary embodiment of the present invention has been described above, the spirit of the present invention is not limited to the exemplary embodiments presented in the present specification, and those skilled in the art who understand the spirit of the present invention may easily suggest other exemplary embodiments by changing, modifying, deleting or adding components within the scope of the same spirit, but this will also fall within the scope of the present invention.

The invention claimed is:

1. A transparent LED display comprising:

a plurality of LED elements;

a display area in which a plurality of subpixel areas and light transmission areas are arranged on the x-y plane based on mutually perpendicular x, y and z axes, and the light transmittance is 25% or more, wherein each of the plurality of subpixel areas is provided with an LED electrode assembly in which a plurality of LED elements emitting substantially the same light color are electrically connected between first and second electrodes that are spaced apart in the z-axis direction.

2. The transparent LED display of claim 1, wherein each LED element is an element whose area of a light-emitting surface, which is a plane perpendicular to a direction in which the layers forming the element are stacked, is 0.05 to 25 $\mu m^2$, and the light-emitting area ratio of each the LED element on the x-y plane in each subpixel area is 50% or less.

3. The transparent LED display of claim 1, wherein each LED element is an element in which the layers forming the element are stacked in the z-axis direction, the thickness in the z-axis direction is 0.1 to 3 μm, and the length of a long axis which is any one direction on the x-y plane of 1 to 10 μm.

4. The transparent LED display of claim 1, wherein the display area comprises in the z-axis direction a first substrate, a second layer area which is disposed on the first substrate and provided with a plurality of circuit elements, and a first layer area which is provided on the second layer area and comprises a plurality of LED electrode assemblies and a partition wall that surrounds the exterior of each LED electrode assembly at a predetermined height, wherein the light transmittance of the first substrate, circuit elements and partition wall is 60% or more.

5. The transparent LED display of claim 1, wherein each LED electrode assembly comprises:

a plurality of first electrodes which are spaced apart from each other on the x-y plane;

a plurality of LED elements in which a plurality of layers comprising a first conductive semiconductor layer, a photoactive layer and a second conductive semiconductor layer are stacked in the z-axis direction, and the long axis having a length that is longer than a thickness in the z-axis direction is arranged such that both ends of the elements in the long-axis direction formed on the x-y plane contact the upper surfaces of two adjacent first electrodes; and a second electrode which is disposed on the plurality of LED elements.

6. The transparent LED display of claim 5, further comprising:

an alignment guide which is disposed on an upper surface of each of the plurality of first electrodes and extends along the longitudinal direction of the first electrode with a width that is narrower than that of each disposed first electrode, wherein among the disposed LED elements, the vertical mounting ratio, which is a ratio of the LED elements disposed such that the mounting angle between the long-axis direction of each the LED element and the width direction of the first electrode satisfies 5° or less, is 75% or more.

7. The transparent LED display of claim 5, wherein the first conductive semiconductor layer is an n-type semiconductor, and the second conductive semiconductor layer is a p-type semiconductor, and wherein among all of the disposed LED elements, the selective mounting ratio, which is a ratio of LED elements mounted such that the second surface is in contact with an upper surface of the first electrode, satisfies 70% or more.

8. The transparent LED display of claim 5, wherein each LED element has a width that is formed to be smaller than the thickness.

9. The transparent LED display of claim 1, wherein while the plurality of subpixel areas express 3 colors of blue, green and red, at least a portion of the plurality of subpixel areas comprises a color conversion layer which is patterned on an LED electrode assembly such that each subpixel area expresses any one color of the three colors.

10. The transparent LED display of claim 1, wherein the light color is blue, white or UV.

11. A transparent LED display comprising:

a plurality of LED elements;

a display area in which a plurality of subpixel areas, which include all of blue, green and red with each area designated as any one light color thereof, and a light transmission areas are arranged on the x-y plane based on mutually perpendicular x, y and z axes, and the light transmittance is 25% or more, wherein each of the plurality of subpixel areas is provided with an LED electrode assembly in which a plurality of LED elements emitting a designated light color are electrically connected between first and second electrodes that are spaced apart in the z-axis direction.

12. The transparent LED display of claim 11, wherein each LED element is an element whose area of a light-emitting surface, which is a plane perpendicular to a direction in which the layers forming the element are stacked, is 0.05 to 25 $\mu m^2$, and the light-emitting area ratio of the LED elements on the x-y plane in each subpixel area is 50% or less.

13. The transparent LED display of claim 1, wherein each LED element is an element in which the layers forming the element are stacked in the z-axis direction, the thickness in the z-axis direction is 0.1 to 3 μm, and the length of a long axis which is any one direction on the x-y plane is 1 to 10 μm.

14. The transparent LED display of claim 11, wherein the display area comprises in the z-axis direction a first substrate, a second layer area which is disposed on the first substrate and provided with a plurality of circuit elements, and a first layer area which is provided on the second layer area and comprises a plurality of LED electrode assemblies and a partition wall that surrounds the exterior of each LED electrode assembly at a predetermined height, wherein the light transmittance of the first substrate, circuit elements and partition wall is 60% or more.

15. The transparent LED display of claim 11, wherein LED electrode assembly comprises:

a plurality of first electrodes which are spaced apart from each other on the x-y plane;

a plurality of LED elements in which a plurality of layers comprising a first conductive semiconductor layer, a photoactive layer and a second conductive semiconductor layer are stacked in the z-axis direction, and the long axis having a length that is longer than a thickness in the z-axis direction is arranged such that both ends of the elements in the long-axis direction formed on the x-y plane contact the upper surfaces of two adjacent first electrodes; and a second electrode which is disposed on the plurality of LED elements.

16. The transparent LED display of claim 15, further comprising:

an alignment guide which is disposed on an upper surface of each of the plurality of first electrodes and extends along the longitudinal direction of the first electrode with a width that is narrower than that of each disposed first electrode, wherein among the disposed LED elements, the vertical mounting ratio, which is a ratio of the LED elements disposed such that the mounting angle between the long-axis direction of each LED element and the width direction of the first electrode satisfies 5° or less, is 75% or more.

17. The transparent LED display of claim 15, wherein each LED element has a first surface which faces the z-axis direction and is one surface of the lowest layer on the first conductive semiconductor layer side, and a second surface which is one surface of the uppermost layer on the second conductive semiconductor layer side, and wherein among all of the disposed LED elements, the selective mounting ratio, which is a ratio of LED elements mounted such that any one surface of the first surface or second surface is in contact with an upper surface of the first electrode, satisfies 70% or more.

18. The transparent LED display of claim 15, wherein the first conductive semiconductor layer is an n-type semiconductor, and the second conductive semiconductor layer is a p-type semiconductor, and wherein among all of the disposed LED elements, the selective mounting ratio, which is a ratio of LED elements mounted such that the second surface is in contact with an upper surface of the first electrode, satisfies 70% or more.

19. The transparent LED display of claim 15, wherein each LED element has a width that is formed to be smaller than the thickness.

20. A method for manufacturing a transparent LED display, the display comprising:

a plurality of LED elements;

a display area in which a plurality of subpixel areas and light transmission areas are arranged on the x-y plane based on mutually perpendicular x, y and z axes, and the light transmittance is 25% or more, wherein the display area is manufactured by comprising the steps of:

(1) introducing a solution comprising the LED elements onto a plurality of first electrodes that are formed in each subpixel area and spaced apart from each other;

(2) applying assembly power to the first electrode to self-align the LED elements that are introduced into each subpixel area such that both ends facing each other in the long-axis direction contact the upper surfaces of two adjacent first electrodes; and (3) forming a second electrode on a plurality of self-aligned LED elements to form an LED electrode assembly.

* * * * *